United States Patent
Dupuis

(10) Patent No.: US 7,302,247 B2
(45) Date of Patent: Nov. 27, 2007

(54) SPREAD SPECTRUM ISOLATOR

(75) Inventor: Timothy Dupuis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/089,348

(22) Filed: Mar. 24, 2005

(65) Prior Publication Data

US 2005/0272378 A1    Dec. 8, 2005

Related U.S. Application Data

(63) Continuation-in-part of application No. 10/860,399, filed on Jun. 3, 2004, application No. 10/860,519, filed on Jun. 3, 2004, and application No. 11/020,977, Dec. 22, 2004, and application No. 11/064,413, Feb. 23, 2005.

(51) Int. Cl.
*H04B 1/18*  (2006.01)
*H04B 1/16*  (2006.01)

(52) U.S. Cl. .................. 455/280; 455/292; 455/67.15; 455/333; 455/338

(58) Field of Classification Search .............. 455/280, 455/292, 67.15, 333, 338, 148, 167.1
See application file for complete search history.

(56) References Cited

U.S. PATENT DOCUMENTS

| | | | |
|---|---|---|---|
| 3,713,148 A | 1/1973 | Cardullo et al. | |
| 3,714,540 A | 1/1973 | Galloway | |
| 3,859,624 A | 1/1975 | Kriofsky et al. | |
| 4,523,128 A | 6/1985 | Stamm et al. | |
| 4,536,715 A | 8/1985 | Basarath et al. | |
| 4,650,981 A | 3/1987 | Foletta | |
| 4,675,579 A | 6/1987 | Hardy et al. | |
| 4,763,075 A | 8/1988 | Weigert | |
| 4,785,345 A | 11/1988 | Rawls et al. | |
| 4,868,647 A | 9/1989 | Uehara et al. | |
| 4,924,210 A | 5/1990 | Matsui et al. | |
| 4,931,867 A | 6/1990 | Kikuchi | |
| 4,937,468 A | 6/1990 | Shekhawat et al. | |
| 4,959,631 A | 9/1990 | Hasegawa et al. | |
| 5,095,357 A | 3/1992 | Andoh et al. | |
| 5,128,729 A | 7/1992 | Alonas et al. | |

(Continued)

FOREIGN PATENT DOCUMENTS

FR    2 679 670    7/1991

(Continued)

OTHER PUBLICATIONS

Analog Devices; ADuM130x/ADuM140x; Coupler Technology Removes the Limitations of Optocoupler Solutions. pp. 2-15.

(Continued)

*Primary Examiner*—Matthew Anderson
*Assistant Examiner*—Eugene Yun
(74) *Attorney, Agent, or Firm*—Howison & Arnott, L.L.P.

(57) ABSTRACT

A circuit package includes first and second units containing functional circuitry. At least one RF isolation link interconnects the first and second units and provides voltage isolation between the first and second units. The RF isolation link provides data between the first unit and the second unit using an RF carrier signal that sweeps between a first frequency and a second frequency.

18 Claims, 29 Drawing Sheets

U.S. PATENT DOCUMENTS

| | | | |
|---|---|---|---|
| 5,168,863 A | 12/1992 | Kurtzer | |
| 5,369,666 A | 11/1994 | Folwell et al. | |
| 5,384,808 A | 1/1995 | Van Brunt et al. | |
| 5,404,545 A | 4/1995 | Melvin | |
| 5,442,303 A | 8/1995 | Asada et al. | |
| 5,444,740 A | 8/1995 | Mizukami et al. | |
| 5,448,469 A | 9/1995 | Rilly et al. | |
| 5,469,098 A | 11/1995 | Johnson, Jr. | |
| 5,555,421 A | 9/1996 | Enzinna | |
| 5,572,179 A | 11/1996 | Ito et al. | |
| 5,591,996 A | 1/1997 | Haigh et al. | |
| 5,615,091 A | 3/1997 | Palatnik | |
| 5,615,229 A | 3/1997 | Sharma et al. | |
| 5,625,265 A | 4/1997 | Vlahu | |
| 5,650,357 A | 7/1997 | Dobkin et al. | |
| 5,654,984 A | 8/1997 | Hershbarger et al. | |
| 5,663,672 A | 9/1997 | Nuechterlein | |
| 5,716,323 A | 2/1998 | Lee | |
| 5,774,791 A | 6/1998 | Strohallen et al. | |
| 5,781,071 A | 7/1998 | Kusunoki | |
| 5,781,077 A | 7/1998 | Leitch et al. | |
| 5,786,763 A | 7/1998 | Canipe | |
| 5,789,960 A | 8/1998 | Bower | |
| 5,801,602 A | 9/1998 | Fawal et al. | |
| 5,812,597 A | 9/1998 | Graham et al. | |
| 5,812,598 A | 9/1998 | Sharma et al. | |
| 5,845,190 A * | 12/1998 | Bushue et al. | 725/130 |
| 5,850,436 A * | 12/1998 | Rosen et al. | 379/377 |
| 5,864,607 A | 1/1999 | Rosen et al. | |
| 5,900,683 A | 5/1999 | Rinehart et al. | |
| 5,907,481 A | 5/1999 | Svardsjo | |
| 5,913,817 A | 6/1999 | Lee | |
| 5,926,358 A | 7/1999 | Dobkin et al. | |
| 5,945,728 A | 8/1999 | Dobkin et al. | |
| 5,952,849 A | 9/1999 | Haigh | |
| 5,969,590 A | 10/1999 | Gutierrez | |
| 6,049,258 A | 4/2000 | Fawal et al. | |
| 6,061,009 A | 5/2000 | Krone et al. | |
| 6,069,802 A | 5/2000 | Priegnitz | |
| 6,087,882 A | 7/2000 | Chen et al. | |
| 6,114,937 A | 9/2000 | Burghartz et al. | |
| 6,124,756 A | 9/2000 | Yaklin et al. | |
| 6,137,372 A | 10/2000 | Welland | |
| 6,222,922 B1 | 4/2001 | Scott et al. | |
| 6,232,902 B1 | 5/2001 | Wada | |
| 6,249,171 B1 | 6/2001 | Yaklin et al. | |
| 6,262,600 B1 | 7/2001 | Haigh et al. | |
| 6,291,907 B1 | 9/2001 | Haigh et al. | |
| 6,307,497 B1 | 10/2001 | Leung et al. | |
| 6,384,763 B1 | 5/2002 | Leung et al. | |
| 6,389,063 B1 | 5/2002 | Kanekawa et al. | |
| 6,452,519 B1 | 9/2002 | Swanson | |
| 6,525,566 B2 | 2/2003 | Haigh et al. | |
| 6,603,807 B1 | 8/2003 | Yukutake et al. | |
| 6,611,051 B2 | 8/2003 | Akiyama et al. | |
| 6,670,861 B1 | 12/2003 | Balboni | |
| 6,728,320 B1 | 4/2004 | Khasnis et al. | |
| 6,747,522 B2 | 6/2004 | Pietruszynski et al. | |
| 6,833,800 B1 | 12/2004 | Patterson | |
| 6,873,065 B2 | 3/2005 | Haigh et al. | |
| 6,903,578 B2 | 6/2005 | Haigh et al. | |
| 6,914,547 B1 | 7/2005 | Swaroop et al. | |
| 6,922,080 B2 | 7/2005 | Haigh et al. | |
| 6,927,662 B2 | 8/2005 | Kahlmann et al. | |
| 6,940,445 B2 | 9/2005 | Kearney | |
| 6,956,727 B1 | 10/2005 | Brokaw | |
| 6,967,513 B1 | 11/2005 | Balboni | |
| 6,977,522 B1 | 12/2005 | Murabayashi et al. | |
| 7,016,490 B2 | 3/2006 | Beutler et al. | |
| 7,023,372 B1 | 4/2006 | Singh et al. | |
| 7,053,807 B1 | 5/2006 | Gaalaas | |
| 7,057,491 B2 | 6/2006 | Dempsey | |
| 7,075,329 B2 | 7/2006 | Chen et al. | |
| 7,102,388 B2 | 9/2006 | Murabayashi et al. | |

FOREIGN PATENT DOCUMENTS

| | | |
|---|---|---|
| GB | 2173956 A1 | 10/1986 |
| WO | 98/22307 A1 | 4/1999 |

OTHER PUBLICATIONS

Ichiro Aoki et al.; Fully Integrated CMOS Power Amplifier Design Using the Distributed Active-Transformer Architecture; IEEE Journal of Solid State Circuits, vol. 37, No. 3, Mar. 2002; pp. 371-383.

M.W. Green, G.J. Green, R.G. Arnold, J.A. Jenkins, R.H. Jansen, "Miniature Multilayer Spiral Inductors for GaAs MMICs," GaAs IC Symposium, pp. 303-306, IEEE, 1989.

S.A. Rawls, G. Knoedl, Jr., L.J. Turgeon, J.W. Bess, "A Monolithic Signal Isolator," IEEE CH2719, pp. 165-170, 1989.

Jianjun J. Zhou, David J. Allstot, "Monolithic Transformers and Their Application in a Differential CMOS RF Low-Noise Amplifer," IEEE Journal of Solid-State Circuits, vol. 33, No. 12, pp. 2020-2027, Dec. 1998.

Jianjun J. Zhou, David J. Allstot, "A Fully Integrated CMOS 900MHz LNA Utilizing Monolithic Transformers," Digest of Technical Papers, ISSCC98, pp. 132-133, Feb. 6, 1998.

Jesus Martel, Rafael Boix, Manuel Horno, "Analysis of a Microstrip Crossover Embedded in a Multilayered Anisotropic and Lossy Media," IEEE Transactions on Microwave Theory and Techniques, vol. 42, No. 3, pp. 424-432, Mar. 1994.

Werner Simburger, Hans-Dieter Wohlmuth, Peter Weger, Alexander Heinz, "A Monolithic Transformer Coupled 5-W Silicon Power Amplifier with 59% PAE at 0.9 GHz," IEEE Journal of Solid-State Circuits, vol. 34, No. 12, pp. 1881-1891, Dec. 1999.

John Long, "Monolithic Transformers for Silicon RF IC Design," IEEE Journal of Solid-State Circuits, vol. 35, No. 9, pp. 1368-1382, Sep. 2000.

Young, Ron, Feedback Isolation Augments Power-Supply Safety and Performance, EDN, Jun. 19, 1997, pp. 141-146.

Akiyama, Noboru, A High-Voltage Monolithic Isolator for a Communication Network Interface, IEEE Transactions on Electron Devices, May 2002, pp. 895-901, vol. 49, No. 5.

Martel, Jesus, Analysis of a Microstrip Crossover Embedded in a Multilayered Anisotropic and Lossy Media, IEEE Transactions on Microwave Theory and Techniques, Mar. 1994, pp. 424-432, vol. 32, No. 3.

Baker, Bonnie C., The Basics of Isolation Circuits, Sensors and Systems, May 1996, pp. 46-47.

Bindra, Ashok, MEMS-Based Magnetic Coils Exceed the Limitations of Optical Couplers, Electronic Design, Jul. 24, 2000, p. 43.

Choina, Simon, Planar Transformers Make Maximum Use of Precious Board Space, Electronic Design, Mar. 9, 1999, pp. 97 & 99.

Clark, Ron, RS-232C/422/485 Line Isolation Solves More Than Fault Problems, EDN, Sep. 28, 1995, pp. 103-115.

EDN'S 100 Top Products 1994, EDN, Dec. 8, 1994, pp. 58.

"Publications—Geoff Walker", http://www.itee.uq.edu.au/~walkerg/publications/pubs_grw_links.html, May 2007.

Hoskins, Kevin, Isolated ADC Reduces Power Consumption, EDN, Mar. 30, 1995, pp. 73-74.

A Tale of Two Moderns, Sensors Magazine, Apr. 2002, pp. 30-32.

Wolfs, P.J., An Improved Transformer Coupled MOSFET/IGBT Driver, Journal of Electrical and Electronic Engineering, Australia—IE Aust. & IREE Aust., Sep. 1991, vol. 11, No. 03, pp. 197-200.

Klein William, Applications of Signal Isolation, Sensors Magazine, Apr. 2000, pp. 70-74.

Kojima, Yasuyuki, A Novel Monolithic Isolator for a Communications Network Interface IC, 1998 Proceedings Annual IEEE International ASIC Conference, 1998, pp. 255-258.

Kojima, Yasuyuki, 2.3 kVac 100 MHz Multi-Channel Monolithic Isolator IC, 2000 Proceedings Annual IEEE International ASIC Conference, 2000, pp. 309-312.

Kuhn, William, An RF-Based IEEE 1394 Ground Isolator Designed in a Silicon-on-Insulator Process, 44th IEEE 2001 Midwest Symposium on Circuits and Systems, pp. 764-767.

Lam, Sam, High-Isolation Bonding Pad Design for Silicon RFIC up to 20 GHz, IEEE Electron Device Letters, Sep. 2003, vol. 24, No. 5, pp. 601-603.

Long, John R., A 1.9 GHz Low-Voltage Silicon Bipolar Receiver Front-End for Wireless Personal Communications Systems, IEEE Journal of Solid-State Circuits, Dec. 1995, vol. 30, No. 12, pp. 1438-1448.

Mammano, Bob, Isolated Power Conversion: making the case for secondary-side control, EDN, Jun. 7, 2001, pp. 123-127.

Stapleton, Helen, Isolation Techniques for High-resolution Data-acquisition Systems, EDN, Feb. 1, 2000, pp. 113-118.

Zhou, Jianjun, Monolithic Transformers and Their Application in a Differential CMOS RF Low-Noise Amplifier, IEEE Journal of Solid-State Circuits, Dec. 1998, pp. 2020-2027.

Walker, Geoffry, Modulation and Control of Multilevel Converters, Thesis submitted for Doctor of Philosophy (The University of Queensland), Nov. 16, 1999, pp. 1-202.

Pickering, Paul, A System Designer's Guide to Isolation Devices, Sensors, Jan. 1999, pp. 14-26.

Ronkainen, H., IC compatible planar inductors on silicon, IEE Proc.-Circuits Devices Syst., Feb. 1997, vol. 144, No. 1, pp. 29-35.

Schweher, Bill, DAAs go for the Silicon, EDN, Feb. 17, 2000, pp. 119-130.

Schweber, Bill, MEMS-Based Digital Isolator Answers Need for Extreme I/O Speed, EDN, Jul. 20, 2000, p. 24.

Sorenson, Jeff, Direct-Access Arrangements Are Crucial to Successful Embedded-Modern Designs, Electronic Design, Aug. 20, 2001, pp. 66-78.

IEEE Standard for a High Performance Serial Bus, IEEE Std. 1395-1995, Dec. 1995, pp. 1-392, NY.

* cited by examiner

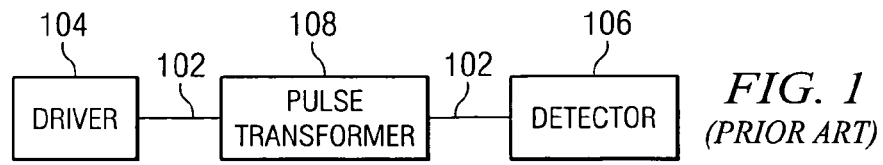
*FIG. 1 (PRIOR ART)*
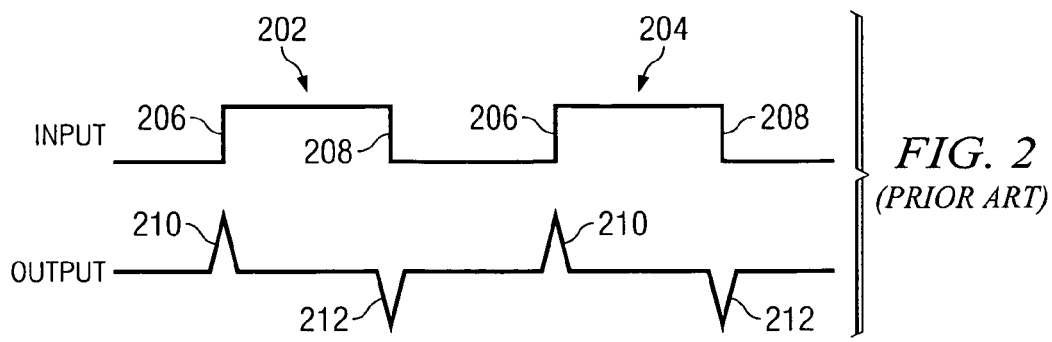
*FIG. 2 (PRIOR ART)*
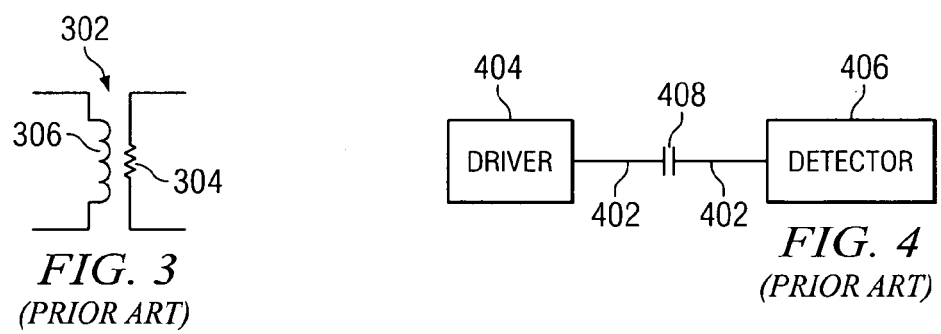
*FIG. 3 (PRIOR ART)*
*FIG. 4 (PRIOR ART)*
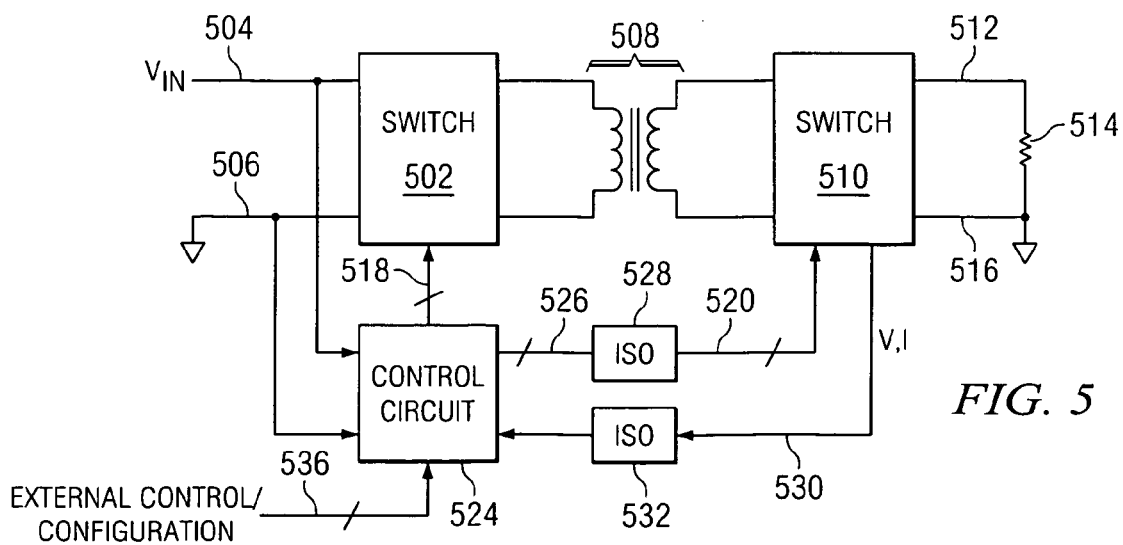
*FIG. 5*

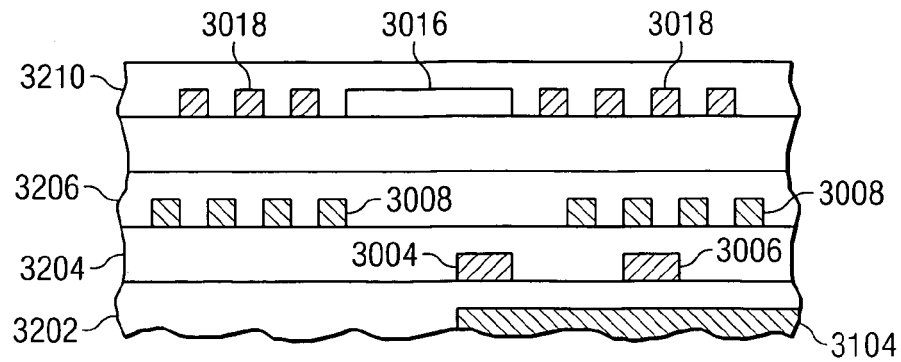
FIG. 32
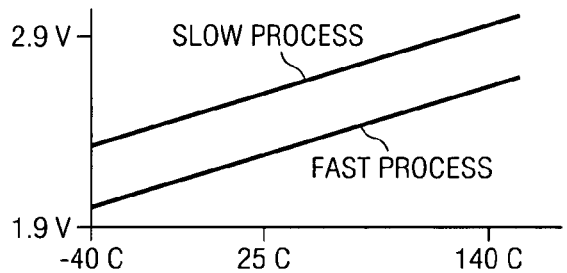
FIG. 33
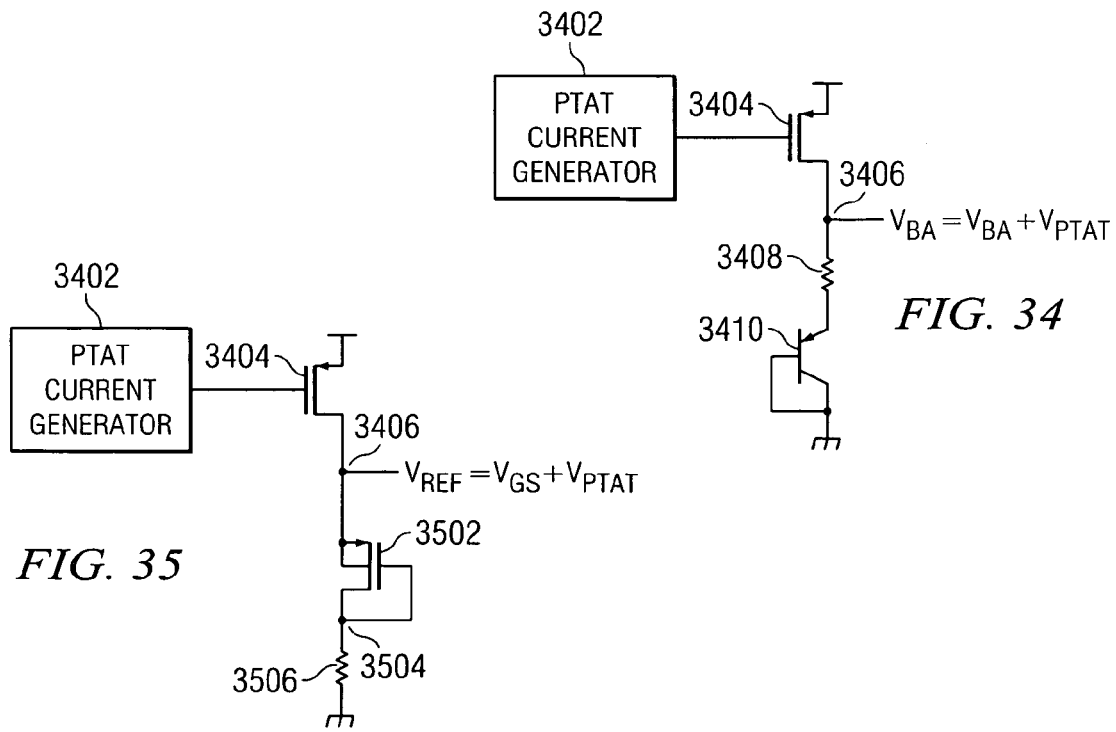
FIG. 34
FIG. 35

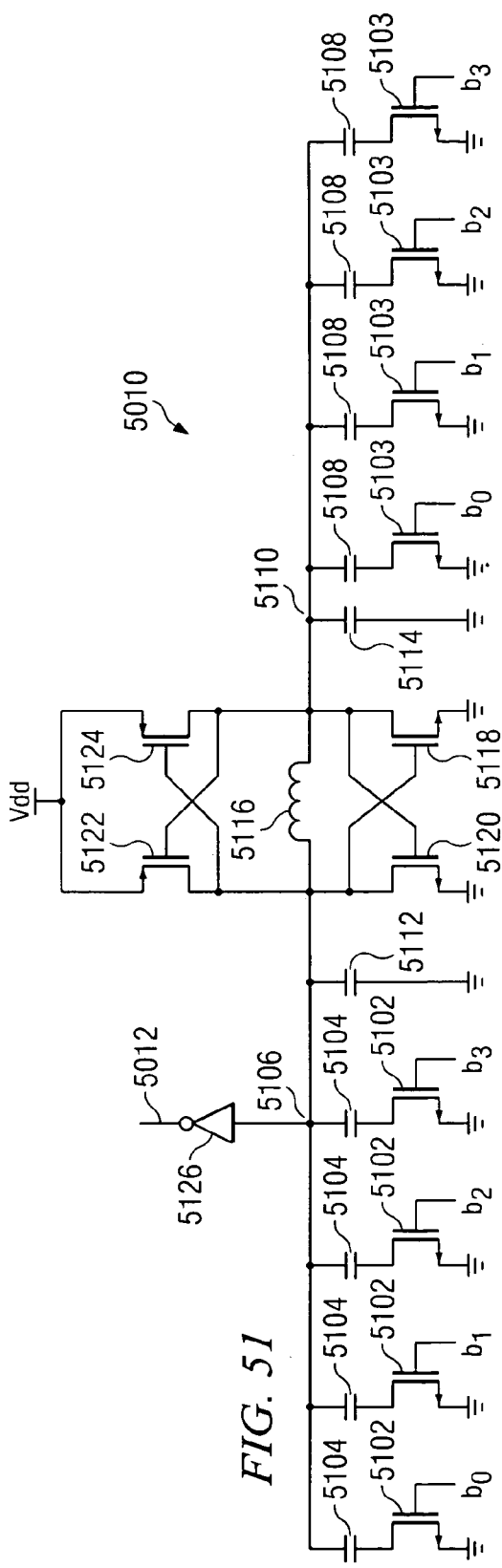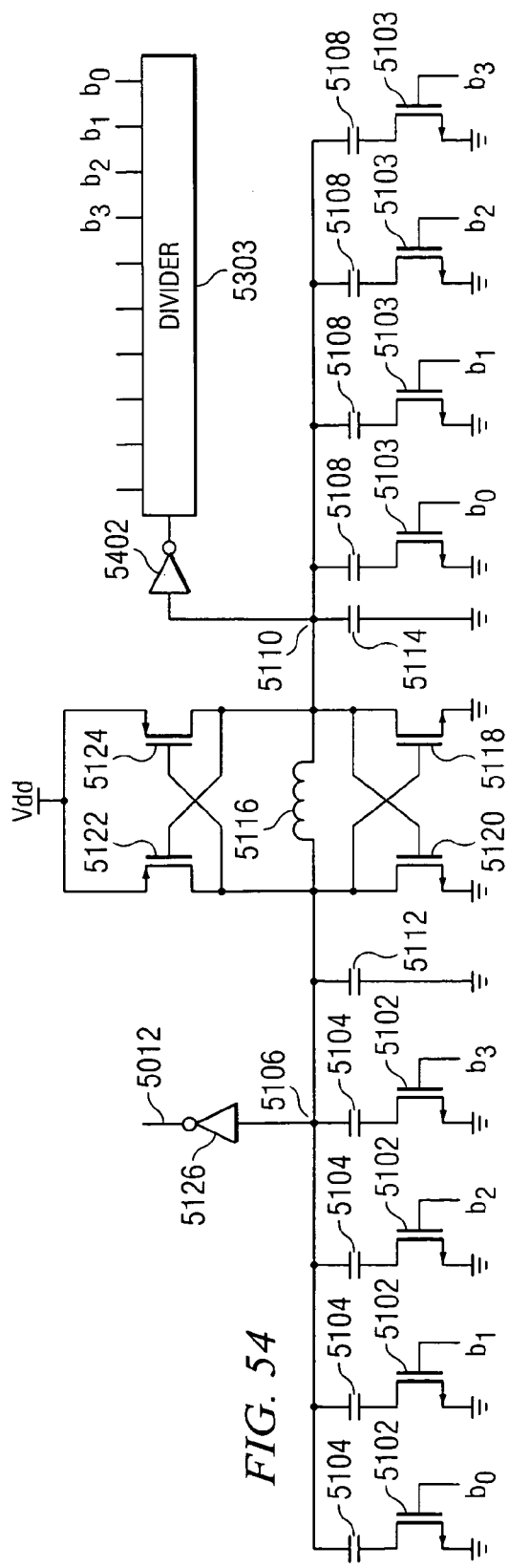

SPREAD SPECTRUM ISOLATOR

CROSS-REFERENCE TO RELATED APPLICATIONS

This application is a continuation-in-part of co-pending U.S. application Ser. No. 10/860,399 filed on Jun. 3, 2004 entitled Transformer Isolator for Digital Power Supply, co-pending U.S. application Ser. No. 10/860,519 filed on Jun. 3, 2004 entitled On-Chip Transformer Isolator, co-pending U.S. application Ser. No. 11/020,977 filed on Dec. 22, 2004 entitled RF Isolator with Differential Input/Output and co-pending U.S. patent application Ser. No. 11/064,413 filed on Feb. 23, 2005 entitled RF Isolator for Isolating Voltage Sensing and Gate Drivers.

TECHNICAL FIELD OF THE INVENTION

The present invention relates to digital isolators, and more particularly, to digital isolators providing isolation for voltage sensing and gate drivers.

BACKGROUND OF THE INVENTION

Within power conversion products, there is a need for high speed digital links that provide high isolation at a low cost. Typical digital links within power conversion products require a speed of 50-100 megabits per second. Isolation between the input and output of power conversion products is required in the range of 2,500-5,000 V. Existing solutions for providing a high speed digital isolation link have focused on the use of magnetic pulse couplers, magnetic resistive couplers, capacitive couplers and optical couplers.

Referring now to FIG. 1, there is illustrated the general block diagram of a system using a magnetic pulse coupler to isolate a digital link 102 between a driver 104 and a detector 106. The driver 104 resides upon one side of the digital link 102 and transmits information over the digital link 102 to the detector 106 residing on the other side of the digital link. Resting between the driver 104 and detector 106 is a pulse transformer 108. The pulse transformer 108 provides an electromagnetically coupled transformer between the driver 104 and detector 106. The pulse transformer 108 generates a pulse output in response to a provided input from the driver as illustrated in FIG. 2. The input from the driver 104 consists of the two pulses 202 and 204. Each pulse 202, 204 consists of a rising edge 206 and a falling edge 208. In response to a rising edge 206, the output of the pulse transformer 108 generates a positive pulse 210. The falling edge 208 of a pulse generates a negative pulse 212. The pulse transformer circuit illustrated with respect to FIGS. 1 and 2 suffers from a number of deficiencies. These include start-up where the detector 106 will not know at what point the input from the driver has begun, whether high or low until a first edge is detected. Additionally, should any error occur in the pulse output of the pulse transformer 108, the detector 106 would have a difficult time determining when to return to a proper state since there may be a long period of time between pulses.

Referring now to FIG. 2, there is illustrated an alternative prior art solution making use of a magneto resistive coupler. The magneto resistive coupler 302 consists of a resistor 304 and associated transformer 306. The resistor 304 has a resistance value that changes responsive to the magnetic flux about the resistor. The transformer detector 306 utilizes a wheatstone bridge to detect the magnetic flux of the resistor and determined transmitted data.

Another method of isolation between a driver 404 and a detector 406 is illustrated in FIG. 4. The driver 404 and the detector 406 are isolated on opposite sides of a digital link 402 by a capacitor 408. The capacitor 408 capacitively couples the driver 404 and detector 406 together to achieve a level of isolation. A problem with the use of capacitive coupling to isolate digital links is that capacitive coupling provides no common mode rejection.

An additional problem with some isolator designs involves the reception of RF interference from nearby transmitting GSM, DCS and CDMA cellular telephones. The problem is caused by the application printed circuit board acting as a dipole antennae at GHz frequencies. This results in large common mode signals being seen at the isolator at RF frequencies. Some manner for minimizing these large common mode signals at GHz frequencies would be highly desirable.

Thus, an improved method for providing isolation over high speed digital links within power supply components would be greatly desirable.

SUMMARY OF THE INVENTION

The present invention disclosed and claimed herein, in one aspect thereof, comprises a circuit package including a first unit containing functional circuitry and a second unit containing functional circuitry. At least one RF isolation link interconnects the first and second units. The at least one RF isolation link provides voltage isolation between the first unit and the second unit and enables data to be provided between the first and second units using an RF carrier signal. The RF carrier signal sweeps between a first frequency and a second frequency.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a block diagram of a prior art magnetic pulse coupler isolator;

FIG. 2 illustrates the input and output signals of the prior art magnetic pulse transformer of FIG. 1;

FIG. 3 illustrates a prior art magneto resistive coupler;

FIG. 4 illustrates a prior art capacitive coupler;

FIG. 5 illustrates a switched power supply including isolation circuitry;

FIG. 14c is a block diagram of the logic circuit of FIG. 17a;

FIG. 32 is a schematic diagram illustrating a prior art method for generating the band gap reference voltage;

FIG. 33 is a schematic diagram of the manner for generating the band gap reference voltage according to the present disclosure;

FIG. 34 illustrates a prior art method for generating a reference voltage;

FIG. 35 illustrates a modified method for generating a band gap reference voltage;

FIG. 51 is a schematic diagram of the RF oscillator circuit used in the circuit of FIG. 50;

FIG. 54 is a schematic diagram of the circuit of FIG. 52;

DETAILED DESCRIPTION OF THE INVENTION

Figure 6:
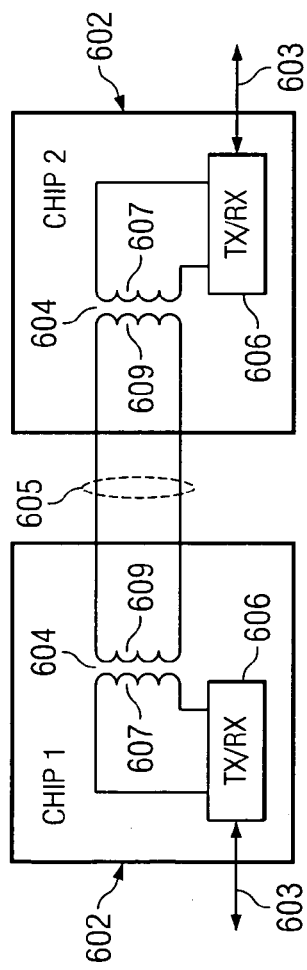
FIG. 6 illustrates an RF isolation link of the present disclosure.

Referring now to the drawings, and more particularly to FIG. 5, there is illustrated a block diagram of a DC-DC switching power supply utilizing an RF isolation link. Switching power supplies utilize a plurality of switches which are turned on and off to switch an input DC voltage across a transformer to a load, the output voltage at a different DC voltage level. By switching the current inductively coupled through the transformer to the load in a particular manner, a DC output voltage at a different voltage level than the input DC voltage can be provided to the load. The controlled switching is typically facilitated with some type of control circuit. This control circuit can be an analog control circuit formed from a plurality of analog discrete devices, or it can be a digital circuit. In digital control circuits, digital signal processors (DSPs) and microcontroller units (MCU) have been utilized. The DSPs control the duty cycle and relative timing of the switches such that the edges of each control pulse to the various transistor switches controlling power delivery to the load is varied. In order to perform this operation in the digital domain, the DSP must perform a large number of calculations, which requires a fairly significant amount of code to be generated to support a specific power supply topology, operating frequency, component characteristics and performance requirements. For example, inductor size decreases with increasing PWM frequency, dead times increase with increasing transistor turn-off times, and so on. Although DSPs can handle the regulation tasks, they are fairly complex and expensive and code changes in power supply applications are difficult.

Referring further to FIG. 5, the power supply includes a primary switch group 502 that is operable to receive an input voltage on a node 504, this being a DC voltage, and ground on a node 506. The primary switch group 502 is coupled through an isolation transformer 508 to a secondary switch group 510. The secondary switch group 510 is operable to drive an input voltage node 512 that is connected to one terminal of a load 514, the secondary switch group 510 also having a ground connection on a node 516, the load 514 disposed between the node 512 and the node 516. The two switch groups 502 and 510 are operable to operate in conjunction with various pulse inputs on a control bus 518 associated with the primary switch group 502 and with various pulse inputs on a control bus 526 associated with the secondary switch group 510.

A digital control circuit 524 is provided for controlling the operation of the primary switch group 502 and the secondary switch group 510. The voltages on nodes 504 and 506 are provided as inputs to the digital control circuit 524 for sensing the voltage and current on the primary side, the digital control circuit 524 generating the information on the bus 518 for control of the primary switch group 502. The control circuit 524 must be isolated from the secondary group switch 510, since there can be a significant DC voltage difference therebetween. This is facilitated by driving the bus 526 through an isolation circuit 528, such as the RF isolation circuit which will be discussed herein below, to drive the bus 520. Similarly, the control circuit 524 is operable to sense the voltage and current levels on the output node 512 through sense lines 530 which are also connected through an isolation circuit 532 to the digital control circuit 524. The digital control circuit 524 is also interfaced to a bus 536 to receive external control/configuration information. This can be facilitated with a serial databus such as an SMB serial databus.

Referring now to FIG. 6, there is illustrated the RF isolation link of the present disclosure. The RF isolation link 600 of the present disclosure is implemented by integrating a portion of the link in two chips or dies between which a high rate data link with voltage isolation is required. Each chip 602 includes a transformer 604 and transmit and receive circuitry 606 for providing the RF isolation link 600 between the chips. Alternatively, the chip 602 could include only transmit circuitry or receive circuitry with the partnered chip, including a corresponding receiver or transmitter. The RF signals are generated within the transmit/receive circuitry 606 on one side of the RF isolation link, and the RF signals are transmitted between the chips 602 utilizing the transformers 604 in each chip and the magnetic coupling effect therebetween.

Once the RF signals are received at the receiving side, the transmit and receive circuitry 606 detects the data contained within the transmission from the first chip and utilizes the data as appropriate. While the description with respect to FIG. 6 only illustrates the transformer 604 and transmit and receive circuitry 606 within each chip 602, additional circuitry will be implemented on the chips 602 for performing processing functions associated with the data transmitted over the RF isolation link 600. The data transmitted over the RF isolation link 600 may be transmitted using either frequency modulation techniques or amplitude modulation techniques. In the preferred embodiment of the disclosure, discussed with respect to FIG. 7 herein below, AM modulation is used for transmitting the data.

In operation, each of the transmit/receive circuits 606 operates in either transmit or receive mode. In the transmit mode, digital data received on a digital bus 603 is serially transmitted from one of the transmit/receive circuit 606 to the other one on the other of the dies 602. This is facilitated by driving the transformer 606 with a signal such that energy is coupled from the primary to the secondary thereof. This will allow energy to be transmitted on transmission lines 605 that couple the transformers 604 together. Each of the transformers is comprised of a primary 607 and a secondary 609. The primary 607 is driven with the input signal and energy associated therewith is coupled across the high voltage isolation boundary from the primary 607 to the secondary 609 and onto the transmission line 605. As will be described herein below, both of the transmit/receive circuits 606 and transformers 604 are fabricated on an integrated circuit such that the primary 607 and secondary 609 are both formed thereon utilizing conventional processing techniques and available conductive layers that are shared with the transmit/receive circuits. There will be a loss associated with the coupling coefficient between the primary and secondary such that the amount of energy that can be delivered from the transmit/receive circuit 606 to the transmission line 605 is reduced and, further, there will be more loss at certain frequencies than others. As such, the transformer 604 will have a unique frequency response where the loss will be greater at some frequencies than others. To accommodate this, the transmit/receive circuit 606 has contained therein a transmitter operating at a defined frequency that is within the lowest loss portion of the frequency response of the transformer 604. By utilizing various modulation schemes, data can be transmitted on this carrier to the transmission line 605. The operation of the transmitter/receiver-circuit 606 will be described in more detail herein below.

Figure 6A:
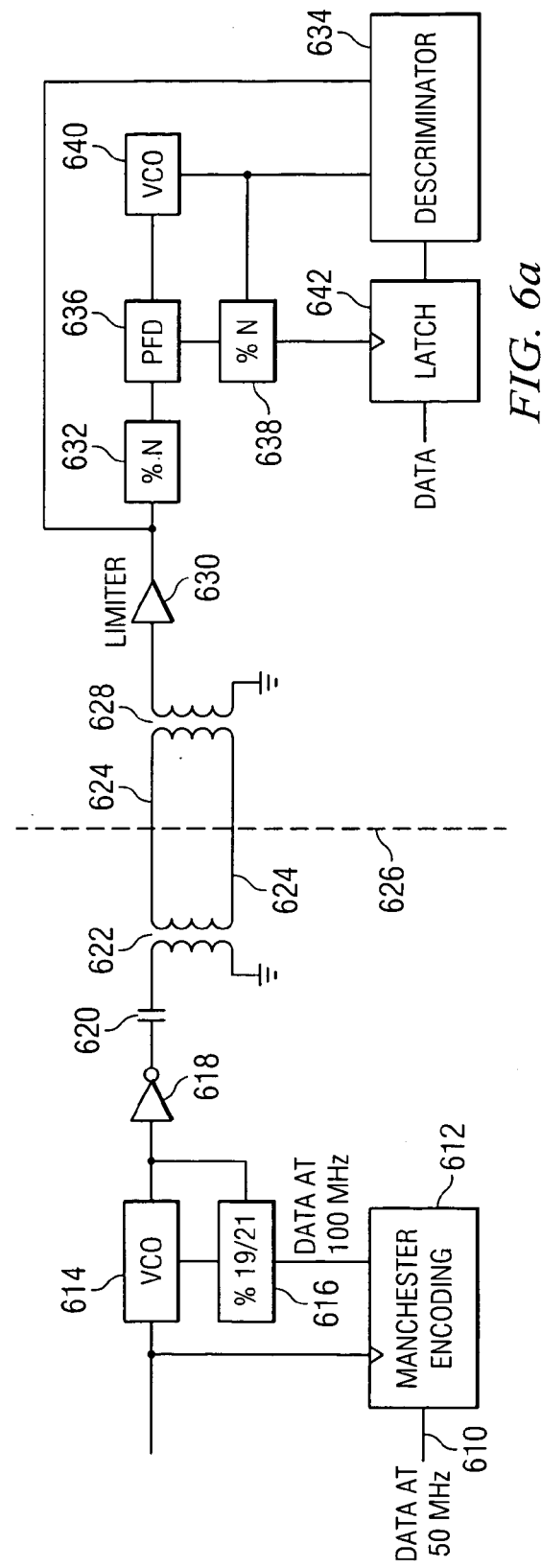
FIG. 6a illustrates a schematic block diagram of a circuit for providing the RF isolation link using frequency modulation.

Referring now to FIG. 6a, there is illustrated an alternate embodiment of the switching power supply utilizing frequency modulation to transmit data between a pair of chips over an RF isolation link 600. The description with respect to FIG. 6a is merely provided as an illustration of one potential embodiment of an FM circuit used for creating an RF isolation link, and one skilled in the art would realize the possibility of numerous additional embodiments. The data is input on a data bus 610 into a Manchester encoding circuit 612, a conventional data encoding circuit. Also input to the Manchester encoding circuit 612 is a clock signal. The clock signal is also input to a voltage controlled oscillator 614. Data is output from the Manchester encoding circuit 612 and applied to a divide circuit 616. A second input of the divide circuit 616 is connected to the output of the voltage controlled oscillator 614. The output of the divide circuit 616 is connected to a second input of the voltage controlled oscillator 614 to allow modulation thereof with the Manchester encoding circuit 616. The voltage controlled oscillator 614 outputs a frequency modulated signal representing the received data on bus 610 to a driver 618. The signal is filtered by a capacitor 620 before being applied to a transformer 622. The FM modulated signal is coupled by transformer 622 onto transmission lines 624 passing across an interface 626 between either a first and second chip that are to be voltage isolated from each other.

The received data signal is electromagnetically coupled onto the receiver circuitry by a second transformer 628. The received signal passes through a limiter circuit 630 whose output is applied to a Divide-by-N circuit 632 and a discriminater circuit 634. The output of the Divide-by-N circuit 632 is applied to the input of a PFD (phase/frequency detector) circuit 636. A second input to the PFD circuit 636 is provided by a second Divide-by-N circuit 638 having its input connected to the output of the voltage controlled oscillator 640. The input of the voltage controlled oscillator 640 is connected to the output of the PFD circuit 636. The output of the voltage controlled oscillator 640 is connected to a second input of the discriminater 634, this being a phase locked output phase locked to the data clock. The discriminater circuit 634 determines the data contained within the received signal responsive to the output of the voltage controlled oscillator 640 and the limiter 630. This data is provided to a latch circuit 636 having its clock input connected to the output of the Divide-by-N circuit 638. The data output of the receiver is provided from the latch circuit 642.

Figure 7:
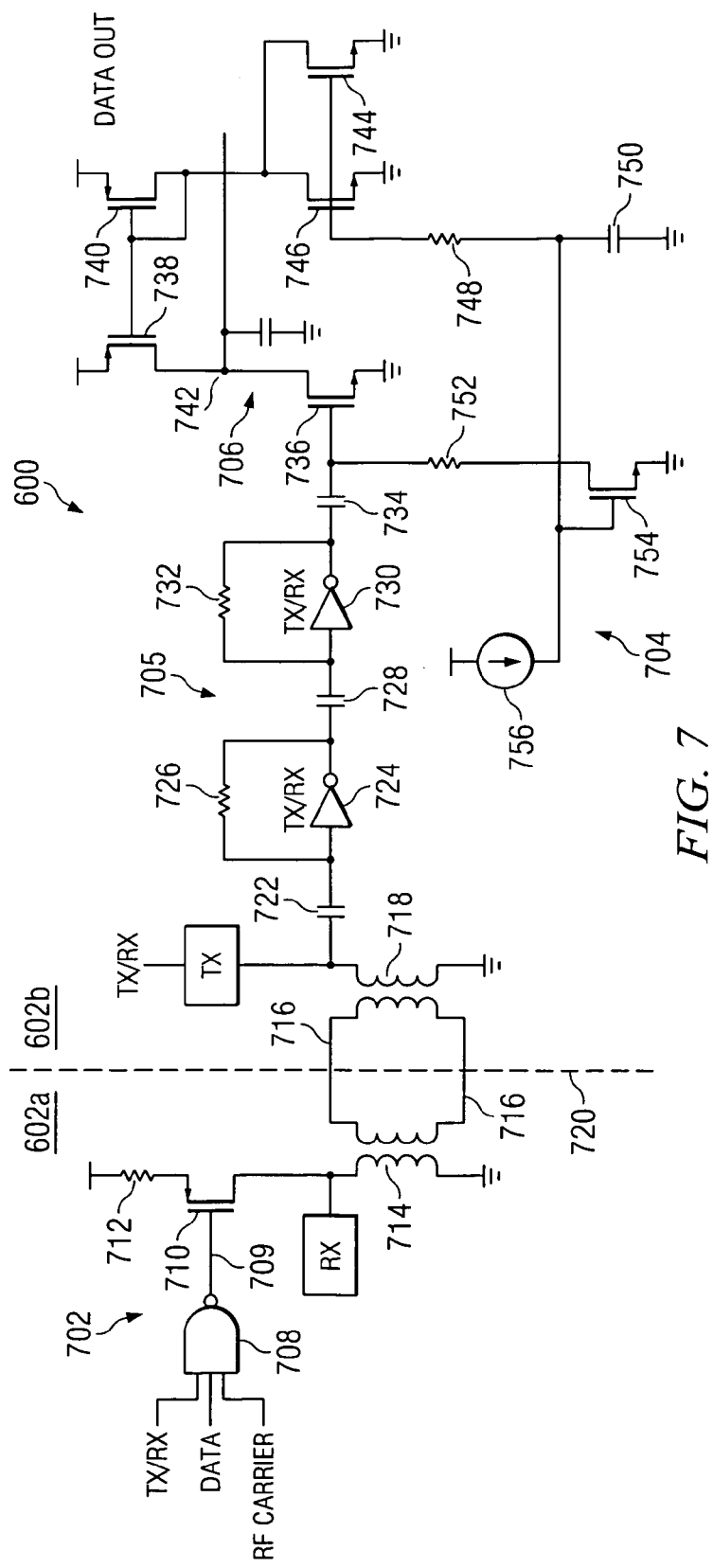
FIG. 7 illustrates a schematic diagram of the circuitry for providing the RF isolation link using amplitude modulation.

Referring now to FIG. 7, there is illustrated the preferred embodiment of the RF isolation link 600 of the present disclosure wherein amplitude modulation is used to transmit data over the link. The RF isolation link 600 consists of transmitter circuitry 702 and receiver circuitry 704. The transmitter circuitry 702 consists of a NAND gate 708 having a first input connected to receive the data to be transmitted over the RF isolation link 600 and a second input connected to receive the RF carrier signal. The RF carrier in the preferred embodiment comprises a 2 GHz signal. The data input to the first input of the NAND gate 708 consists of either a logical "1" or "0" which will selectively gate the RF carrier signal to the output of NAND gate 708 in the presence of a logical "1." This causes the output 709 of the NAND gate 708 to either provide the RF carrier signal when the data bit is "1" or not provide the RF signal when the data bit is "0." The output of the NAND gate 709 is connected to the gate of a p-channel transistor 710. The drain-source path of the p-channel resistor 710 is connected between $V_{DD}$ and ground through a resistor 712 and a first transformer 714. The transformer 714 electromagnetically couples the RF carrier signal to transformer 718 via lines 716. This links the data represented by the RF carrier signal between the first chip 602*a* and the second chip 602*b* while providing voltage isolation between the chips 602 via the first and second transformers 714, 718. Each of the transformers 714 and 718 are associated with a particular chip 602 on opposite sides of interface 720. Thus, wherein previous systems required a separate chip to provide an isolation link between two separate chips, the present disclosed device integrates the RF isolation link 600 onto the chips 602.

The receiver circuitry 704 receives the signal which has been electromagnetically coupled via transformer 714 onto the transmission lines 716 to transformer 718. The receiver circuit 704 consists of an amplifier 705 and a detector 706. The amplifier 705 provides two stages of amplification consisting of a first amplification stage including a capacitor 722 in series with an amplifier 724 and a feedback resistor 726. The second amplifier stage is similar to the first amplifier stage and includes a capacitor 728 in series with an amplifier 730 and a feedback resistor 732. These two stages amplify the received signal from the transformer 718.

The detector 706 detects the presence or absence of the RF carrier signal within the amplified received signal to determine the data being transmitted from the first chip 602*a*. The amplified signal from the amplifier 705 is first filtered by a capacitor 734. N-channel transistor 736 has the gate thereof connected to capacitor 734 and has the source-drain path thereof connected to one side of a current mirror comprised of p-channel transistors 738 and 740. The source-drain path of transistor 738 is connected between $V_{DD}$ and node 742, the gate thereof connected to the gate of transistor 740. The source-drain path of transistor 740 is connected between $V_{DD}$ and a node 743, the gate thereof connected to node 743 to provide a diode connected configuration. The output of the detector 706 is provided from node 742 at which the source-drain path of the n-channel transistor 736 is connected to the p-channel transistor 738 of the current mirror. A bias network is provided by n-channel transistors 744 and 746 which have the source-drain paths thereof connected between node 743 and ground and the gates thereof connected to a node 745 through a resistor 748, with a capacitor 750 connected between node 745 and ground. Biasing is also provided by resistor 752 connected between node 745 and the gate of transistor 736, a diode connected p-channel transistor 754 connected between node 745 and ground and a current source 756 for driving node 745. When no RF signal is detected by the receiver, the Data Out from node 742 of the detector circuit 706 will be equal to $V_{DD}$ since the PMOS current is greater than 1.33 times the NMOS current and a logical "0" is detected. In the presence of the RF signal, the Data Out from node 742 will vary in response to the variation of the detected RF carrier signal and a logical "1." The detector 706 outputs a low voltage when RF is present and a high voltage when RF is absent relying on the nonlinear (square root) behavior of the MOS device directed by the alternating current.

Figure 8:
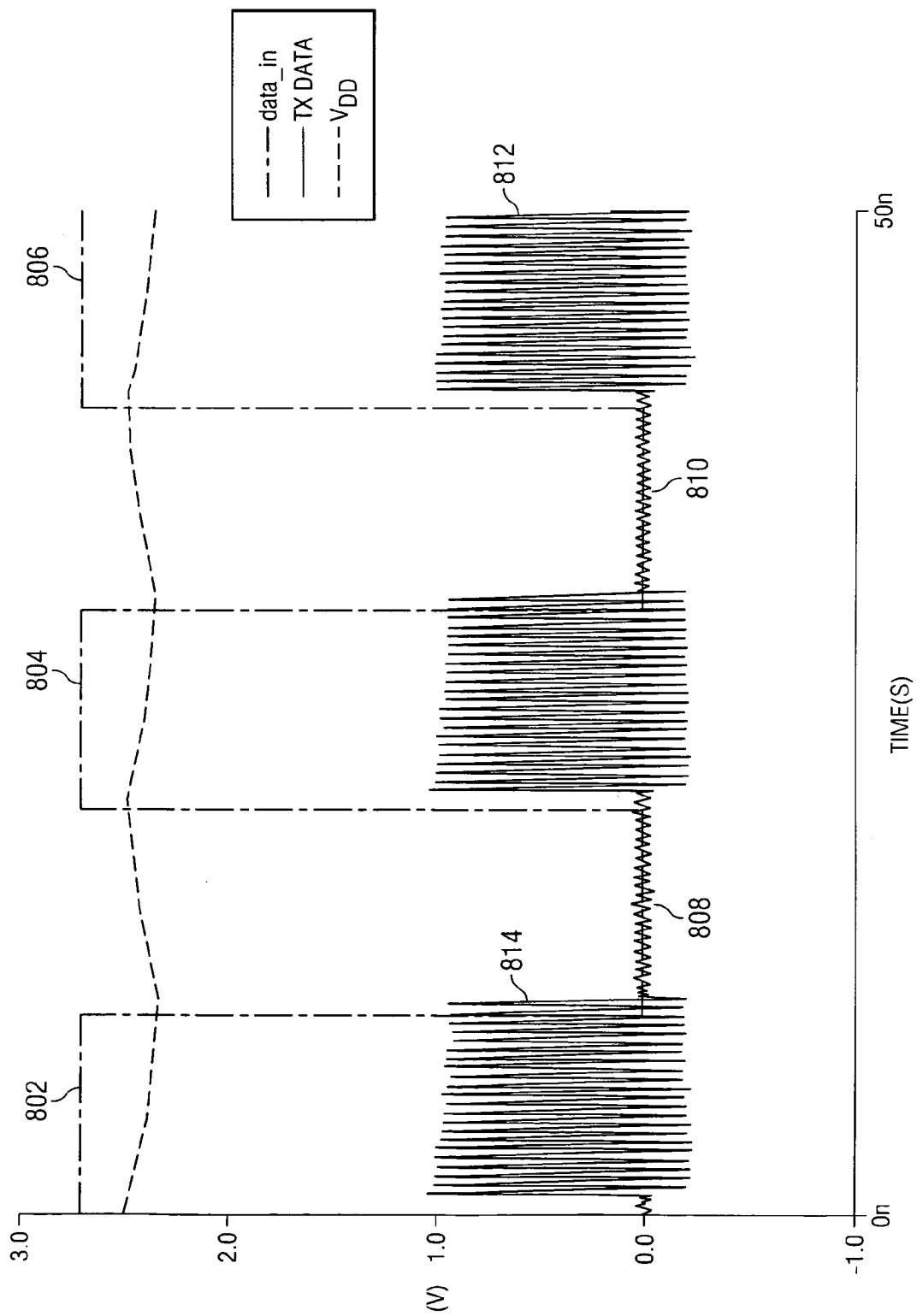
FIG. 8 illustrates the waveforms present on the transmit side of the RF isolation link of FIG. 7.
Figure 9:
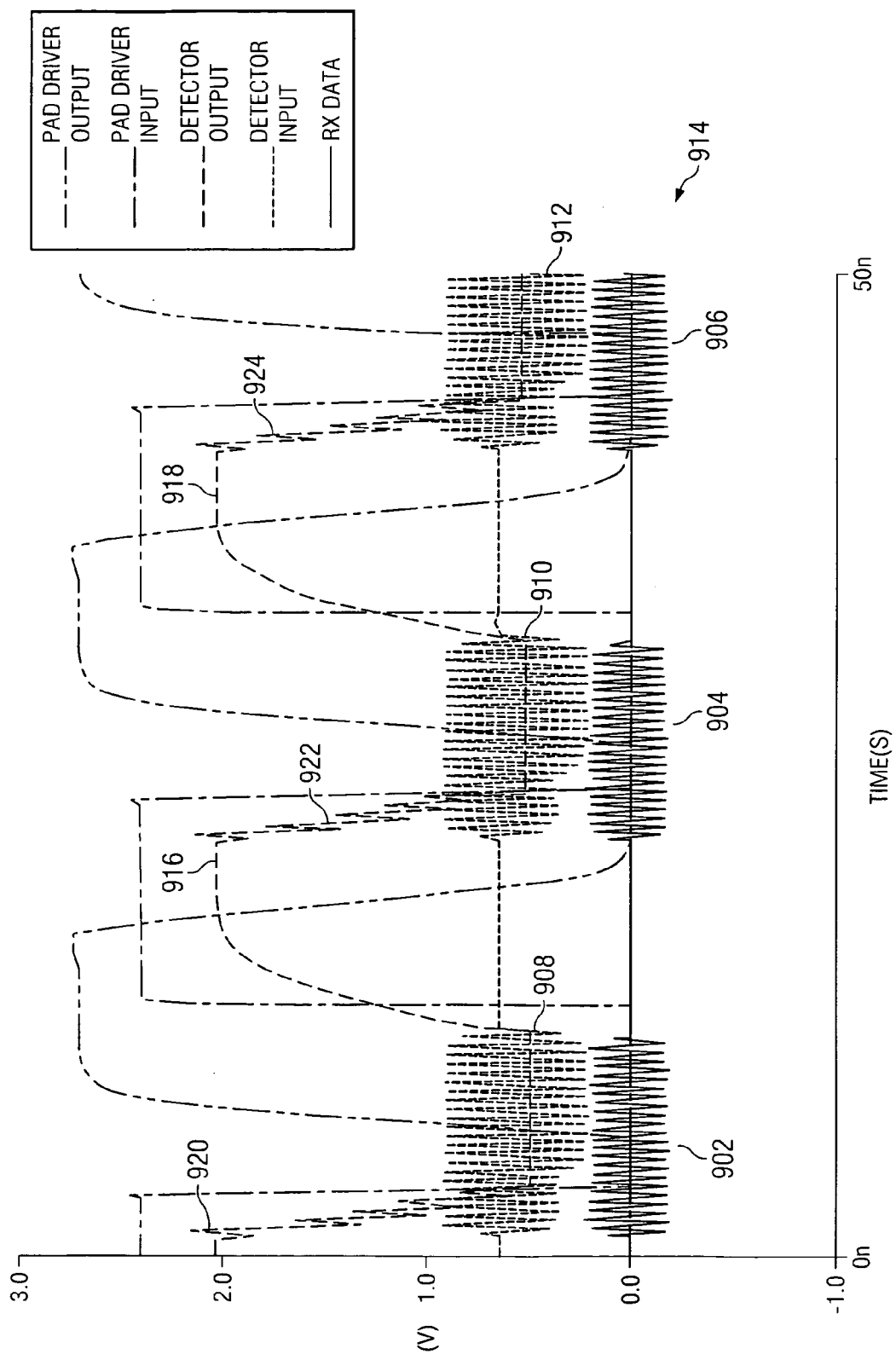
FIG. 9 illustrates the waveforms present on the receiving side of the RF isolation link of FIG. 7.

Referring now to FIGS. 8 and 9, there are illustrated the waveforms and data provided at the transmission side (FIG. 8) of an RF isolation link 600 and the receive side (FIG. 9) of the RF isolation link. On the transmission side illustrated in FIG. 8, the data 800 is either transmitted as a one bit (high) or zero bit (low). A one bit pulse is indicated at 802, 804 and 806. A zero bit pulse is indicated at 808 and 810. The transmit data provided to the transformer 714 is illustrated by the waveform 812. The transmit data waveform represents the 2 GHz RF carrier signal. When a logical "1" data bit is being transmitted and the data signal is high, the presence of the 2 GHz RF carrier is provided at the transmit data output. When a logical "0" bit is being transmitted, the signal is virtually zero at the transmit data output. Thus, whether a logical "1" bit or a logical "0" bit is transmitted is indicated either by the presence or absence of the 2 GHz RF carrier signal.

FIG. 9 illustrates the waveforms associated with the receiver 704. The received data for the logic "1" bit is represented at points 902, 904 and 906 and indicates the three 2.5 GHz RF carrier pulses transmitted from the transmitter 702 of the RF isolation link 600. The received pulses are amplified by the amplifier 705 such that when the signal is input to the detector circuit 706, the pulses are represented by the amplified waveform pulses 908, 910 and 912. As discussed previously, the detector data output rises to $V_{DD}$ at points 916, 918 when no RF carrier signal is detected by the detector 706 indicating a logical "0." When an RF carrier signal is detected, the output of the detector 706 begins to vary and drops low at points 920, 922 and 924 indicating a logical "1," this being the result of an increase in the NMOS current in transistor 736.

Figure 10:
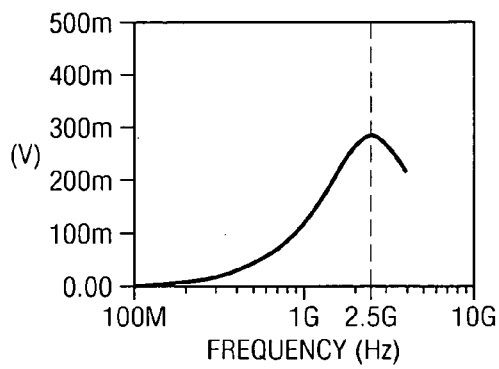
FIG. 10 illustrates the frequency response of the RF isolation link.
Figure 12:
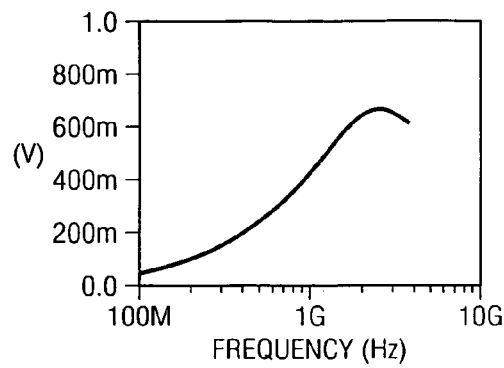
FIG. 12 illustrates the frequency response of one transformer of the RF isolation link.

Referring now to FIG. 10, there is illustrated the frequency response of a channel having the RF isolation circuit 600 described in FIG. 7.

Figure 11:
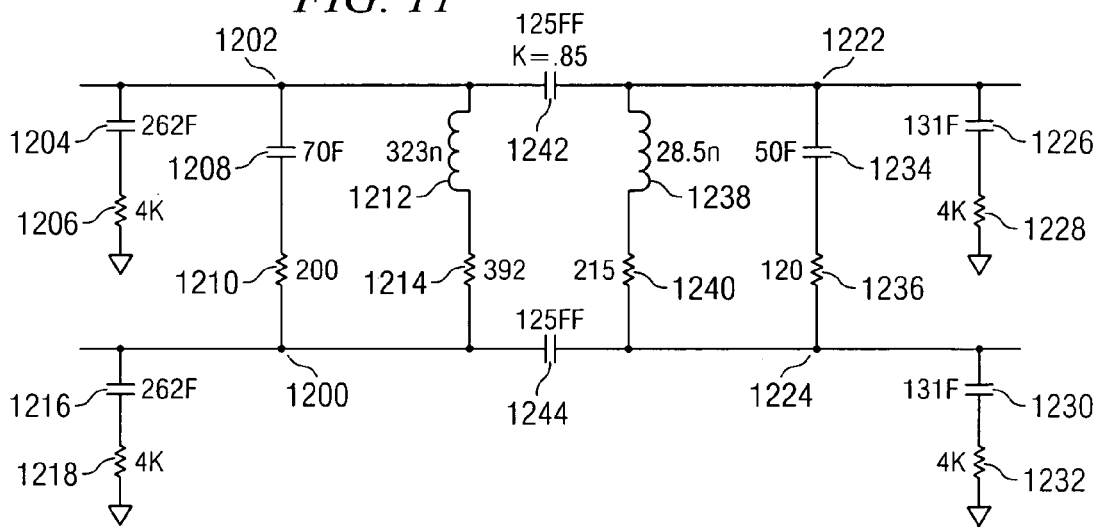
FIG. 11 illustrates a model of one of the transformers included within the RF isolation link.

Referring now to FIG. 11, there is illustrated a model for the transformers (714, 718) illustrated in FIG. 7. The input of the transformer consists of nodes 1002 and 1100. Node 1002 is connected to ground through capacitor 1104 and resistor 1106. Node 1100 is connected to ground through capacitor 1116 and resistor 1118. Node 1102 interconnects with node 1100 via a parallel connection of capacitor 1108 in series with resistor 1110 and inductor 1112 in series with resistor 1114. The output of the transformer consists of nodes 1122 and 1124. Node 1122 is connected to ground through capacitor 1126 and resistor 1128. Node 1124 is connected to ground through capacitor 1130 and resistor 1132. Node 1122 interconnects with node 1124 via a parallel connection of capacitor 1134 in series with resistor 1136 and inductor 1138 in series with resistor 1140. Nodes 1102 and 1122 are interconnected via a capacitor 1142 with a value of approximately 125 Ff. Nodes 1100 and 1124 are interconnected via a capacitor 1144 with a value of approximately 125 Ff.

Figure 13:
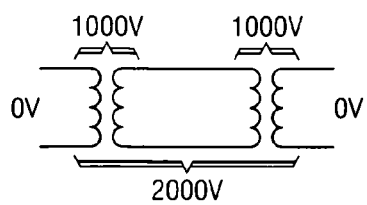
FIG. 13 illustrates the voltages across each transformer included within an RF isolation link and across the entire RF isolation link.

With specific reference to FIG. 13, it can seem that the low frequency response of the transformers is relatively lossy whereas the peak of the response occurs around 2.5 GHz. This is due to the manner in which the transformer was fabricated. Each side of the transformer is comprised of an inductive element, each inductive element on either side of the transformer coupled together through a layer of dielectric material, as will be described herein below. The series inductance value will result in an effect on the frequency response that will somewhat narrow the frequency response thereof. The amount of energy that is coupled from the output is a function of the coupling coefficient. The two sides of the transformers are disposed on a substrate, as will be described herein below, such that one element is disposed over the other element and separated therefrom by a high voltage dielectric to increase the effective breakdown voltage. This will allow high frequency energy to be coupled from one conductive element to the other. The voltage breakdown is a function of the properties of the material disposed between the two conductors at DC and the distance by which the two are separated. If the transformer were fabricated on a single layer of material in the semiconductor substrate, then the distances between the edges thereof would define the voltage breakdown. For example, the transformer device could be fabricated with the use of a directional coupler, which would provide a more broadband response. However, the area for such a design could be significant.

It can be seen that, due to the low frequency attenuation of the transformer, it would be difficult to couple through energy from a DC pulse, since only the high frequency energy would be passed there through. As such, the spectral energy that is coupled through the transformer of the present disclosure is concentrated therein with the use of a high frequency carrier that is disposed substantially within the center of the frequency response of the transformer. This will allow a large portion of the energy generated to be coupled across the transformer.

Figure 16:
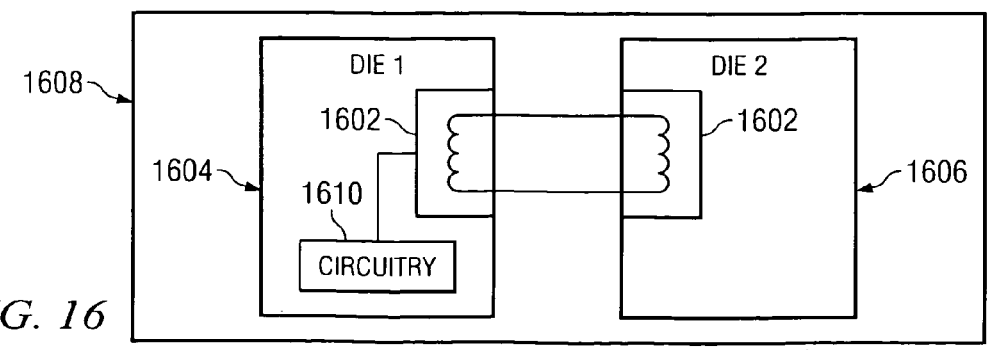
FIG. 16 illustrates an integrated RF isolation link in a single package including two dies.

Using the RF isolation links 600 described above, voltage isolation of up to 5,000 volts may be achieved, 2,500 volts for each side. Thus, as illustrated in FIG. 16, the RF isolation circuit 602 may provide 5,000 volts of isolation between a first chip 602a and a second chip 602b. While the voltage between the input terminals of the chip 602a will be zero volts, and the voltage between the input terminals of the chip 602b will also be zero volts, the total voltage difference between the two chips may be 5,000 volts with a 2,500 voltage difference across each of the transformers 714, 718 associated with the interfaces to the RF isolation circuit on each chip 602.

Figure 14A:
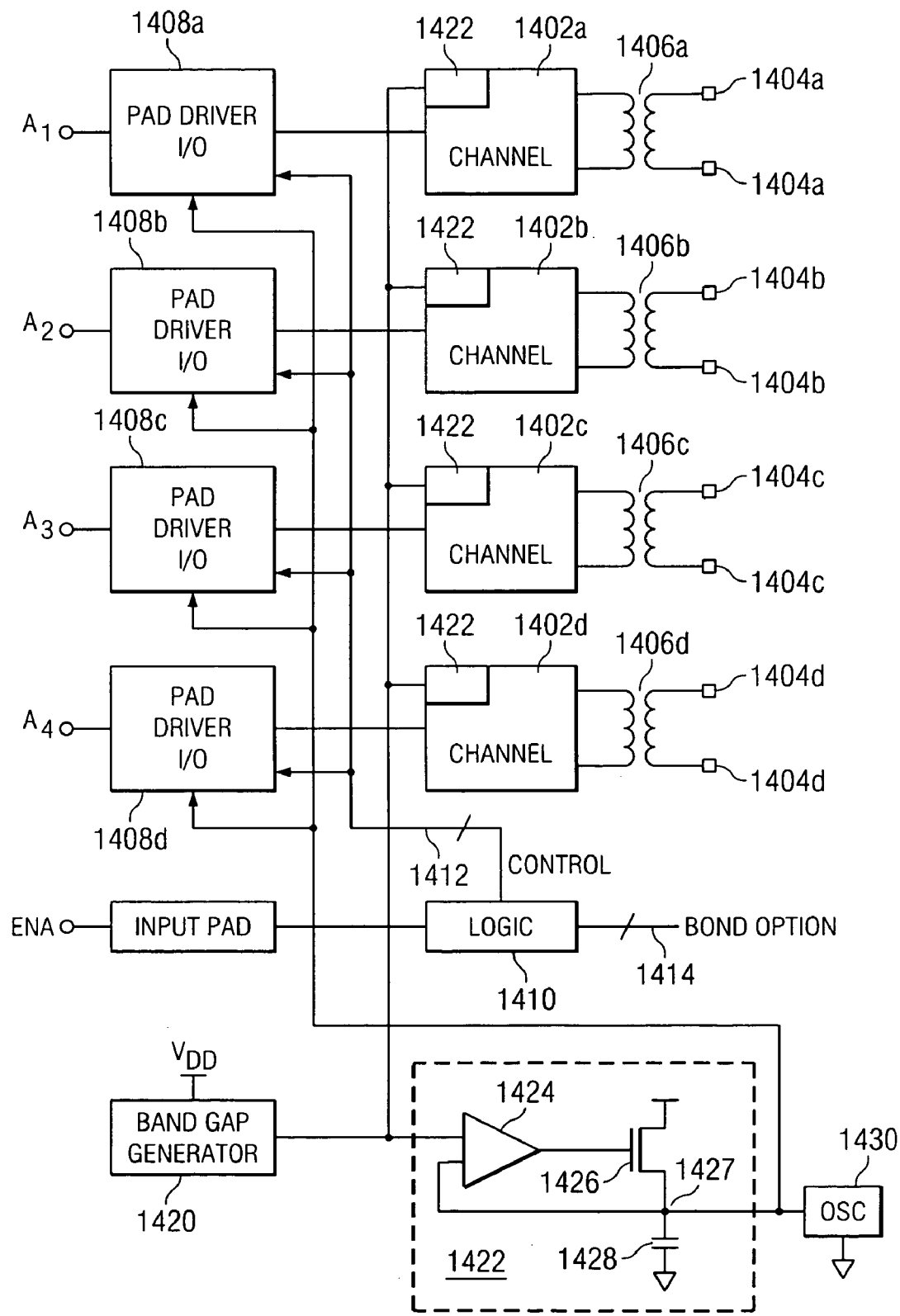
FIG. 14a is a block diagram illustrating the circuitry included within a chip on one side of an RF isolation link for providing multiple isolation link channels.

Referring now to FIG. 14a, there is illustrated a block diagram of the structure of an interface of a single chip 602 including a portion of a plurality of channels 1402 including the RF isolation link of the present disclosure. Each channel 1402 consists of the transformer 1406 and transmit and/or receive circuitry described with respect to FIG. 7. Data may be either input or received at the interface 1404 of transformer 1406. Each channel 1402 is interconnected with a pad driver 1408 that either drives transmitted data from the pad driver over channel 1402 to be output over the interface 1404 or drives received data to the associated pad of the chip 602. The manner in which data can be either transmitted or received over a particular channel 1402a is controlled on the chip 602 by logic circuitry 1410 providing control over various control lines 1412. The manner in which the logic control 1410 controls whether a channel is used for transmitting or receiving is set by input bond pad options 1414. Thus, in this embodiment, data is received as either a logic "1" or a logic "0" and the associated transformer is driven, when a pad is configured as a transmitter, (or not driven) accordingly. For received data on the associated transformer, when configured to receive data, the output of the pad is either high or low.

An oscillator circuit 1430 is also associated with all of the channels of the interface. A band gap generator 1420 is provided on-chip and connected to $V_{DD}$ to provide a band gap reference voltage to a regulator circuit 1422. While the description with respect to FIG. 14a only illustrates a single voltage regulator 1422, it will be noted that a separate voltage regulator 1422 will be associated with each of the channels of the interface for noise purposes. The voltage regulator 1422 consists of an amplifier 1424 having one input connected to the output of the band gap generator 1420. The output of the amplifier 1424 is connected to the gate of a transistor 1426. The drain-source path of the transistor 1426 is connected between $V_{DD}$ and a node 1427. Node 1427 is also connected to the second input of the differential amplifier 1424. A capacitor 1428 is connected between node 1422 and ground. Each of the channels 1402a, 1402b, 1402c and 1402d has a regulator 1422 associated therewith. Connected to node 1427 is an oscillator circuit 1430.

Figure 14B:
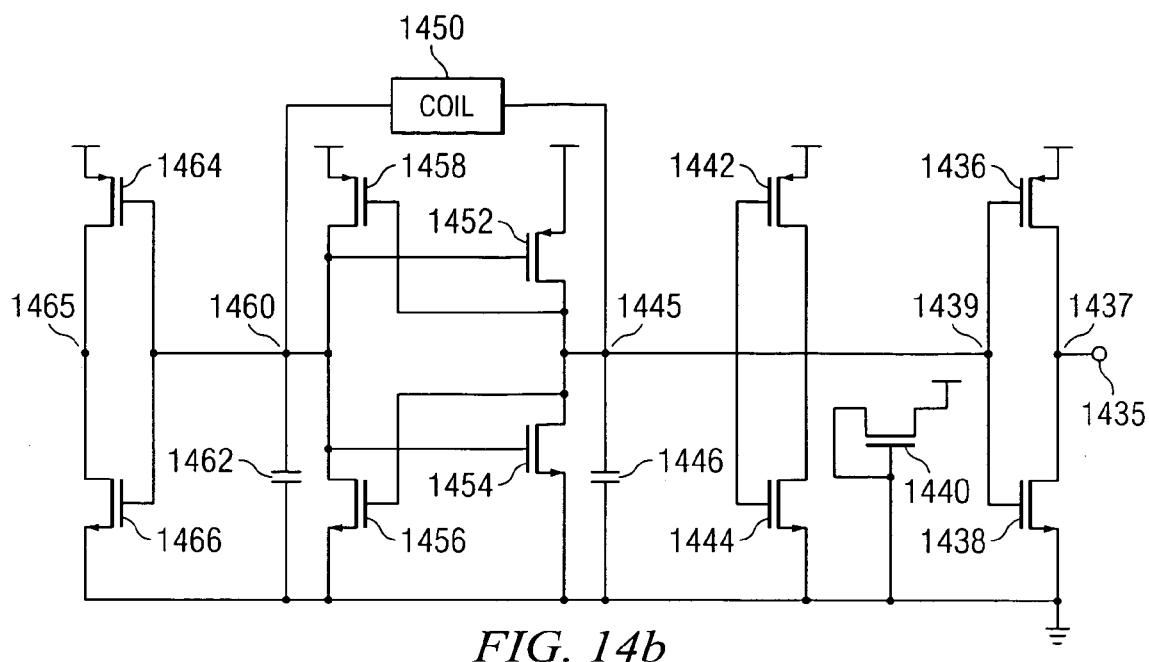
FIG. 14b is a schematic diagram of an oscillator circuit.

FIG. 14b illustrates the oscillator circuit 1430 of FIG. 14a. The output 1435 is connected to node 1437 between transistor 1436 and transistor 1438. The drain-source path of transistor 1436 is connected between $V_{DD}$ and node 1437. The drain-source path of transistor 1438 is connected between node 1437 and ground. The gates of transistor 1436 and 1438 are connected to each other through a node 1439.

A transistor 1440 has its gate connected to ground and its drain-source path connected between $V_{DD}$ and the gate of transistor 1440. Node 1439 also interconnects transistor 1442 and transistor 1444. The drain-source path of transistor 1442 is connected between $V_{DD}$ and node 1439. The drain-source path of transistor 1444 is connected between node 1439 and ground. The gates of transistors 1442 and 1444 are interconnected with each other via node 1445. A capacitor 1446 is connected between node 1445 and ground. Node 1445 is connected to a first terminal of coil 1450. The second terminal of coil 1450 interconnects with the circuit via node 1460. Transistors 1452 and 1454 are interconnected via node 1445. The drain-source path of transistor 1452 is connected between $V_{DD}$ and node 1445. The drain-source path of transistor 1454 is connected between node 1445 and ground. The gates of both transistor 1452 and 1454 connect to node 1460. Transistors 1458 and 1456 are interconnected via node 1460. The drain-source path of transistor 1458 is connected between $V_{DD}$ and node 1460. The drain-source path of transistor 1456 is connected between node 1460 and ground. The gates of transistors 1458 and 1456 connect to node 1445. The capacitor 1462 is connected between node 1460 and ground. Also connected to node 1460 are the gates of transistors 1464 and 1466. The drain-source pathway of transistor 1464 is connected between $V_{DD}$ and node 1465, and the drain-source pathway of transistor 1466 is connected between node 1465 and ground. This oscillator therefore comprises a conventional LC oscillator.

Figure 14C:
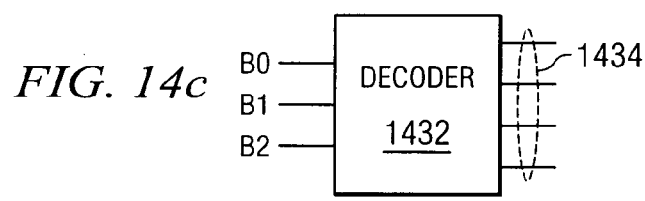

Referring now to FIG. 14c, there is illustrated one embodiment of the circuitry which might be incorporated within the logic circuit 1410. In this embodiment, the logic circuit 1410 includes of a decoder 1432. The decoder has a total of three bond pad inputs B0, B1 and B2 for receiving the indication of the version of the chip being implemented. The outputs 1434 of the decoder are input to the appropriate channels such that the channel may be configured in either a transmission or reception mode.

Figure 15:
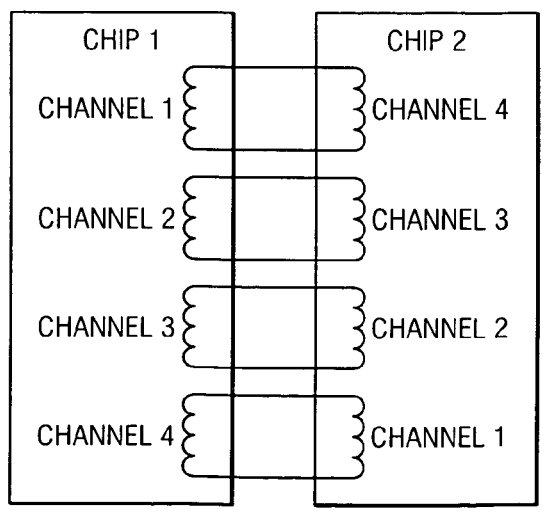
FIG. 15 illustrates a pair of chips within a single package including four separate channels for providing four isolated digital data links.

Referring now also to FIG. 15, there is illustrated the manner in which the single chip design described in FIG. 16 can be used to facilitate an entire RF isolation circuit including four separate RF isolated channels. A first chip 1502 is reversed such that the output channels 1402 between the first chip 1502 and the second chip 1504 are merely reversed. Thus, when viewing the chip 1502 from top to bottom of chip one, channel one is at the top, channel two is second, channel three is third and channel four is last. For the second chip 1504, the channels run in the opposite direction with channel one beginning at the bottom and channel four being at the top. The physical design of chip 1502 and chip 1504 are the same. Chip 1504 is merely reversed to facilitate the three versions of the chip as described below. Three different bond option versions may be selected for input to the logic circuit 1410 of the package containing the first chip 1502 and the second chip 1504 utilizing the decoder circuit 1432. Referring now to the Table 1, there are illustrated the three separate versions of operation for both the first chip 1502 and the second chip 1504 and the indication of whether the channel comprises a transmit or receive channel in the associated version.

TABLE 1

| Version | Chip | Ch. 1 | Ch. 2 | Ch. 3 | Ch. 4 |
|---|---|---|---|---|---|
| 1 | 1 | Tx | Tx | Tx | Tx |
| 2 | 1 | Tx | Tx | Rx | Rx |
| 3 | 1 | Tx | Rx | Rx | Rx |

TABLE 1-continued

| Version | Chip | Ch. 1 | Ch. 2 | Ch. 3 | Ch. 4 |
|---|---|---|---|---|---|
| 1 | 2 | Rx | Rx | Rx | Rx |
| 2 | 2 | Tx | Tx | Rx | Rx |
| 3 | 2 | Rx | Tx | Tx | Tx |

As can be seen, the associated chips 602 and 604 channels correspond, such that when a channel on one chip is transmitting or receiving, the corresponding channel on the other chip is doing the opposite.

Figure 15A:
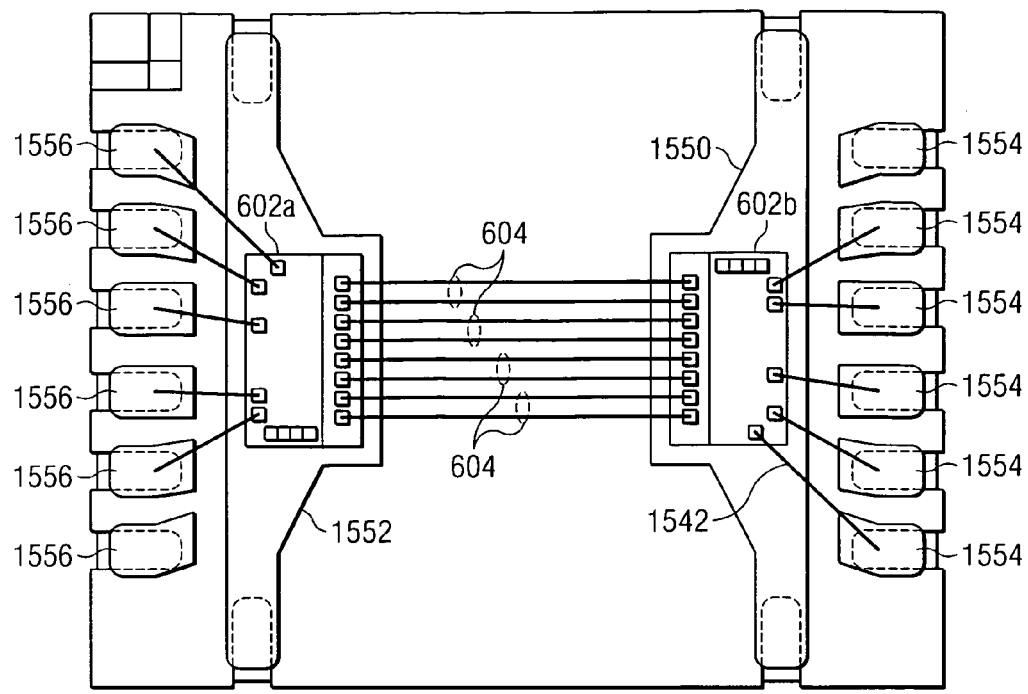
FIG. 15a illustrates the RF isolation link within a chip package.

Referring now to FIG. 15a, there is illustrated the RF isolation link 600 within a chip package. As discussed previously in FIG. 15, there are illustrated chips 1602a and 1602b interconnected by four separate channels 604. Each channel 604 is represented by two bond wires interconnecting the transformers (not shown) within each of chips 1602a and 1602b. Each of chips 1602a and 1602b are also connected to various bond pads 1504 within the package by a connection line 1542 that provide connections to the other electronic circuitry.

The embodiment of FIG. 15a is referred to as a "split lead-frame" package. This is facilitated with the use of a lead frame 1550 on one side thereof and a lead frame 1552 on the other side thereof. Lead frame 1550 is interfaced with terminals 1554 and lead frame 1550 is interfaced with terminals 1556. During fabrication, the lead frames 1550 and 1556, which are not electrically connected to each other, provide support for the chips 602a and 602b, respectively. When the chips 602a and 602b are bonded onto their respective portions of the lead frame, they are then bonded to the appropriate terminals 1554 and 1556 and then the bond wires 604 disposed therebetween. The entire package is then encapsulated in a conventional encapsulate. Thus, the bond wires 604 each comprise a high frequency transmission line disposed between the two chips, each transformer associated with two band wires that provide a "two-wire" transmission line.

Figure 15B:
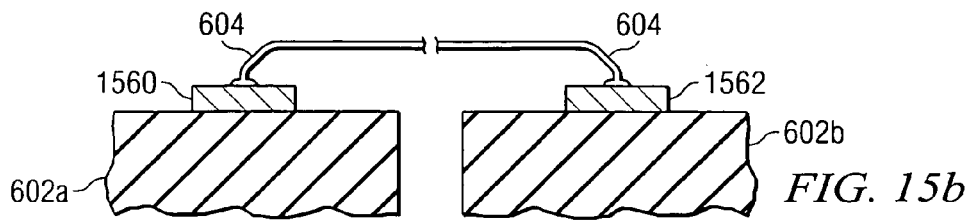

Referring now to FIG. 15b, there is illustrated a side view of one of the bond wires 604. It can be seen that the substrate associated with the die 602a has disposed thereon a bonding pad 1560 and the die 602b has disposed thereon a bonding pad 1562. The bond wire 604 is bonded to the pad 1516 on one side with a conventional bond and also to the pad 1562 on the die 602b. The length of the bond wire 604 is a fraction of a wavelength at the 2.4 GHz frequency. However, it will be inductive in nature and will have distributed inductance and capacitance associated therewith. As such, the transmission characteristics of the bond wire can affect the transmission of information between the two dies 602a and 602b. As noted herein above, the input impedance to each of the pads 1560 is on the range of 500 ohms. Thus, for ideal transmission of the information, there might be some matching circuitry required in addition to just the bond wires 604 forming the two-wire transmission line, although that has not been set forth herein.

Referring now to FIG. 16, there is illustrated the manner in which the RF isolation link 600 represented as RF isolation circuitry 1602 may be integrated into two separate multi-functional dies, 1604 and 1606, within a single package 1608. The RF isolation circuitry 1602 may provide isolation between components on two separate dies 1604 and 1606. Associated with one or both of the dies could be additional circuitry 1610 such as a microcontroller or other electronic component. This additional circuitry would be isolated from components in the other die via the RF isolation link 1602.

Figure 16A:
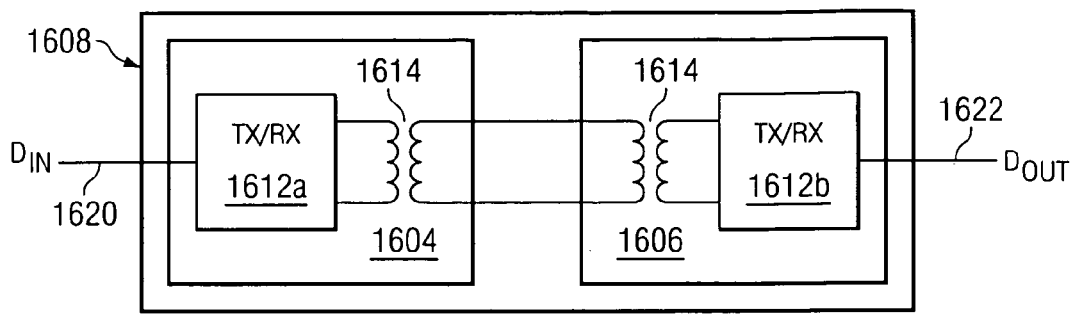
FIG. 16a illustrates an integrated RF isolation link in a single package having a digital input and a digital output.

Referring now also to FIG. 16*a*, when an RF isolation link 600 is integrated onto two separate dies 1604 and 1606 in a single package 1608. The isolation interface 1602, which includes the transceivers 1612 and the transformers 1614, may be used to provide simply a digital IN, digital OUT package 1608. In this embodiment, the digital input 1620 is applied to a first transceiver 1612*a*. Alternatively, the digital input 1620 could be applied to digital circuitry connected to the transceiver 1612*a*. The isolation circuit operates in the manner described herein above and a second digital output 1622 is provided from transceiver 1612*b* or associated digital circuitry.

Figure 16B:
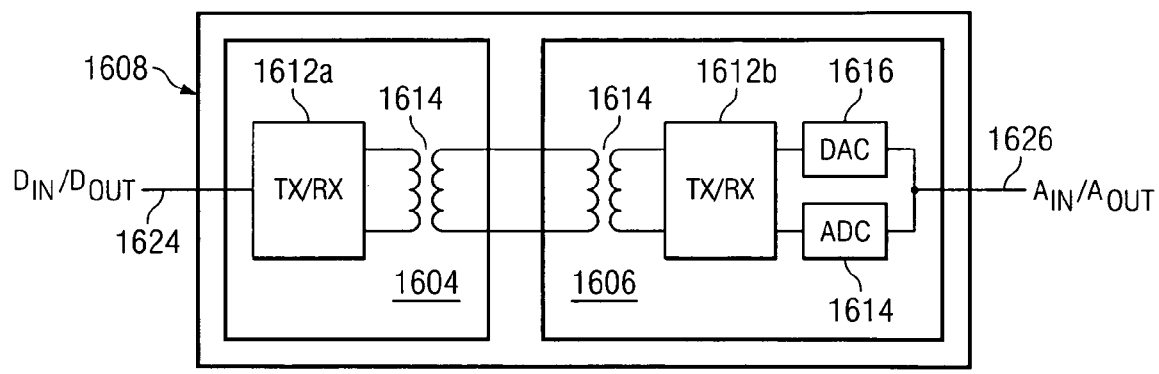
FIG. 16b illustrates an integrated RF isolation link in a single package including a digital input/output and an analog input/output.

Referring now to FIG. 16*b*, rather than providing a solely digital input/digital output circuit, a single package 1608, including first and second dies 1604, 1606 implementing the RF isolation circuit described herein above, may provide a circuit with a digital input/output and an analog input/output. In this case, a digital input/output 1924 would connect with transceiver 1612*a* or digital circuitry of a first die 1604. The first die 1604 is coupled with the second die 1606 via the described RF isolation link, and the transceiver 1612*b* is coupled to an analog input/analog output 1626 through a data converter, either an ADC 1614 or a DAC 1616, depending upon the direction.

Figure 16C:
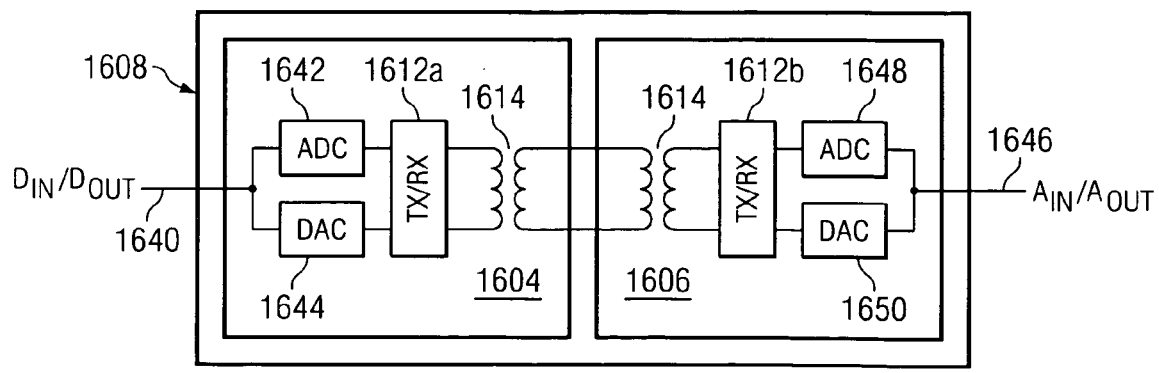
FIG. 16c illustrates an integrated RF isolation link in a single package including an analog input/output and an analog input/output.

Referring now to FIG. 16*c*, a single package 1908, including first and second dies 1604, 1606 implementing the RF isolation circuit described herein above, may provide a circuit with an analog input/output and on one side and an analog input/output on the other side. In this case, an analog input/output 1640 would connect to an A-D converter 1642 and a D-A converter 1644 and then to the transceiver 1612*a* or analog circuitry of a first die 1604. The first die 1604 is coupled with the second die 1606 via the described RF isolation link, and the transceiver 1612*b* is coupled to an analog input/output 1646 via an A-D converter 1648 and D-A converter 1650. In this way, analog signals may be transmitted in either direction across the single package 1608.

Figure 17A:
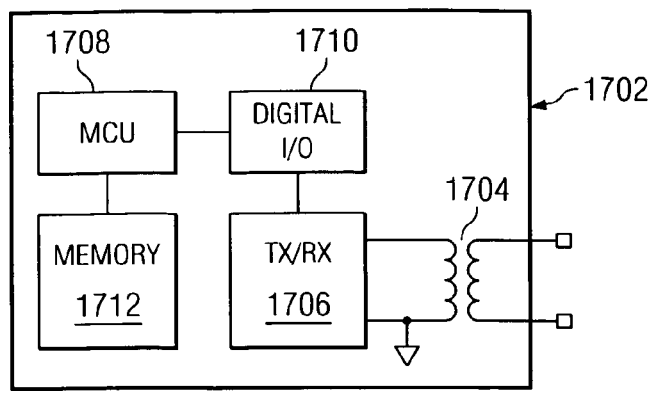
FIG. 17a illustrates an RF isolation link integrated with a microcontroller.

Referring now to FIG. 17*a*, there is illustrated a chip 1702 including a portion of the RF isolation link described herein above. The chip 2002 includes a single transformer 1704 and the transmit and receive circuitry 1706 of the RF isolation link 600. The RF isolation link 600 consisting of the transceiver 1706 and the transformer 1704 is integrated with a microcontroller unit 1708 through a digital input/output 1710. A memory 1712 stores operating instructions and data needed by the microcontroller unit 1708. The chip 1702 would be able to interconnect with a second chip that included an interface consisting of a transformer 1704 and transceiver 1706 similar to that included within the chip 1702. By interconnecting to such chips, the microcontroller 1708 and the interconnected chip would be voltage isolated from each other via the complete RF isolation link between them.

The transmit and receive circuitry 1706 is part of the I/O interface for the integrated circuit. One type of integrated circuit that provides the overall functionality of that illustrated in FIG. 17*a* is a conventional microcontroller unit of the type C8051FXXX, manufactured by the present Assignee. This chip provides onboard processing through the MCU 1708, interface to the analog domain and interface to the digital domain. This integrated circuit also has the ability to configure the various outputs and, as such, a digital output could be provided on a serial interface for driving the transmit/receive circuitry 1706 or receiving the serial data therefrom.

The process of fabricating the MCU 1708, memory 2012 and the digital I/O 1710, in addition to the various analog-to-digital data converters or digital-to-analog data converters is fairly complex. As such, the transmit and receive circuitry 1706 and the transformer 1704 must be compatible with the process rather than making the process compatible with the transformer. As will be described herein below, there are a plurality of metal layers utilized to fabricate various interconnects associated with fabrication of the integrated circuit. By utilizing the various metal layers that are already present in the fabrication process, the two sides of the transformer 1704 can be fabricated and isolated from one another with sufficient isolation to provide adequate over voltage protection. Additionally, due to the high voltages and the high frequency of the transformer, the transformer 1704 is actually disposed in a separate portion of the chip surface area such that it does not overlie any of the circuitry associated with the digital operation or the analog operation, since this is a mixed-signal integrated circuit.

Figure 17B:
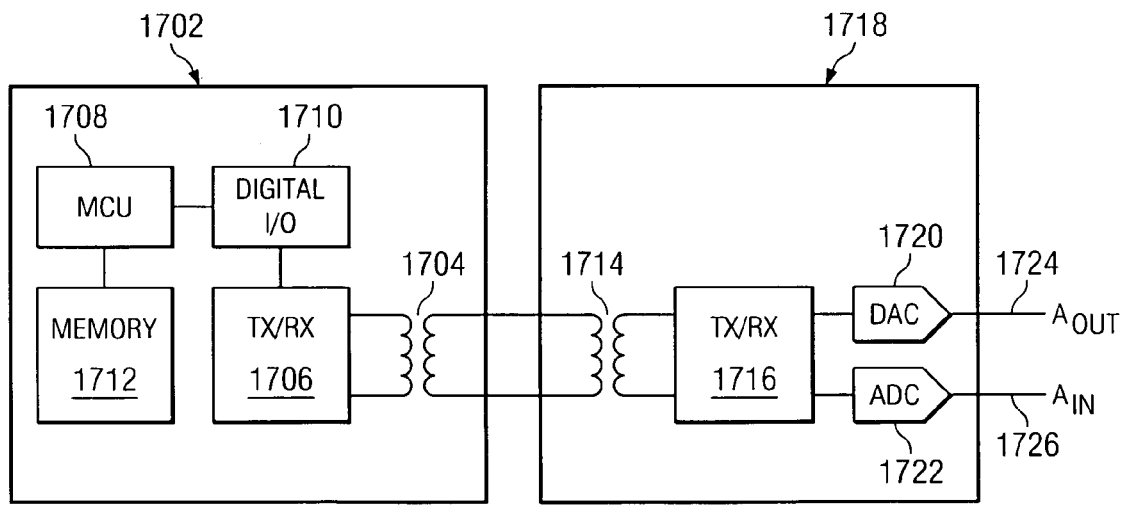
FIG. 17b illustrates an RF isolation link integrated with a microcontroller interconnected to a second chip providing both analog input and analog output.

One example of this is illustrated in FIG. 17*b*, wherein the chip 1702 including an RF isolation link consisting of transformer 1704 and transceiver 1706 is integrated with a microcontroller unit 1708 through a digital input/output 1710. The MCU 1708 also includes an associated memory 1712. In this case, the first portion of the RF isolation link consisting of a transformer 1704 and transceiver 1706 is interconnected with a second portion of the RF isolation link consisting of transformer 1714 and transceiver 1716. In this case, the chip 1718 including the second portion of the RF isolation link includes a digital-to-analog converter 1720 and an analog-to-digital converter 1722 for converting the digital output of the transceiver 1716 of the RF isolation link into an analog output and for converting received analog inputs into digital inputs. The chip 1718 enables both the output of an analog signal at analog output 1724 and the input of analog signals at analog input 1726. These analog signals may then be used in any desired fashion by a circuit designer.

Figure 18A:
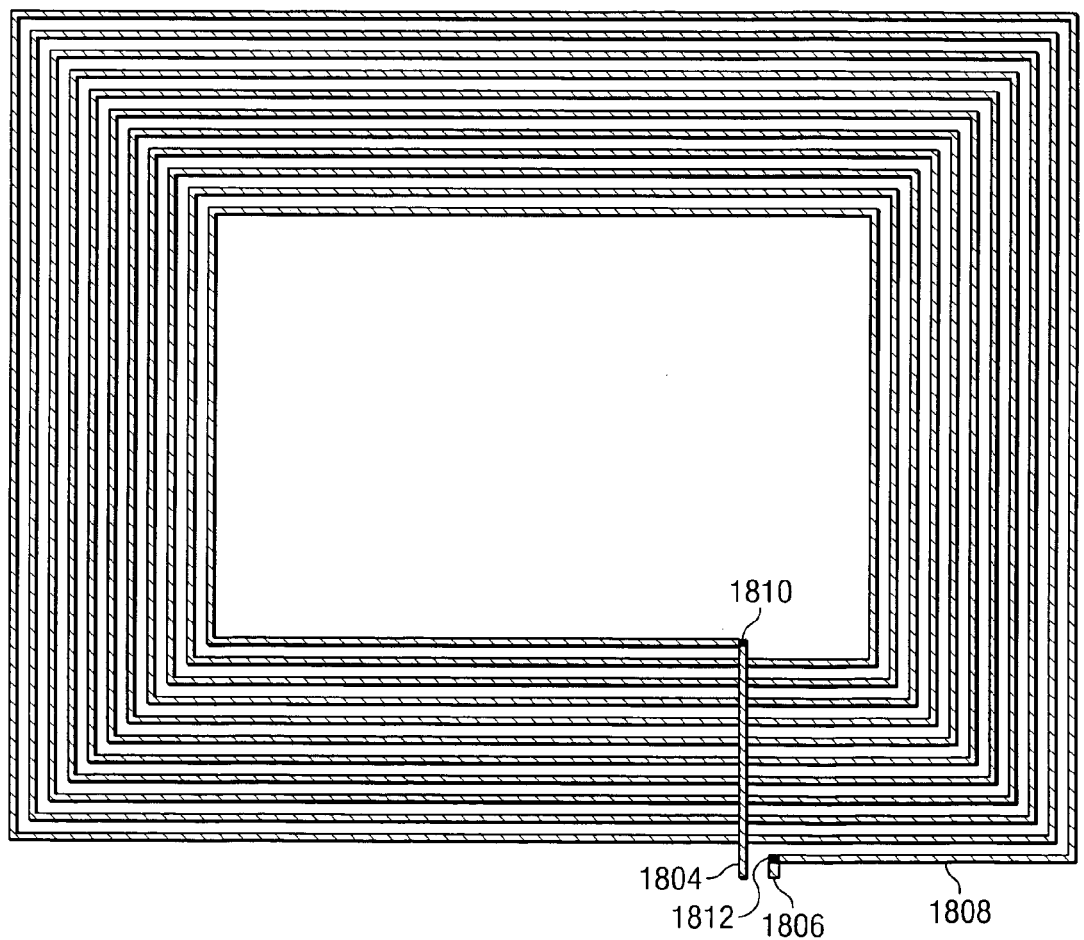
FIG. 18a illustrates one coil of a transformer of the RF isolation link.
Figure 18B:
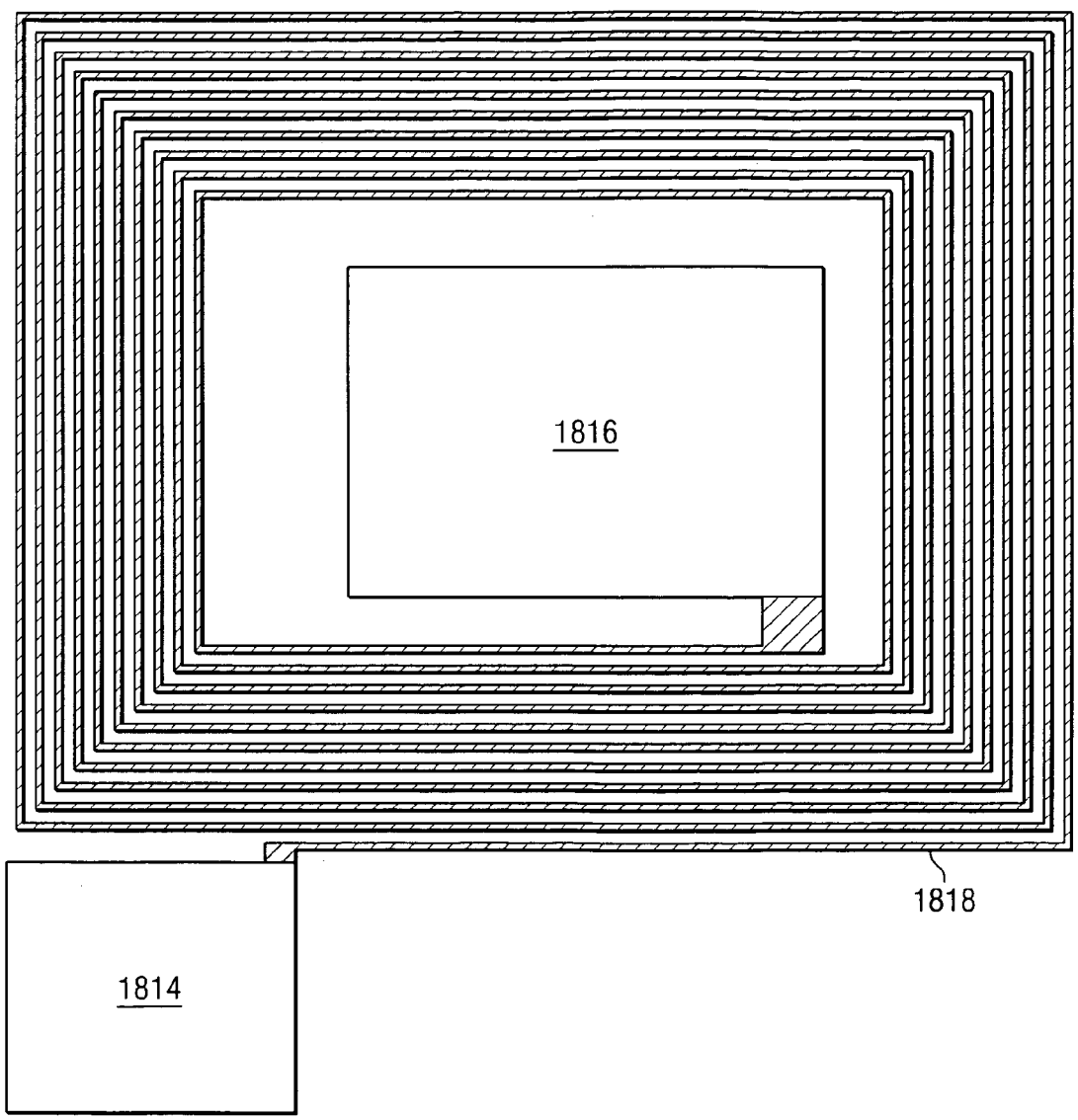
FIG. 18b illustrates a second coil of a transformer of the RF isolation link.

Referring now to FIGS. 18*a*, 18*b*, 19 and 20, there is illustrated the structure of the transformer coils of transformer 714 or 718 (FIG. 7) integrally formed on a CMOS device. Each transformer 714 and 718 is integrated as a part of one of the chips or dies including the RF isolation link. Referring more particularly to FIGS. 18*a* and 18*b*, there are illustrated the two coils included in each of transformers 714 or 718. A first coil 1802 consists of a first terminal 1804 and a second terminal 1806 formed in the metal layer of a chip referred to as the "Metal 1" layer. Each of the terminals in the Metal 1 layer are connected to the transformer coil 1808 which resides on a second metal layer of a chip referred to as the "Metal 2" layer. A conductive via 1810 interconnects the coil 1808 with terminal 1804. A second connective via 1812 interconnects the coil 1808 with the second terminal 1806. A second coil resides upon a fifth metal layer referred to as the "Metal 5" layer. This coil consists of a first bonding pad 1814 and a second bonding pad 1816. Each of the first and second conductive pads 1814, 1816 are interconnected by a second coil 1818 encircling pad 1816 and interconnecting with pad 1814. Unlike the coil described in FIG. 18*a*, coil 1818 includes both the bonding pads 1814, 1816 and the coil 1818 on the same metal layer (Metal 5).

Figure 19:
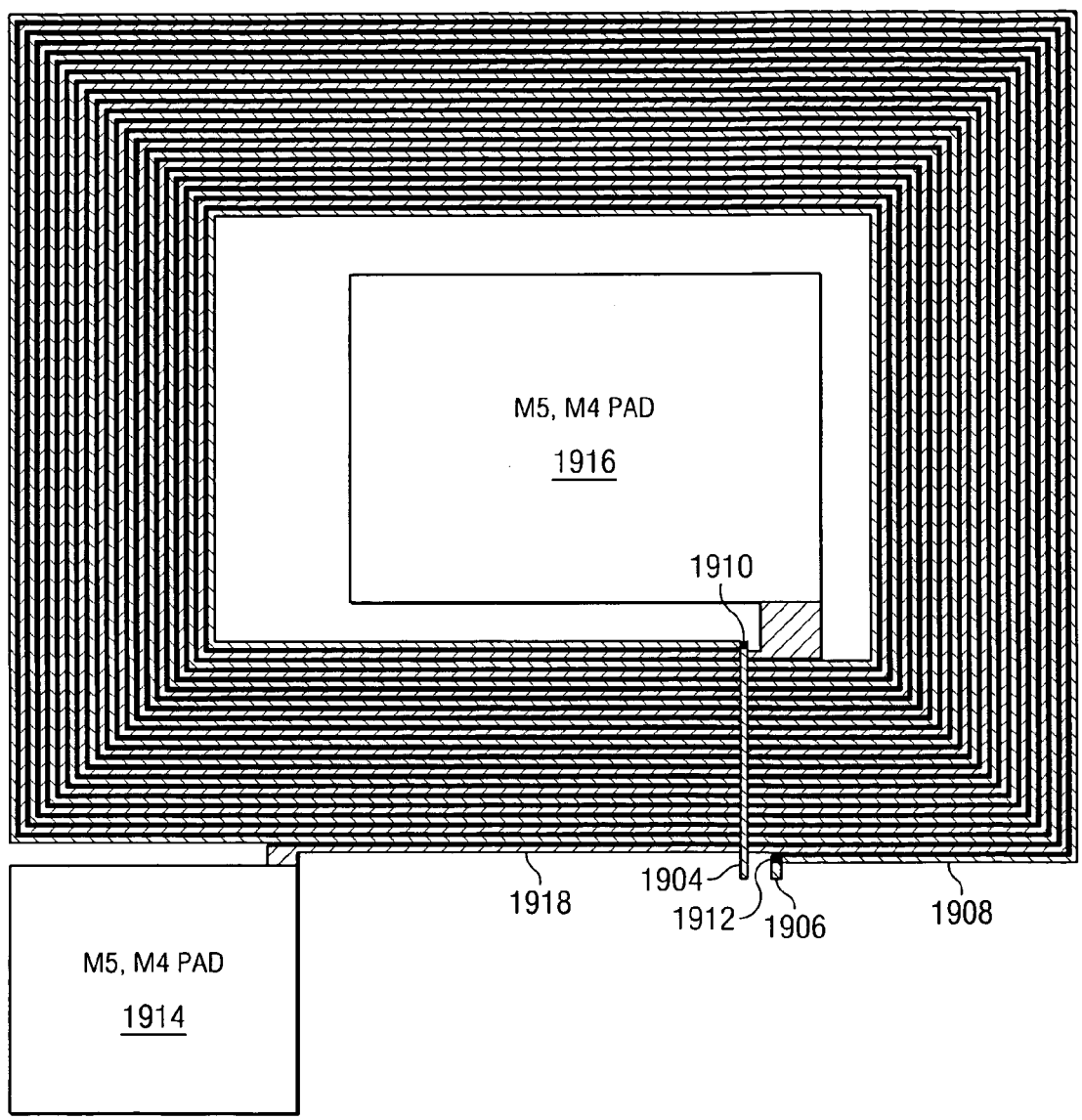
FIG. 19 illustrates an overlapping view of the transformers described in FIGS. 21a and 21b.

Typically, the Metal 5 layer is the uppermost layer. Referring now also to FIG. 19, there is illustrated the overlapping view of the first and second coils of a transformer on a chip. It can be seen that the pad 1816 is dimensioned such that it is ⅓₂μ×94 μm. The entire coil is dimensioned to be 268 μm by 205 μm. The pad 1814 is dimensioned to the 70 μm×80 μm. The two coils 1818 and 1808 are similar in their configuration and are oriented such that they are substantially "non-overlapping." However, they could overlap.

Figure 20:
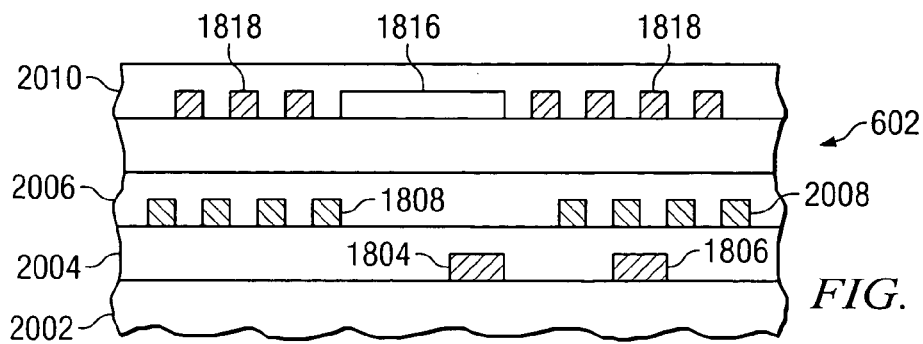
FIG. 20 is a side view of the coils forming a transformer of the RF isolation link.

Referring now to FIG. 20, there is illustrated a side view of a chip 602 containing a transformer structure as described with respect to FIGS. 18*a*, 18*b* and 19. The chip 602 includes a substrate layer 2002 containing the transceiver circuitry of the RF isolation link and any electronic circuitry integrated with the RF isolation link as discussed previously. The Metal 1 layer 2004 resides upon the substrate 2002 and includes the first and second terminals 1804, 1806 of the first transformer coil. On top of the Metal 1 layer is the Metal 2 layer 2006 containing the first coil 1808 interconnected by vias to the first and second terminals 1804 and 1806 (not shown). Finally, the Metal 5 layer resides over the Metal 2 layer 2008. The Metal 5 layer 2010 contains the other portion of the transformer, including the bond conduction pads 1816 and the bond pad 1814 (not shown) and the coil 1818 interconnecting the bond pad 1816 with the bond pad 1814. The Metal 1 layer for the transformer is utilized primarily to provide interconnects to the remaining of the circuits for the terminals 1804 and 1806. However, the process utilizes all five metal layers for the various interconnects. For the purposes of over voltage protection, it is desirable to separate the coil 1818 from the coil 1808 by as much distance as possible; realizing that the material disposed therebetween is silicon dioxide, a dielectric. An additional concern is the capacitor loading on the coil 1818 to ground, the substrate 2002 typically being disposed at ground. The high voltage will be present on the coil 1818 and, therefore, it is separated from both the substrate and the coil 1818 by as much distance as possible. Although the coil 1818 could have been fabricated in the Metal 1 layer, there would then have been a requirement to provide an interconnection from the ends of the coil to the circuitry. This would have required a "run" to be provided beneath the Metal 1 layer, which would require utilization of a polycrystalline layer. Even siliciding of the poly layer would not provide as good a conductive layer as that associated with a metal layer. As such, the configuration utilizes the Metal 1 layer for the interconnects and the Metal 2 layer for the coil.

Although it would be desirable to provide an even additional metal layer to further separate the coil 1818 from the coil 1808, it is not feasible to complicate a process with a special additional layer. The only reason that an additional layer would be utilized would be for the purpose of fabricating other circuitry on the integrated circuit. The reason for this is that, once a process is defined as being able to utilize multiple metal layers, substantially all circuits run through that process will use the multiple layers. It would be difficult to dedicate a process for a single integrated circuit that only used that additional metal layer and, therefore, the coil is fabricated from already existing metal layers in an existing process. However, if an additional metal layer were utilized in an existing process in the future, then it is possible that the coil 1818 would be disposed in an even higher layer than Metal 5.

Figure 21:
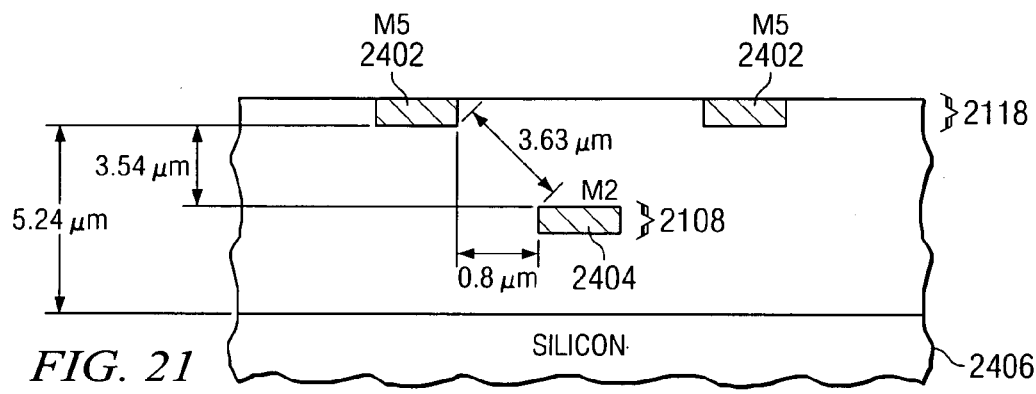
FIG. 21 illustrates an offset between metal layers to increase breakdown voltages within a transformer.

Referring now to FIG. 21, there is illustrated the offset used between metal runs 2102 of the coil 1818 on the Metal 5 layer and metal runs 2104 of the coil 1808 on the Metal 2 layer. Rather than having metal runs 2104 on the Metal 2 layer disposed directly below a metal run 2102 on the Metal 5 layer, they are offset diagonally from each other in order to increase the breakdown voltage between the components by increasing the distance. In the disclosed embodiment, the total distance between the Metal 5 layer run 2102 and the Metal 2 layer run 2404 is 3.63 μm. The Metal 2 layer run 2104 is vertically displaced from the Metal 5 layer run 2102 by 3.54 μms and horizontally displaced by 0.8 μm. The Metal 5 run layer 2102 is vertically separated from the silicon layer by 5.24 μm. This structure should provide a breakdown voltage between the Metal 5 and Metal 2 layers according to the equation $3.63 \times 10^{-6}$ m*$8 \times 10^8$ v/m=2904 v of breakdown voltage isolation. The breakdown voltage between the Metal 5 layer 2402 and the silicon layer 2406 can be determined according to the equation $5.24 \times 10^{-6}$ m*$8 \times 10^8$ v/m=4192 v.

Figure 22:
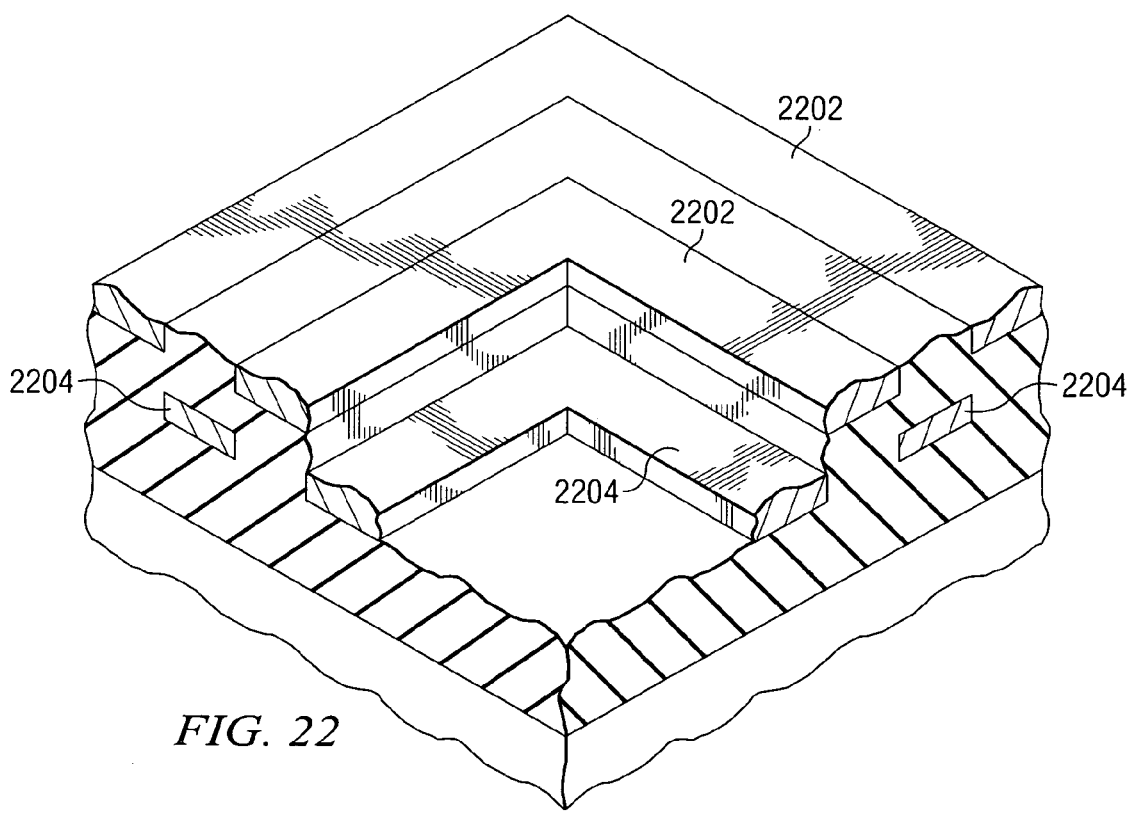
FIG. 22 illustrates a perspective cutaway view of the coil construction.

Referring now to FIG. 22, there is illustrated a cutaway perspective view of the coils 1818 and 1808 illustrated in FIG. 21. It can be seen that the metal runs 2104 are substantially the same shape as the metal runs 2102 but they are non-overlapping and separated by a dielectric layer. This illustration illustrates only a single corner of the coils.

Figure 23:
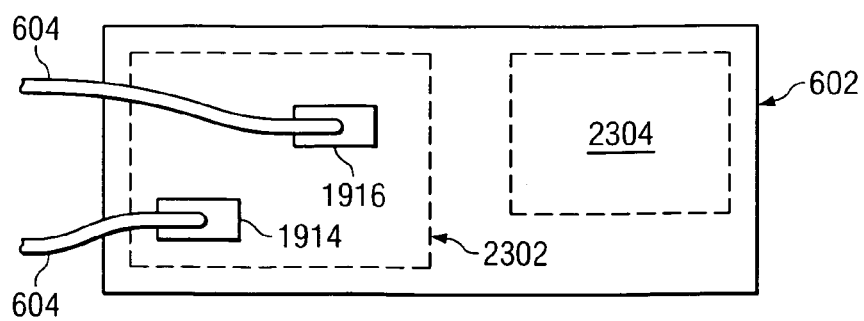
FIG. 23 illustrates the separate areas in which the transformer coils and the circuitry would be implemented on a chip utilizing the RF isolation circuit.

Referring now to FIG. 23, there is illustrated a chip 602 including an RF isolation link according to the present disclosure. The area of the chip 602 would be divided into at least two sections. A first section 2302 would contain the circuitry for providing the transformer for electromagnetically coupling with a transformer on another chip to provide the voltage isolation link between the chips. The remaining electronic circuitry of the chip would be located in a separate area 2304 and would include the transmitter and receiver circuitry of the voltage isolation link associated with the transformer as well as any electronic circuitry that would be integrated with the voltage isolation link, such as a microcontroller or other type of electronic device. This would be repeated for multiple voltage isolation links for additional data paths. Additionally, it is noted that the layout is such that the area 2302 that contains the transformer on the upper surface thereof will have provided the pads 2116 in the center of the coil 2118 and the pad 2114 on the exterior thereof. The pad 2114 is located proximate the edge of the chip such that the bond wire 604 can be bonded thereto. Additionally, the pad 2116 is on the same surface as the pad 2114 such that the bond wire 604 associated therewith can be connected thereto. As such, there are no runs required to connect to the pad 2116 in a coil that would be required to run through other layers and run closer to the coils therein at right angles thereto. The bond wire 604 associated therewith will actually be disposed farther away from the actual metal runs 2102 associated with the coil 1818. An additional area could be included on the chip for additional electronic circuitry to be voltage isolated via a voltage isolation link on the same chip.

Figure 24:
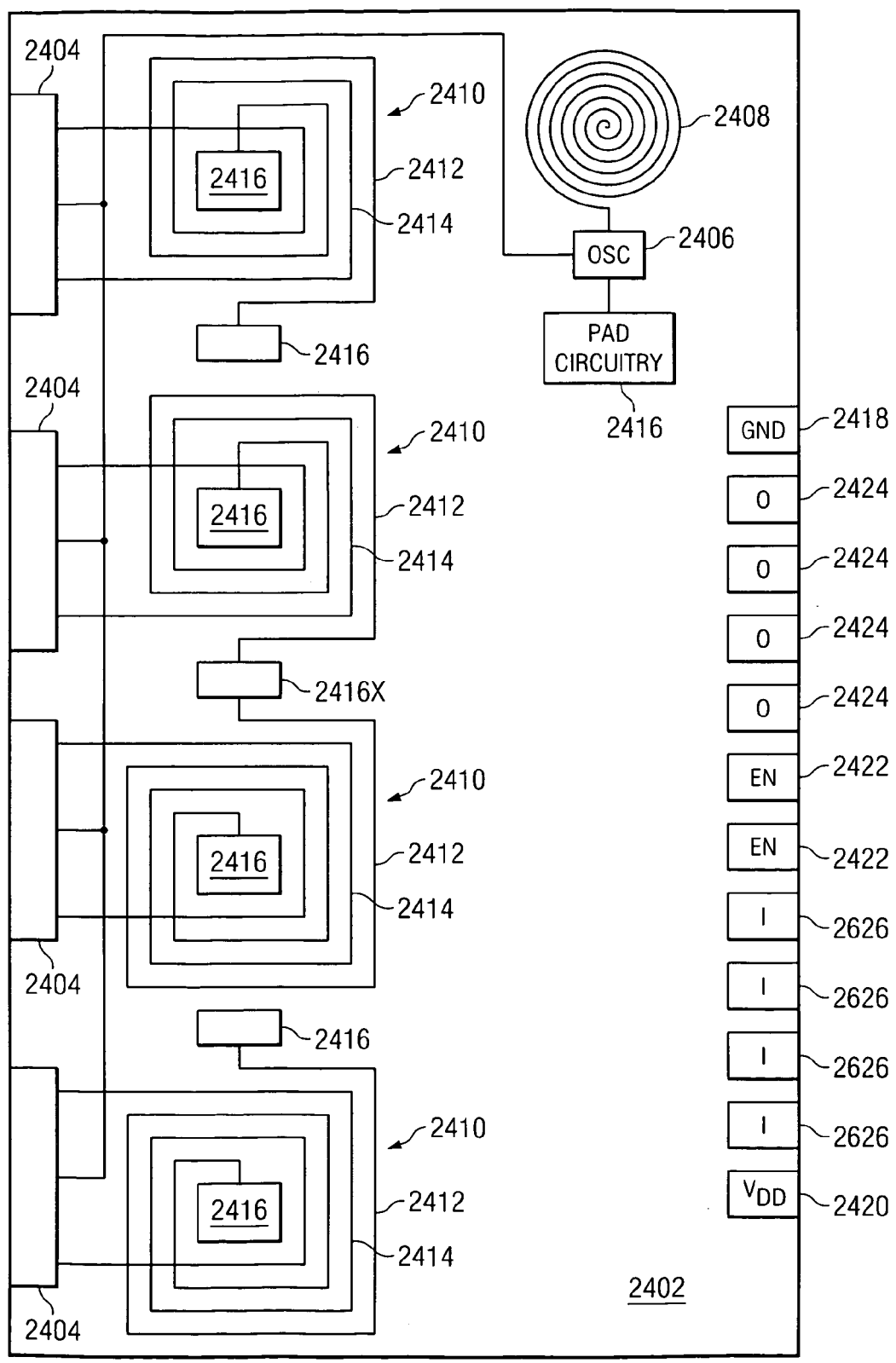
FIG. 24 illustrates the structure of the RF isolation link integrated on a single chip.

FIG. 24 illustrates the overall structure of the RF isolation link implemented on a chip 2402. Four separate interface connections 2404 provide connection of each of the four channels of the RF isolation link integrated into the chip 2402. Each of the four interfaces 2404 is linked with the oscillator 2406 and coil 2408. Connected to each of the interfaces 2404 are the transformers 2410 consisting of a first coil 2412 and a second coil 2414. Coil 2414 connects with the interface 2404 to provide interconnection with an external chip via the RF isolation link. Coil 2412 interconnects to bond pads 2416. It is noted that the channel one and channel four coils 2414 each include two separate bond pads 2416. However, the channel two and three coils 2414 each have a bond pad within the interior of the coil but share the external bond pad 2416*x* between channels two and three. Pad circuitry 2418 is associated with the oscillator circuit 2406 and the coils 2410. The pad circuitry 2418 is interconnected with the remainder of the circuitry on a chip 2402 via a number of bond pads. The bond pads comprise a ground bond pad 2418, a $V_{DD}$ bond pad 2420, two enable bond pads 2422, four output bond pads 2424 and four input bond pads 2426, one for each channel.

Figure 25:
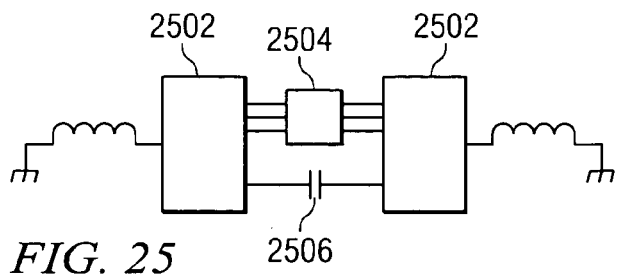
FIG. 25 illustrates an isolator chip having two printed circuit boards which may act as a dipole antenna at higher frequencies.

One problem with the above-described RF isolation link design is that RF interference from nearby transmitting cellular telephones may create common mode interference that may not be filtered in the receiving portion. Referring now to FIG. 25, at GHz frequencies the application printed circuit board consisting of two separate portions 2502 creates split ground planes which may act as a dipole antenna. The split ground planes may have dimensions that are close to the quarter wavelength dimension at 900 MHz. This results in very large common mode signals which may be passed through the isolator chip 2504. Measurements from a nearby transmitting GSM cell phone at maximum power can create common mode voltages of as high as 3.4V peak at 900 MHz. This would cause interference within the RF isolation link as described herein above, causing a "0" to be incorrectly detected as a "1" when a cell phone was operating nearby. One manner for reducing this problem is by adding an EMI capacitor 2506 between the isolated ground planes. Thus, at a frequency of 900 MHz, a circuit without the EMI capacitor 2506 would have a 3.4V peak common mode voltage but with a 300 pF capacitor 2506 would only have a 1.1 V peak. Likewise, at 2 GHz, the circuit without an EMI capacitor 2506 would have a 0.85V peak common mode voltage and a 0.07V peak common mode voltage when a 300 picofarad EMI capacitor 2506 was included. An RF isolator as described herein above cannot handle this level of common mode interference.

Figure 26:
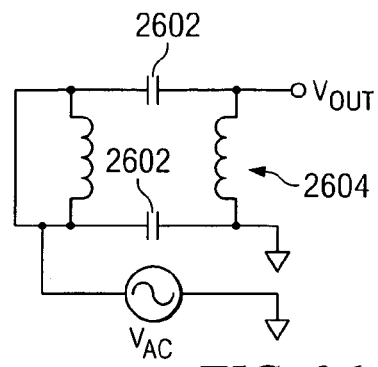
FIG. 26 illustrates the parasitic capacitance between windings at higher frequencies.
Figure 27:
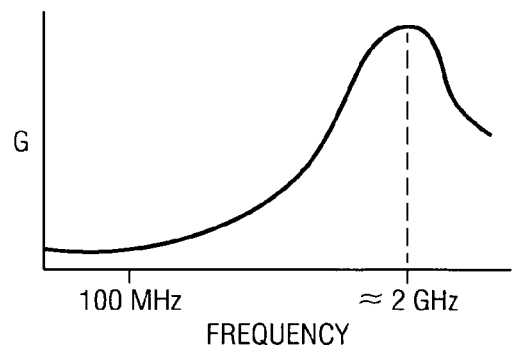
FIG. 27 illustrates how RF signals can be passed through the transformer as common mode signals.

The previously described single-ended design relies upon the transformer to provide all common mode rejection. While the transformer has very good common mode rejection below 100 MGz, the common mode rejection for the transformer is poor at GHz frequencies. This is due to the parasitic capacitances 2602 that are created within the transformer 2604 as illustrated in FIG. 26. This is more fully illustrated in FIG. 27 wherein the vertical axis illustrates the common mode gain and the horizontal axis illustrates frequencies. As can be seen in FIG. 27, at 100 MHz frequencies, the common mode gain is relatively minimal. However, as the GHz frequencies are approached, the common mode gain increases, thus increasing the amount of common mode interference which would be passed through the transformer circuit of the RF isolation link.

Figure 28:
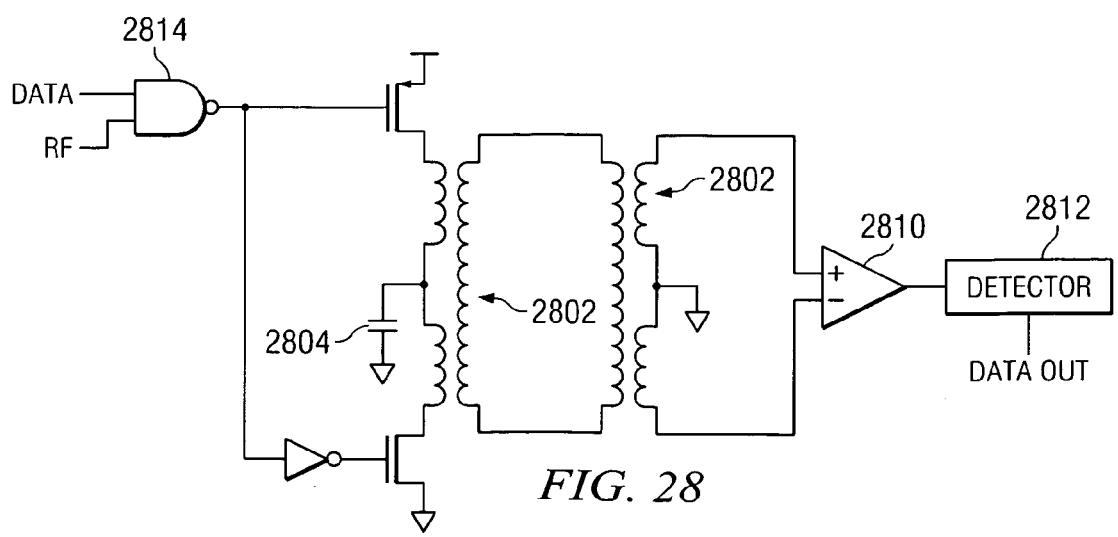
FIG. 28 illustrates a schematic diagram of an RF isolator including a differential output.

In the embodiment illustrated in FIG. 28, the problems of common mode interference are addressed by modifying the transformer 2802 to be a center tapped transformer and including a differential amplifier 2810. Use of the center tapped transformer 2802 moves out the frequency at which the circuit resonates by splitting the parasitic capacitances. The center tap of transformer 2802 on the transmitter side is connected through a capacitor 2804 to ground. The center tap of transformer 2802 on the receive side is grounded. The bandwidth of the center tap transformer is two times higher than the single ended design for common mode signals. This helps suppress 900 MHz common mode interference. The data to be transmitted is applied to a first input of NAND gate 2814 and the RF signal is applied to second input of NAND gate 2814 before being applied to the center tapped transformer 2802. A differential amplifier 2810 is used on the receive side to further suppress common mode interference. In this circuit, common mode interference is applied to the inputs of the differential amplifier 2810 as a common mode signal which is rejected by the differential amplifier 2810. The transmitted RF signal is differential and is gained up by the receiver RF amplification and applied to a detector circuit 2810, one example of which may be the detector circuits described herein above.

Figure 29:
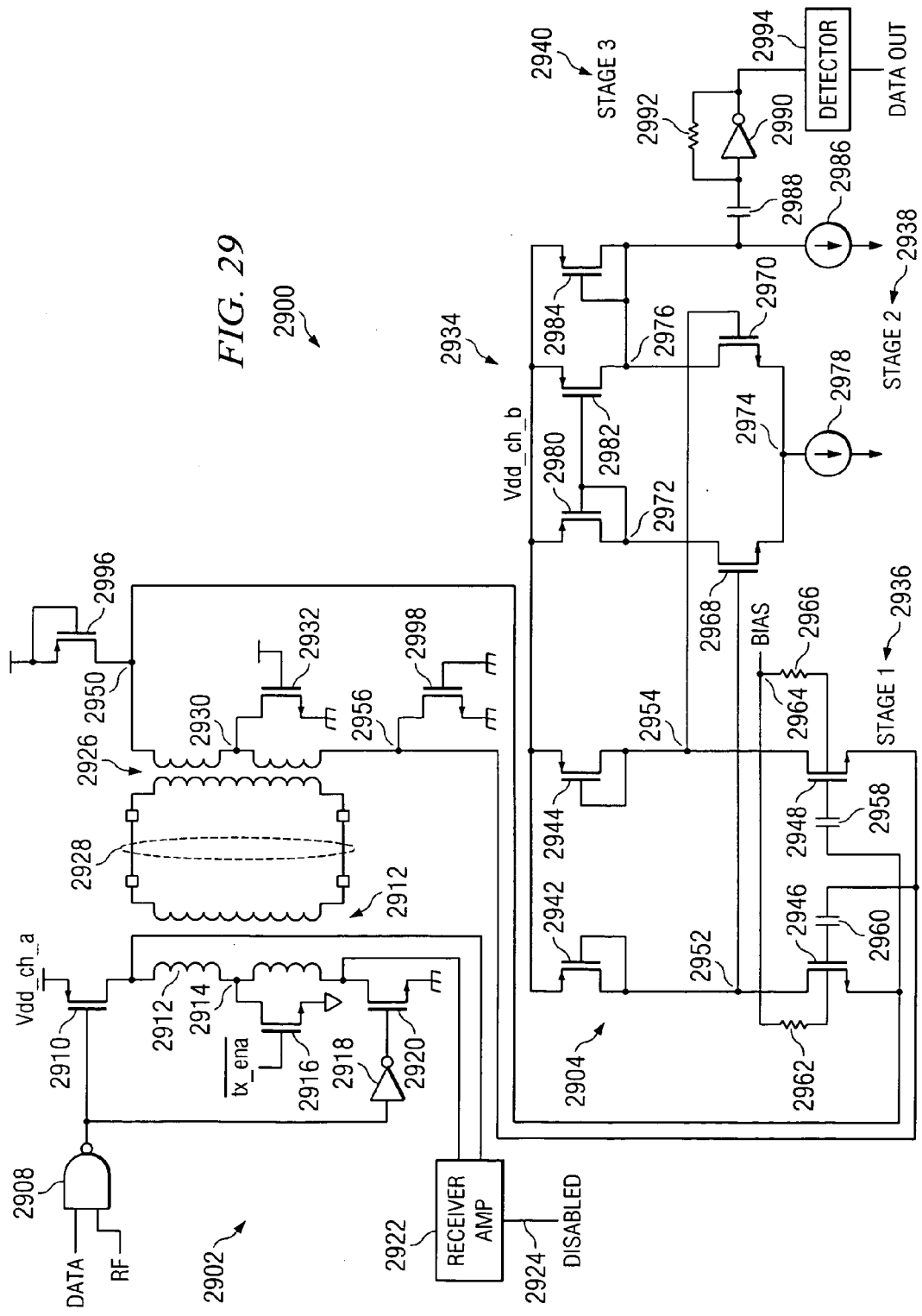
FIG. 29 is a more detailed schematic view of the RF isolator of FIG. 28.

Referring now to FIG. 29, there is illustrated an alternative embodiment of the RF isolation link 2900 of FIG. 28 consisting of transmitter circuitry 2902 and receiver circuitry 2904. The transmitter circuitry 2902 consists of a NAND gate 2908 having a first input connected to receive the data to be transmitted over the RF isolation link 2900 and a second input connected to receive the RF carrier signal. The RF carrier in the preferred embodiment comprises a 2 GHz signal. The data input to the first input of the NAND gate 2908 consists either of a logical "1" or "0" which will selectively gate the RF carrier signal to the output of NAND gate 2908 in the presence of a logical "1." This causes the output of the NAND gate to either provide the RF carrier signal when the data bit is "1" or not provide the RF signal when the data bit is "0." The output of the NAND gate 2908 is connected to the gate of a p-channel transistor 2910. The drain-source paths of the p-channel transistor 2910 are connected between $V_{DD}$ and a first input of transformer 2912. The transformer 2912 is a center tap transformer having its center tap node 2914 connected to a transistor 2916. The drain-source path of transistor 2916 is connected between node 2914 and ground. The gate of transistor 2916 is connected to receive signal tx_ena-bar. The output of NAND gate 2908 is also connected to an input of inverter 2918. The output of inverter 2918 is connected to the gate of transistor 2920. The drain-source path of transistor 2920 is connected between transformer 2912 and ground. A receiver amplifier 2922 is connected across transformer 2912 and may be disabled by a disable input 2924 when the chip is transmitting. The transformer 2912 electromagnetically couples the RF carrier signal to transformer 2926 via bond wires 2928. This links the data represented by the RF carrier signal between the transformers and limits common mode signals while providing voltage isolation between the chips via the first and second transformers 2912 and 2926. Each of the transformers 2912 and 2926 are associated with opposite sides of the interface.

The receiver circuitry 2904 receives the signal which has been electromagnetically coupled via the center tap transformer 2912 onto the bond wires 2928 to center tap transformer 2926. Connected to a center tap node 2930 of center tap transformer 2926 is a transistor 2932. The drain-source path of the transistor 2932 is connected between center tap node 2930 and ground. The gate of transistor 2932 is connected to $V_{DD}$. The outputs of center tap transformer 2926 are connected to the inputs of a differential amplifier 2934. The differential amplifier 2934 consists of a first stage 2936 and second stage 2938 providing common mode rejection and a third stage 2940 providing single ended gain.

The first stage 2936 consists of a set of two p-channel transistors 2942, 2944, and two n-channel transistors 2946 and 2948. The drain-source path of transistor 2946 is connected between node 2950 and node 2952 connected to center tap transformer 2926. The gates of transistors 2946 and 2948 are cross coupled through capacitors 2956 and 2958 to nodes 2950 and 2956, respectively. Transistor 2942 has its drain-source path connected between $V_{DD}$ and node 2952. Transistor 2948 has its drain-source path connected between node 2954 and node 2956. Transistor 2944 has its drain-source path connected between node $V_{DD}$ and node 2954. The gate of transistor 2942 is connected to node 2952. The gate of transistor 2944 is connected to node 2954. A resistor 2962 is additionally connected between the gate of transistor 2946 and a bias node 2964. A resistor 2966 is also connected between the gate of transistor 2948 and the bias node 2964.

The second stage 2938 is connected to the first stage 2936 at nodes 2952 and 2954. Transistor 2968 has its gate connected to node 2952. Transistor 2970 has its gate connected to node 2954. The drain-source path of transistor 2968 is connected between node 2972 and node 2974. Transistor 2970 has its drain-source path connected between node 2976 and node 2974. A current source 2978 is connected between node 2974 and ground. Transistor 2980 has its drain-source path connected between node 2972. The gate of transistor 2980 is connected to node 2972. Transistor 2982 has its drain-source path connected between $V_{DD}$ and node 2976. The gate of transistor 2982 is connected to node 2972. Transistor 2984 has its gate connected to node 2976. The drain-source path of transistor 2984 is connected between $V_{DD}$ and node 2976. A current source 2986 is connected between node 2976 and ground.

The third stage 2940 connects with the second stage 2938 at node 2976. A capacitor 2988 is connected between node 2976 and an input of amplifier 2990. The output of amplifier 2990 has a feedback resistor 2992 connected to its input. The output of amplifier 2990 is also connected to a detector circuit 2994 for detecting the amplified data coming from the gained amplifier. A transmitter circuit 2926 connects to the single tap transformer 2926 at node 2950. The transistor 2928 has its drain-source path connected between node 2956 and ground. The gate of transistor 2928 is also connected to ground.

Figure 30A:
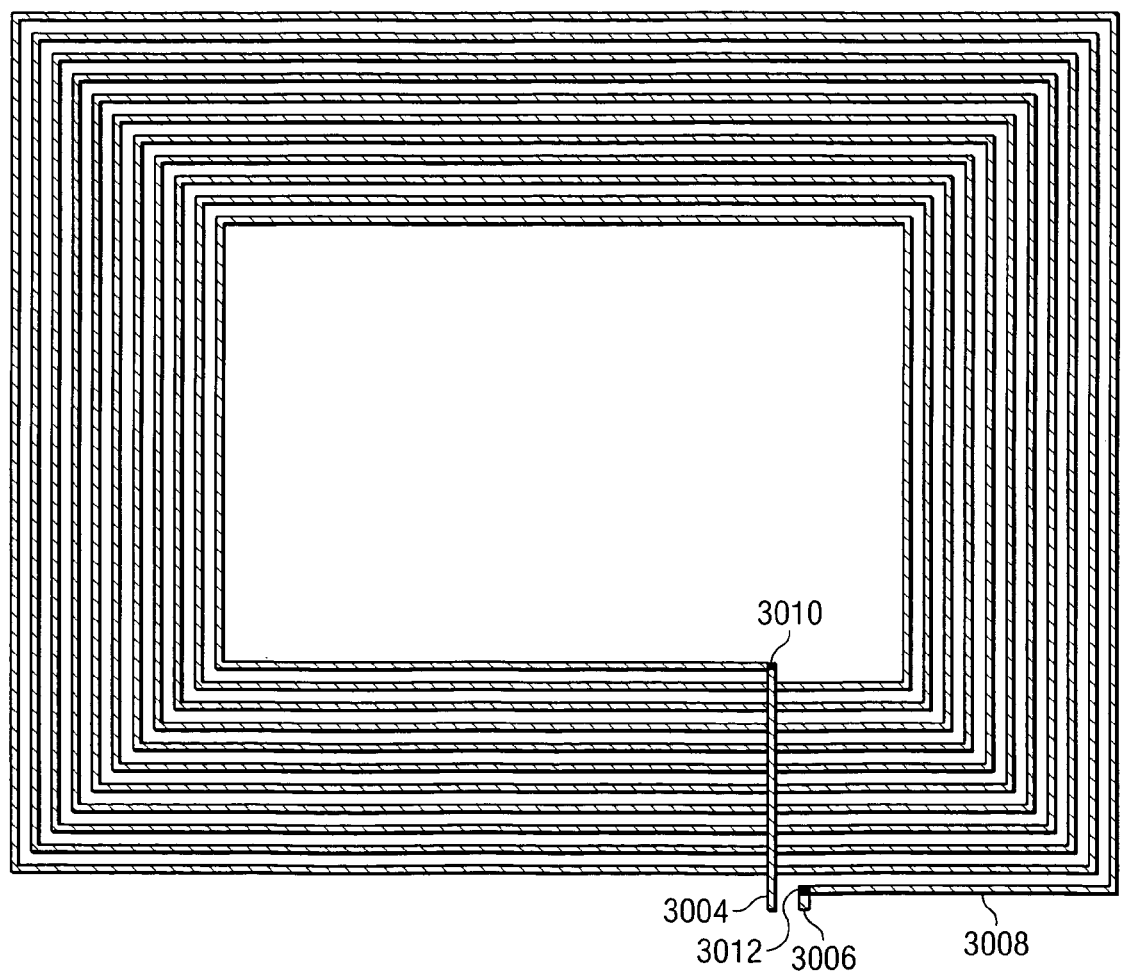
FIG. 30 is an illustration of the transformer coils of the RF isolator including a center tap.
Figure 30B:
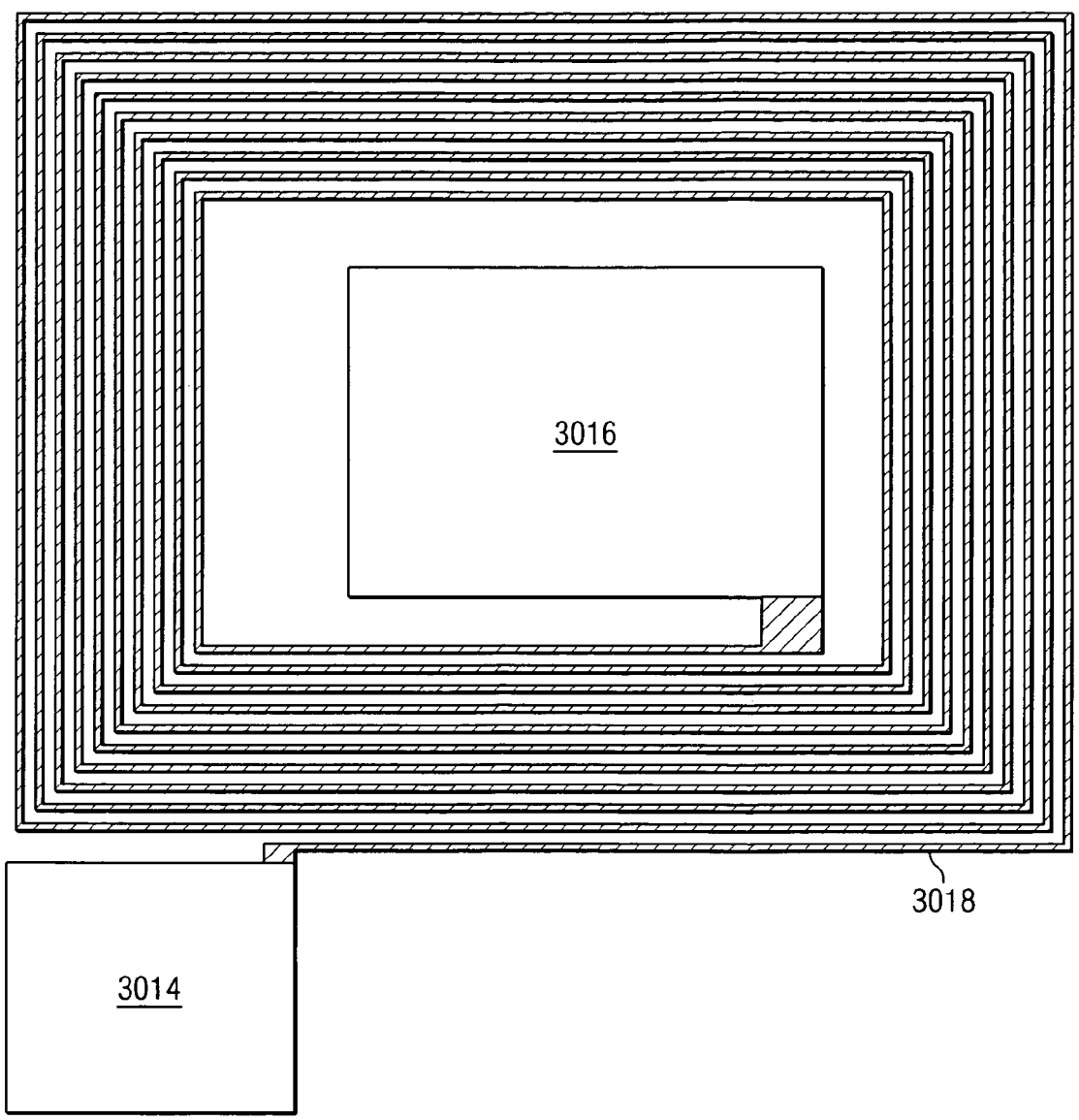

Referring now to FIGS. 30a, 30b, 31 and 32, there is illustrated the structure of the transformer coils of transformer 2912 or 2926 (FIG. 7) integrally formed on a CMOS device. Each transformer 2912 and 2926 is integrated as a part of one of the chips or dies including the RF isolation link. Referring more particularly to FIGS. 30a and 30b, there are illustrated the two coils included in each of transformers 2912 or 2926. A first coil 3002 consists of a first terminal 3004 and a second terminal 3006 formed in the metal layer of a chip referred to as the "Metal 1" layer. Each of the terminals in the Metal 1 layer are connected to the transformer coil 3008 which resides on a second metal layer of a chip referred to as the "Metal 2" layer. A conductive via 3010 interconnects the coil 3008 with terminal 3004. A second connective via 3012 interconnects the coil 3008 with the second terminal 3006. A second coil resides upon a fifth metal layer referred to as the "Metal 5" layer. This coil consists of a first bonding pad 3014 and a second bonding pad 3016. Each of the first and second conductive pads 3014, 3016 are interconnected by a second coil 3018 encircling pad 3016 and interconnecting with pad 3014. Unlike the coil described in FIG. 30a, coil 3018 includes both the bonding pads 3014, 3016 and the coil 3018 on the same metal layer (Metal 5).

Figure 31:
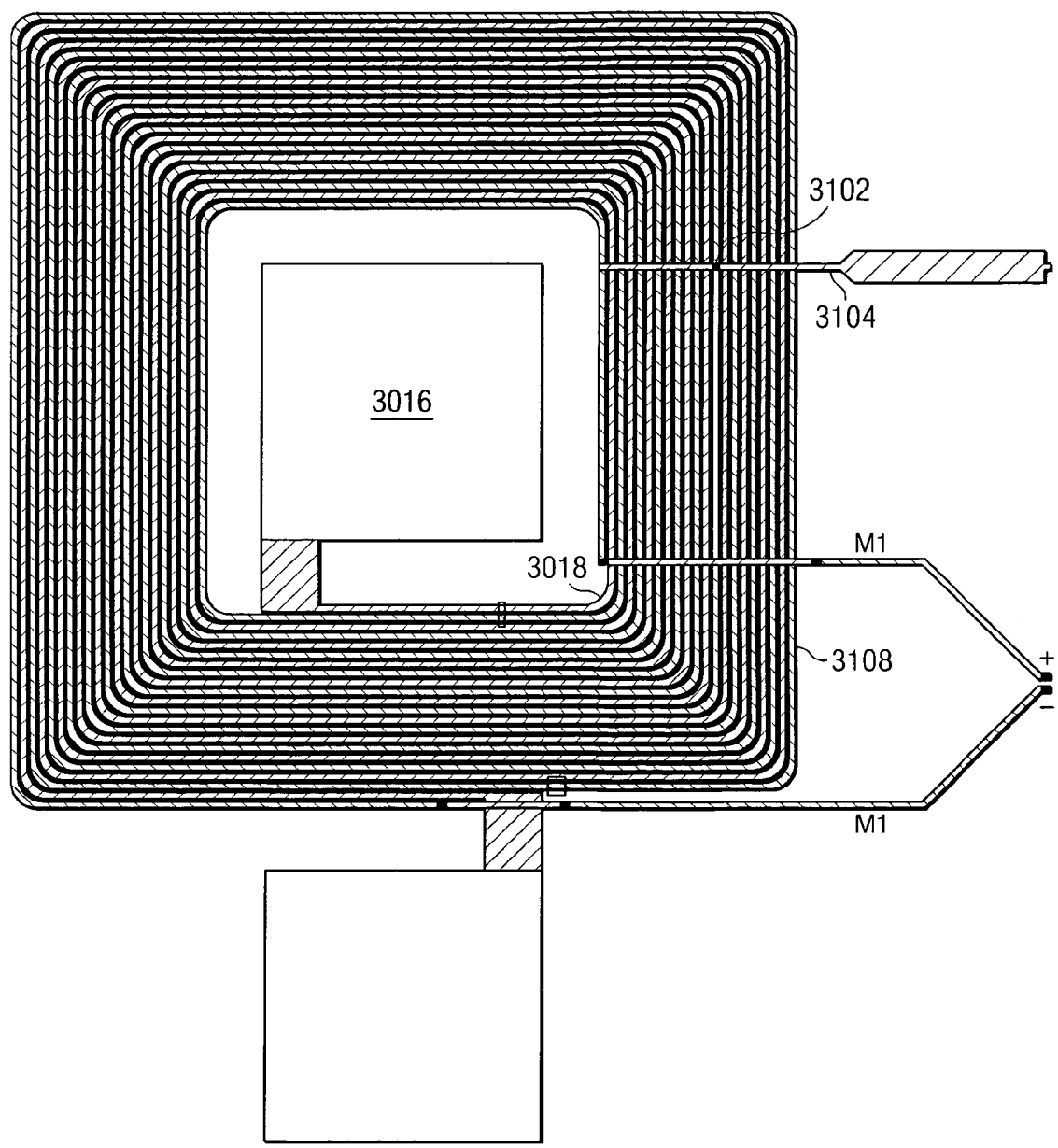
FIG. 31 illustrates the manner in which voltage may be altered to maintain optimized receiver/transmitter gain.

Typically, the Metal 5 layer is the uppermost layer. Referring now also to FIG. 31, there is illustrated the overlapping view of the first and second coils of a transformer on a chip. It can be seen that the pad 3016 is dimensioned such that it is 70 μm×70 μm. The entire coil is dimensioned to be 205 μm by 205 μm. The pad 3014 is dimensioned to the 70 μm×70 μm. The two coils 3018 and 3008 are similar in their configuration and are oriented such that they are substantially "non-overlapping." However, they could overlap. The center tap is provided on the M1 layer with a strip 3104 extending all the way across coils of the transformer and including a conductive via 3102 providing the center tap interconnecting the Metal 1 layer to the Metal 2 layer in coil 3008.

Referring now to FIG. 32, there is illustrated a side view of a chip 3200 containing a transformer structure as described with respect to FIGS. 30a, 30b and 31. The chip 3200 includes a substrate layer 3202 containing the transceiver circuitry of the RF isolation link and any electronic circuitry integrated with the RF isolation link as discussed previously. The Metal 1 layer 3204 resides upon the substrate 3202 and includes the first and second terminals 3004 and 3006 of the first transformer coil. On top of the Metal 1 layer is the Metal 2 layer 3206 containing the first coil 3008 interconnected by vias to the first and second terminals 3004 and 3006 (not shown). Finally, the Metal 5 layer resides over the Metal 2 layer 3008. The Metal 5 layer 3210 contains the other portion of the transformer, including the bond conduction pads 3016 and the bond pad 3014 (not shown) and the coil 3018 interconnecting the bond pad 3016 with the bond pad 3014. The Metal 1 layer for the transformer is utilized primarily to provide interconnects to the remaining circuits for the terminals 3004 and 3006. However, the process utilizes all five metal layers for the various interconnects. For the purposes of over voltage protection, it is desirable to separate the coil 3018 from the coil 3008 by as much distance as possible; realizing that the material disposed therebetween is silicon dioxide, a dielectric. An additional concern is the capacitor loading on the coil 3018 to ground, the substrate 3202 typically being disposed at ground. The high voltage will be present on the coil 3018 and, therefore, it is separated from both the substrate and the coil 3018 by as much distance as possible. Although the coil 3018 could have been fabricated in the Metal 1 layer, there would then have been a requirement to provide an interconnection from the ends of the coil to the circuitry. This would have required a "run" to be provided beneath the Metal 1 layer, which would required utilization of a polycrystalline layer. Even siliciding of the poly layer would not provide as good a conductive layer as that associated with a metal layer. As such, the configuration utilizes the Metal 1 layer for the interconnects and the Metal 2 layer for the coil. The center tap strip 3104 runs through the Metal 1 layer and connects to the coil 3008 in the Metal 2 layer using conductive via 3102.

Although it would be desirable to provide an even additional metal layer to further separate the coil 3018 from the coil 3008, it is not feasible to complicate a process with a special additional layer. The only reason that an additional layer would be utilized would be for the purpose of fabricating other circuitry on the integrated circuit. The reason for this is that, once a process is defined as being able to utilize multiple metal layers, substantially all circuits run through that process will use the multiple layers. It would be difficult to dedicate a process for a single integrated circuit that only used that additional metal layer and, therefore, the coil is fabricated from already existing metal layers in an existing process. However, if an additional metal layer were utilized in an existing process in the future, then it is possible that the coil 3018 would be disposed in an even higher layer than Metal 5.

Another concern in reducing common mode rejection is the ability to set the receiver gain and transmit power to a level to reliably pass through data but no higher. This conserves power in the transmitter and improves common mode rejection which is worse at higher receiver gains. Once this gain is established, it should remain constant over temperature and process changes to provide optimal system performance. This can be achieved by setting the power supply voltages ($V_{DD}$) to the transmitter and the receiver to vary with temperature and process instead of being a constant regulated voltage. This is illustrated in FIG. 33. As can be seen, for both a slow process and fast process, the voltage $V_{DD}$ increases as the temperature increases. This helps to keep the RF gain of the amplifier more constant as temperature changes and allows lower supply currents at lower temperatures.

Referring now to FIG. 34, there is illustrated a prior art method for generating the reference voltage wherein the PTAT current generator 3402 is connected to the gate of transistor 3404. The drain-source path of transistor 3404 is connected between voltage and node 3406. A resistor 3408 is connected between node 3406 and transistor 3410. The emitter/collector pathway of transistor 3410 is connected between transistor 3408 and ground. The base of transistor 3410 is connected to its collector.

FIG. 35 illustrates the modified method for generating the band gap reference voltage such that the voltage will vary with respect to temperature. The PTAT current generator 3402 again provides a voltage to the gate of transistor 3404 which provides a PTAT current. The PTAT current provided by the PTAT current generator 3402 is proportional to absolute temperature. The source-drain pathway of transistor 3404 is connected between voltage and node 3406. A p-channel transistor 3502 has its source-drain pathway connected between node 3406 and node 3504. The gate of transistor 3502 is also connected to node 3504. A resistance 3506, which is larger than the resistance of resistor 3408 in FIG. 34, is connected between node 3504 and ground. By setting the size of the PMOS transistor 3502 and the resistance 3504, the reference voltage can be set to a desired level. Since the bias current provided to the receiver is a PTAT current, this keeps the receiver gain constant.

Figure 36:
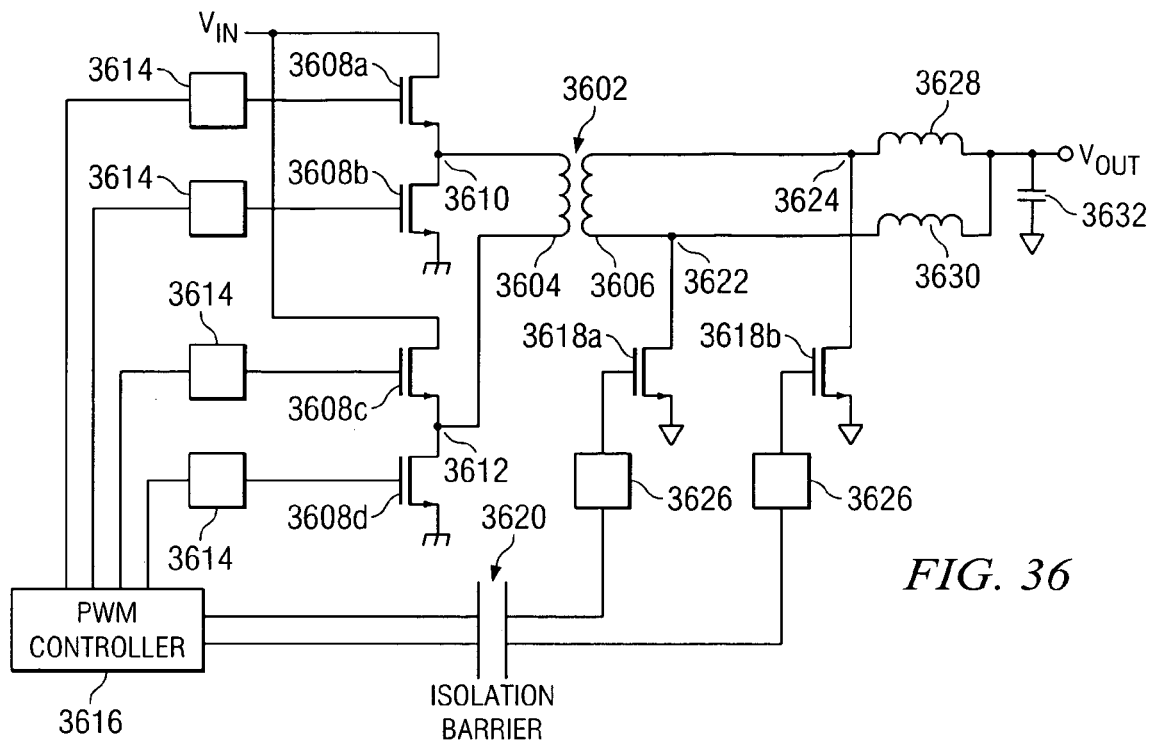
FIG. 36 illustrates a switched power supply including a PWM controller and power transistors.

Referring now to FIG. 36, in switching power supplies, there is a need for gate drivers which drive the power MOSFETs or IGBTs connected to the power transformer. Drivers on the secondary side are typically controlled by a PWM controller on the primary side, and thus, the connection to the drivers from the PWM controller requires high voltage isolation. The power transformer 3602 includes a primary side 3604 and a secondary side 3606. Connected to each end of the primary side 3604 of the power transformer 3602 is a pair of power transistors 3608. The drain/source path of transistor 3608a is connected between the input voltage ($V_{IN}$) and node 3610. The drain/source path of transistor 3608b is connected between node 3610 and ground. The drain/source path of transistor 3608c is connected between $V_{IN}$ and node 3612. The drain/source path of transistor 3608d is connected between node 3612 and ground. The gate of each transistor 3608 is connected to a driver 3614 that is connected to the PWM controller 3616.

The PWM controller 3616 provides switching signals to the power transistors 3608 which are turned on and off responsive to the switching signals provided to the drivers 3614. The PWM controller 3616 also provides switching signals to transistors 3618 on the secondary side 3606 of power transformer 3602 through the isolation barrier 3620. The drain/source path of transistor 3618a is connected between node 3622 and ground. The drain/source path of transistor 3618b is connected between node 3624 and ground. The gates of transistors 3618 are connected to drivers 3626 which receive signals from the PWM controller 3616 through the isolation barrier 3620. Each end of the secondary side 3606 of the power transformer 3602 is connected between nodes 3624 and node 3622. An inductor 3628 is connected between node 3624 and $V_{OUT}$. An inductor 3630 is connected between node 3622 and $V_{OUT}$. Finally, a capacitor 3632 is connected between $V_{OUT}$ and ground. Thus, there must be some means for voltage isolating the signals provided over the isolation barrier 3620 to the secondary side transistors 3618 from the PWM controller 3616.

Figure 37:
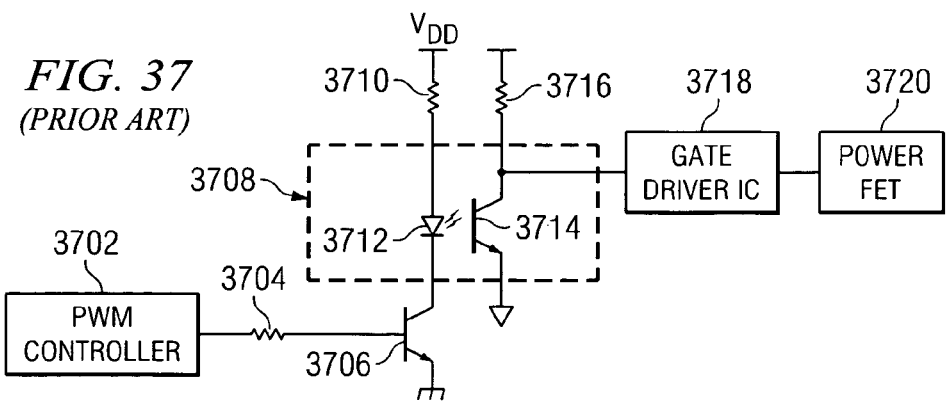
FIG. 37 illustrates a prior art method for isolating a PWM controller on a primary side from drivers on a secondary side of a switched power supply.

Currently, this problem is solved in a number of non-integrated fashions. A first common method, illustrated in FIG. 37, makes use of opto-isolators. In this solution, the PWM controller 3702 provides the control signals through a resistor 3704 to the base of a transistor 3706. The emitter/collector pathway of the transistor 3706 is connected between the optical isolator 3708 and ground. The optical isolator 3708 is connected to $V_{DD}$ through a transistor 3710. The optical isolator 3708 consists of a light emitting diode 3712 between resistor 3710 and the emitter of transistor 3706 and a light detecting transistor 3714. The emitter of transistor 3714 is connected to $V_{DD}$ through a resistor 3716. The collector of transistor 3714 is connected to ground. The emitter of transistor 3714 is also connected to the gate driver integrated circuit 3718 which provides a signal to the power FET 3720.

Figure 38:
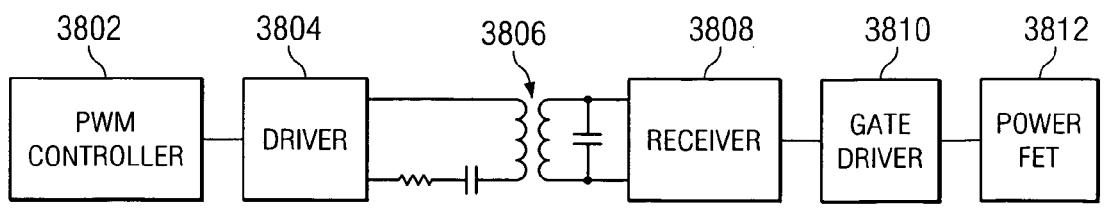
FIG. 38 illustrates a second prior art method for isolating a PWM controller on a primary side from a driver circuit on a secondary side of a switched power supply.

An alternative prior art solution uses a pulse transformer as illustrated in FIG. 38. The PWM controller 3802 provides control signals to a driver 3804. The driver 3804 provides pulses which are transmitted electromagnetically through a transformer 3806. The pulses are received at a receiver 3808 and used to operate a gate driver 3810.

Figure 39:
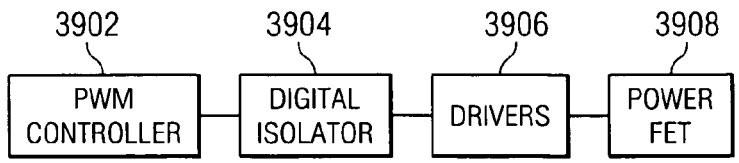
FIG. 39 illustrates a final prior art embodiment for isolating a PWM controller on a primary side from a driver on a secondary side of a switched power supply.

A third prior art alternative, illustrated in FIG. 39, uses an integrated digital isolator 3904 with a separate gate driver IC. In this case the PWM controller 3902 connects to the digital isolator 3904 which connects to the driver IC 3906. The digital isolator 3904 and the gate driver IC 3906 provide isolation between the PWM controller 3902 and the power FET 3908 connected to the driver IC 3906. This method is currently the fastest system and is smaller than other implementations. However, this implementation is expensive due to the high cost of the digital isolator 3904.

Figure 40:
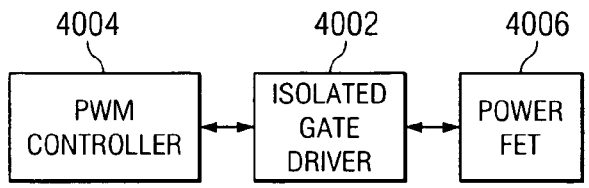
FIG. 40 illustrates a block diagram of an isolated gate driver for voltage isolating a PWM controller from power transistor circuitry.

Referring now to FIG. 40, there is illustrated the implementation of an embodiment wherein an isolated gate driver 4002 is used to voltage isolate the PWM controller 4004 from the power FET circuitry 4006. The isolated gate driver 4002 combines a digital isolator with a gate driver into a fast, integrated, low cost isolated gate driver. This provides a few substantial benefits to the isolation circuitry. First, the cost is substantially less since only a single IC is necessary to provide isolation rather than the two chips discussed in FIG. 39. Furthermore, the single isolated gate driver IC will have a lower delay than the implementation discussed in FIG. 39 since the digital isolator 3904 of FIG. 39 uses a substantial part of its delay in driving signals off of the digital isolator chip 3904. This requirement is eliminated in the integrated solution wherein the isolator and gate driver are on the same chip.

Figure 41:
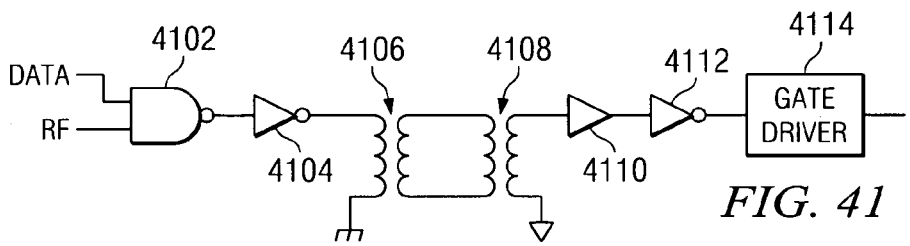
FIG. 41 is a general schematic diagram of the isolated gate driver.

The general structure of the integrated isolator and gate driver of the present disclosure is illustrated in FIG. 41. This structure includes the isolation structures described herein above and further including a gate driver with said isolation structure. The isolated gate driver includes a NAND gate 4102. The NAND gate 4102 is connected to receive the data to be transmitted through the isolation link. In this case, the data comprises the control signals from the PWM controller. The NAND gate 4102 is additionally connected to receive an RF signal. The RF output of the NAND gate 4102 is connected to the input of an inverter 4104. The output of the inverter 4104 is connected to a first transformer 4106. The transformer 4106 electromagnetically couples the provided PWM controller signals to a second transformer 4108. The output of the second transformer 4108 is connected to a receiver and detector circuit 4110 which may be configured in any of the manners discussed herein above. The output of the receiver and detector circuit 4110 is provided to the input of an inverter amplifier 4112 which is connected to the gate driver 4114 that drives a connected power transistor.

Figure 42:
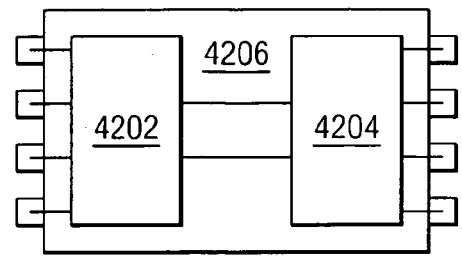
FIG. 42 illustrates a circuit package including two separate dies for implementing the isolated gate driver.

Referring now to FIG. 42, there are illustrated the two separate dies 4202 and 4204 integrated upon a single package 4206 providing the integrated digital isolator and gate driver. In previous embodiments of the digital isolator, die one 4202 and die two 4204 are implemented in 0.25 μm CMOS technology. The 0.25 μm CMOS technology is needed to process the 2.1 GHz RF carrier signal provided at the NAND gate 4102 of FIG. 41. However, power MOSFET gate driver ICs typically have to drive between 10 V and 20 V. High voltage transistors capable of supporting these voltage ranges are not available in the 0.25 μm CMOS process. Thus, an 18 V CMOS process with high voltage NMOS and PMOS transistors that provides 0.35 μm, 3.3 V CMOS logic transistors must be used in implementing the circuitry within dies 4202 and 4208. With this process, it is possible to integrate the 10-20 V gate driver using the high voltage transistors operating at an 18 V range, and the RF receiver using the 0.35 μm logic transistors operating at a 3.3 V range.

Figure 43:
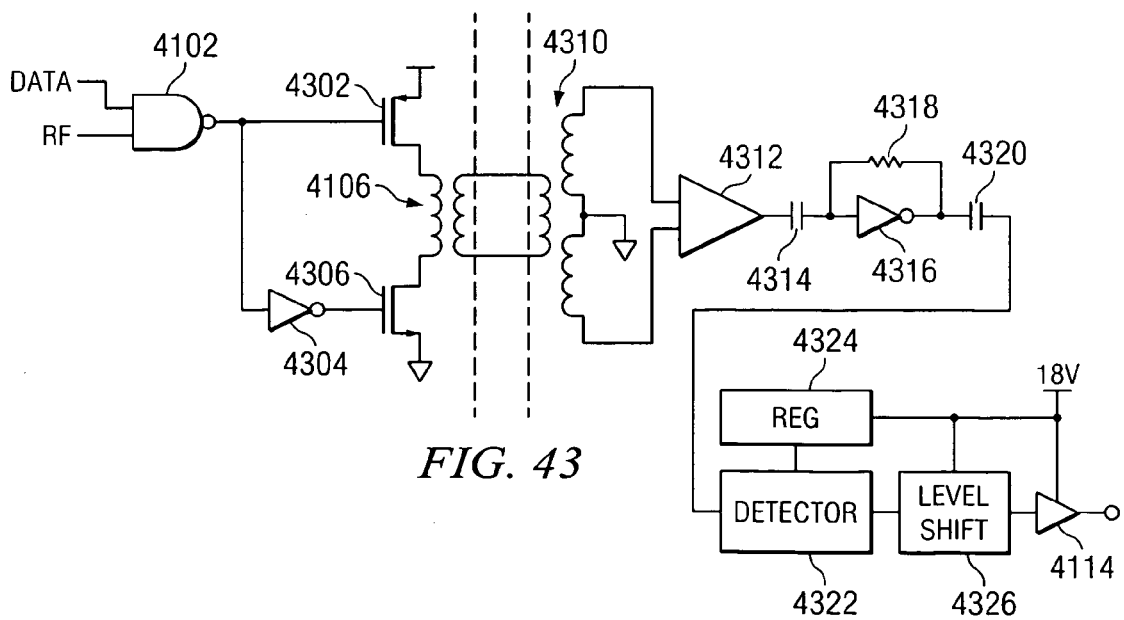
FIG. 43 is a detailed schematic diagram of the circuitry for implementing the isolated gate driver.

Referring now to FIG. 43, there is provided a more detailed illustration of the circuitry for implementing the isolated gate driver IC. As described previously, the NAND gate 4302 is connected to receive the data stream from the PWM controller and the RF carrier signal. The output of the NAND gate 4302 is connected to the gate of transistor 4302 and the input of an inverter 4304. The output of inverter 4304 is connected to gate of transistor 4306. The drain/source path of the transistor 4306 is connected between transformer 4306 and ground. The source/drain path of transistor 4302 is connected between 3.3 V and transformer 4306.

The transformer 4310 of the isolation link is a center tap transformer. The outputs of the transformer 4310 are connected to separate inputs of a differential amplifier circuit 4312. The output of the differential amplifier circuit 4312 is connected to a capacitor 4314. The other side of the capacitor 4314 is connected to a parallel connection of an inverter 4316 and a resistor 4318. The other side of the parallel connection of the inverter 4316 and resistor 4318 is connected to another capacitor 4320. The capacitor 4320 is also connected to a detector circuit 4322 which detects the PWM control signal provided by the PWM controller over the isolation link. A regulator 4324 is connected between the 18 V power source and the detector 4322. The circuitry between the comparator circuit 4312 up to and including the detector circuit 4322 operate on a 3.3 V supply. The remaining circuitry operates using an 18 V power supply and includes the level shift circuitry 4326 having an input connected to the output of the detector circuit 4322 and an output connected to the driver 4314. The level shift circuit 4326 increases the voltage level of the detected PWM control signal to a voltage level able to operate the driver 3914. The output of the driver 3914 would then be connected to the power FET transistors.

Figure 44:
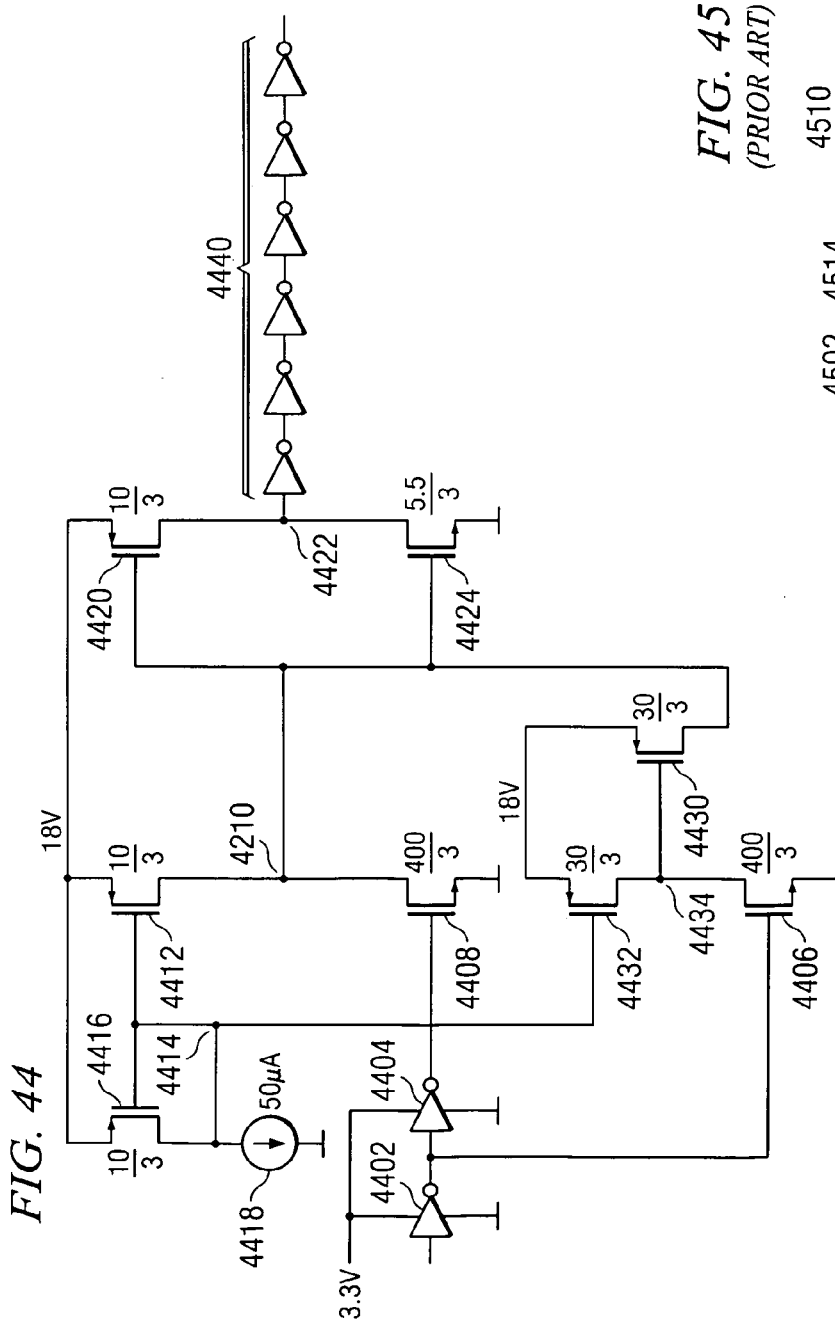
FIG. 44 is a schematic diagram of the level shifter of FIG. 41.

Referring now to FIG. 44, there is illustrated a more detailed description of the level shifter circuit 4326. The input to the level shifter 4326 provided from the detector 4322 is connected to a first inverter 4402. The output of inverter 4402 is connected to the input of a second inverter 4404 and the gate of a transistor 4406. The output of inverter 4404 connects to the gate of transistor 4408. The source/drain path of transistor 4408 is connected between node 4410 and ground. A transistor 4412 has its source/drain path connected between 18 V system power and node 4410. The gate of transistor 4412 is connected to node 4414. Also having its gate connected to node 4414 is a transistor 4416. The source/drain path of transistor 4416 is connected between 18 V system power and node 4414. A 50 μA current source 4418 is connected between node 4414 and ground. A transistor 4420 has its source/drain path connected between 18 V system power and node 4422. The gate of transistor 4420 is connected to node 4410. Transistor 4424 has its source/drain path connected between node 4422 and ground. The gate of transistor 4424 is connected to node 4410. A transistor 4430 has its source/drain path connected between 18 V system power and node 4410. The gate of transistor 4430 is connected to the drain of transistor 4432 at node 4434. The source/drain path of transistor 4432 is connected between 18 V system power and node 4434. The gate of transistor 4432 is connected to node 4414. Transistor 4406 has its source/drain path connected between node 4434 and ground. A series connection of inverters 4440 has an input connected to node 4422 and the output thereof would be connected to the driver 3914.

Referring now to back to FIG. 40, in addition to providing PWM control signals to the drivers on the opposite side of the isolation barrier 4020, voltage sensing signals indicating the output voltage $V_{out}$ must be provided from $V_{out}$ back to the PWM controller 4016 over the isolation barrier 4020. Since the output voltage is located on the secondary side and the PWM controller 401b is located on the primary side, high voltage isolation is again required. The output voltage must be accurately measured (typically with less than a 1% error) and sent as a feedback signal across the isolation barrier 4020.

Figure 45:
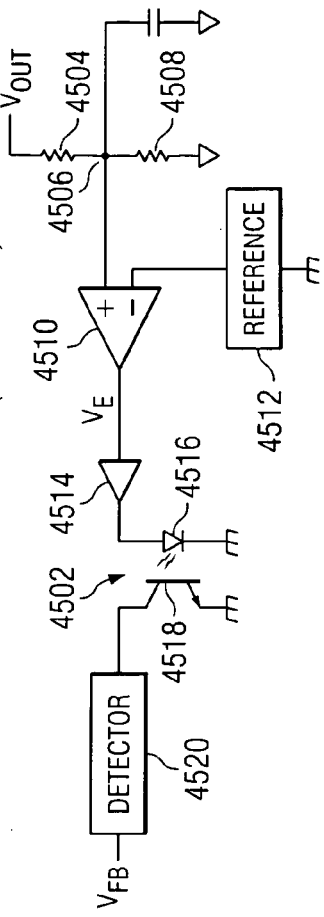
FIG. 45 illustrates a prior art method for isolating a voltage sensing circuit from a PWM controller.

The most common prior art method of isolating the feedback signal provided to the PWM controller 4016 is illustrated in FIG. 45. This method employs an opto-isolator 4502. A voltage divider circuit consisting of resistor 4504 connected to $V_{out}$ and node 4506 and a second resistor 4508 connected between node 4506 and ground is connected to a first input of an op-amp 4510. A second input of the op-amp 4510 is connected to a reference voltage generator 4512 that generates a voltage $V_{REF}$. The op-amp 4510, based upon the comparison, generates an error voltage $V_E$ which is applied to the input of a driver 4514. The output of the driver 4514 is connected to the optical isolator 4502 consisting of a light emitting diode 4516 and a light detecting transistor 4518. The output of the optical isolator 4502 is connected to a detector circuit 4520 that provides the feedback voltage $V_{FB}$ to the PWM controller 4016. The problem with the implementation illustrated in FIG. 45 is that the analog optical isolator 4502 is generally slow (i.e., delay times of one to ten microseconds) and temperature variations will affect the error signal $V_E$.

Figure 46:
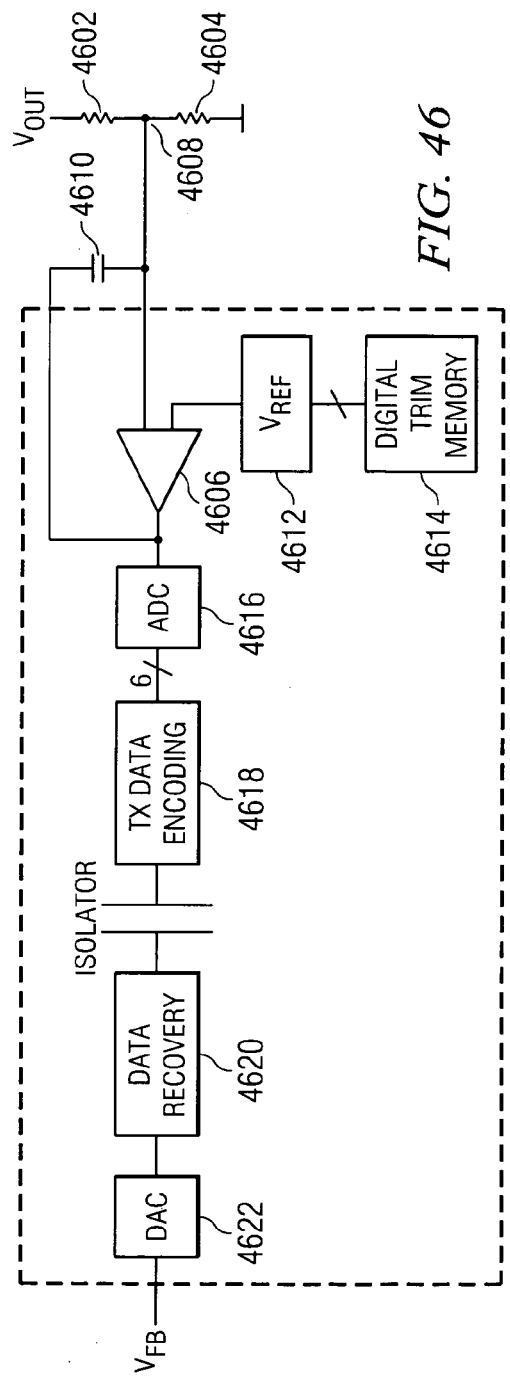
FIG. 46 is a schematic block diagram of a method for isolating voltage sensing between an output voltage on a secondary side and a PWM controller on a primary side.

Referring now to FIG. 46, there is illustrated an alternative embodiment of a means for isolated voltage sensing. In this solution, the voltage sensing process is voltage isolated by an integrated IC package including two die. The RF digital isolator is used to transfer the data across the isolation barrier. A voltage divider consisting of resistors 4602 and 4604 enable the output voltage to be measured and provided to a first input of an operational amplifier 4606. The first resistor 4602 is connected between $V_{OUT}$ and node 4608. The second resistor 4604 is connected between node 4608 and ground. A capacitor 4610 is connected between node

4608 and the output of operational amplifier 4606. A second input of the operational amplifier 4606 is connected to a reference voltage generator 4612.

The reference voltage generator 4612 is programmed via a digital trim memory. The reference voltage will need to be trimmed to meet the 0.5% accuracy that is necessary for measuring the output voltage. This can be performed at IC test by using a one time programmable (OTP) non-volatile memory. This in a preferred embodiment may be a 32 bit memory available from TSMC. The output of the operational amplifier 4606 provides a voltage error signal $V_E$ which is applied to the input of an A/D converter 4616. The voltage error signal $V_E$ is used as the voltage feedback signal on the primary side. The output of the A/D converter 4616 is provided as a 6-bit digital output to a transmitter/data encoding circuit 4618 wherein the voltage error signal is encoded and transmitted. The output of the transmit/data encoding circuit 4618 is a single bit serial output which is output over the RF isolation link described herein above.

A data recovery circuit 4620 receives the data from the RF isolation link and recovers the voltage error signal as described herein above. The signal is provided to a digital to analog converter 4622. The output of the digital to analog converter 4622 provides the voltage error signal as the voltage feedback signal $V_{FB}$ that is used by the PWM controller as an indication of the output voltage $V_{out}$ on the secondary side. The speed and resolution of the analog to digital converter 4616 and digital to analog converter 4622 is a function of the loop band width and the output error requirements. A 10 MHz 6-bit ADC is adequate for up to 1.5 MHz PWM frequencies. However, ADC's having a lower speed may be used since most loop band widths are much lower.

Figure 47:
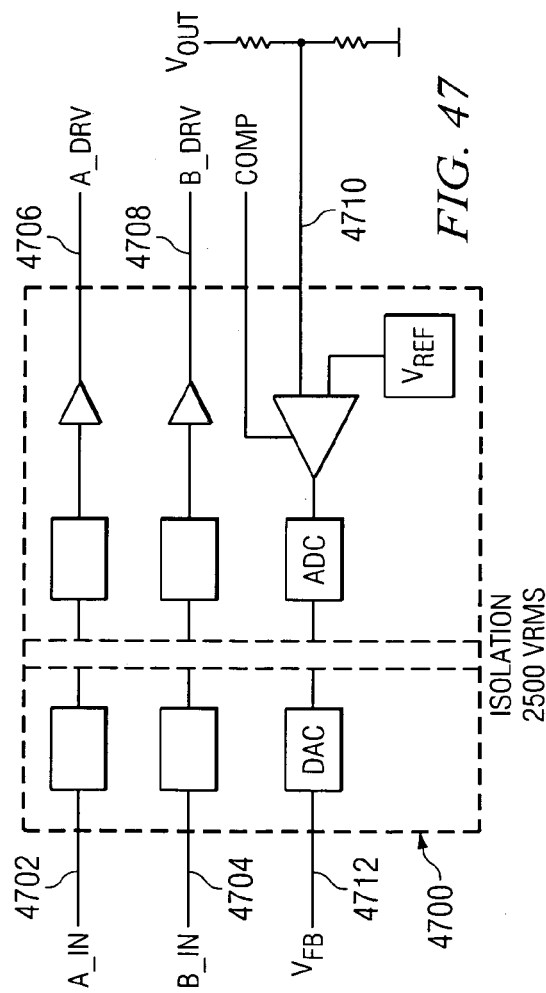
FIG. 47 illustrates an integrated chip including circuitry for voltage isolating gate drivers from PWM controllers on primary and secondary sides of a switched power supply and for voltage isolating the voltage sensing function on a secondary side from a PWM controller on a primary side of a switched power supply.

Referring now to FIG. 47, there is illustrated an integrated chip including two isolated gate drivers and an isolated voltage sensing function. This part would integrate many components in a switching power supply and provide isolation for these functions between the primary side and the secondary side. Signal A_IN and signal B_IN are provided to inputs 4702 and 4704 and are provided at output pins 4706 and 4708 as signals A_DRV and B_DRV. This single integrated chip would receive PWM controller signals at input pins 4702 and 4704 and provide output signals for driving power transistors associated with the switched power supply on the secondary side. The inputs and outputs are voltage isolated from each other according to the system described herein above. Additionally, sensing of the output voltage may be obtained between voltage input pin 4710, connected to $V_{OUT}$, and voltage feedback pin $V_{FB}$ 4712, connected to the PWM controller. The isolation of the voltage sensing function between the primary side and secondary side is performed in the same manner as described herein above. Thus, the integrated device 4700 described with respect to FIG. 47 would provide isolation for drivers on the primary or secondary side of a switched power supply from the PWM controller and provide isolated voltage sensing from the secondary or the primary side from the PWM controller.

Figure 48A:
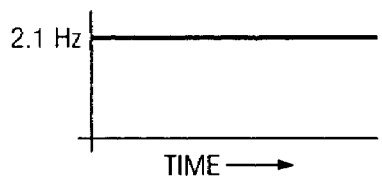
FIG. 48a illustrates the use of a single RF frequency for use with the RF isolator.
Figure 48B:
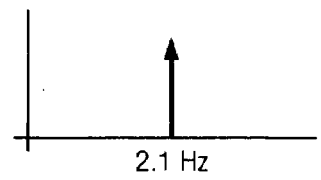
FIG. 48b illustrates the radiated emissions for an RF isolator using a single RF frequency.

One issue with an RF isolator, such as that described herein above, is the radiated emissions caused by use of the RF carrier for transmitting data. The FCC specifies that the radiated emissions from a device must be less than 500 μV per meter at 3 meters. The use of a balanced driver circuit can help reduce the level of emissions. However, without shielding and when using a half-wave dipole antenna PCB layout (worst case), the emissions from the RF isolator will be approximately 500 μV per meter per channel. Thus, a four channel RF isolator could have emissions as high as 2 mV per meter which would violate the specifications of the FCC in the worst case scenario. This situation is illustrated in FIGS. 48a and 48b wherein when a single RF frequency at 2.1 GHz is used to transmit the data over the RF isolator. The single frequency use causes a 2.1 GHz emission peak to appear in the spectrum emissions for the RF isolator.

Figure 49A:
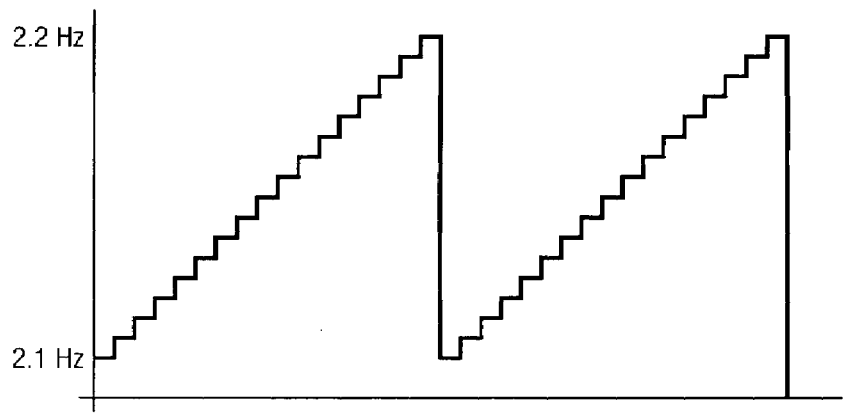
FIG. 49a illustrates the use of a stepped frequency that steps between a first and second frequency.
Figure 49B:
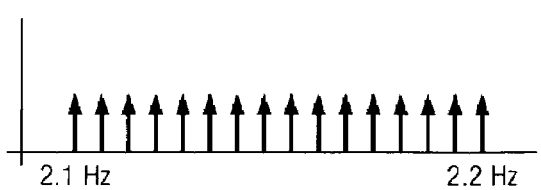
FIG. 49b illustrates the radiated emissions of the stepped frequency RF isolator.

One method for greatly minimizing radiated emissions is to use an RF carrier that changes frequency over time. Thus, rather than transmitting using a single carrier wave at 2.1 GHz, the circuitry used to generate the RF carrier signal is modified such that the oscillator constantly sweeps between, for example, 2.1 GHz and 2.2 GHz. This is more fully illustrated in FIGS. 49a and 49b. FIG. 49a illustrates how the RF carrier signal sweeps between 2.1 GHz and 2.2 GHz in sixteen steps. Thus, at any particular time, rather than only a single frequency being utilized as the RF carrier, any of the sixteen frequencies may be provided for transmitting the data over the RF isolation link. In this manner, rather than the emission spectrum having a single spike at 2.1 GHz, as illustrated in FIG. 48b, an emission spectra such as that illustrated in FIG. 49b is provided, wherein sixteen separate peaks are provided between 2.1 GHz and 2.2 GHz. The average peaks at any one frequency are significantly smaller than that of the emission spectra wherein only a single RF frequency is used.

Either an analog or a digital sweep may be used. The preferred embodiment uses a digital sweep since it is easier to implement. By using sixteen steps between 2.1 GHz and 2.2 GHz, the emission level of the isolator is reduced by a level of sixteen. Since the FCC looks at a 1 MHz band, the steps from the 2.1 GHz frequency to the 2.2 GHz frequency should be set greater than this. While the present disclosure has described having a sweep between 2.1 GHz and 2.2 GHz, it should of course be realized that the sweep may be between any two frequencies. The number of steps may also be set higher to give further emissions reduction from the isolator.

Figure 50:
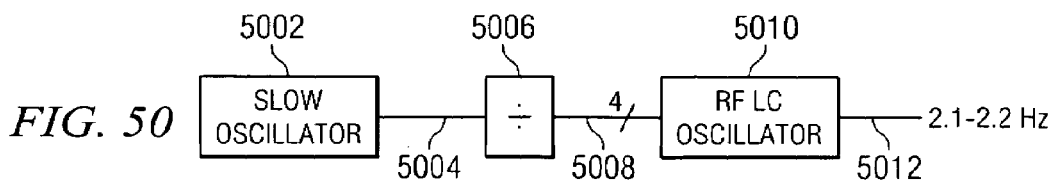
FIG. 50 illustrates a block diagram of a first embodiment of a circuit for generating a stepped RF carrier signal.

Referring now to FIG. 50, there is illustrated a block diagram of the circuit for providing the stepped RF carrier signal between 2.1 and 2.2 GHz. A slow ring oscillator 5002 generates a 50-60 MHz oscillating signal that is provided via line 5004 to a divider circuit 5006. The divider circuit 5006 utilizes the 50-60 MHz signal provided by the slow oscillator 5002 to generate a four-bit control code that is used to drive the RF oscillator circuit 5010. The control code generated by the divider circuit 5006 is provided over a four line bus 5008 to the RF oscillator circuit 5010. The control code generated by the divider circuit 5006 may include more than four bits, however, only four bits are provided to the RF isolator 5020 over the four line bus 5008. The RF isolator circuit utilizes the four bit code to generate the sweep signal between the first and second frequency levels and provides the output sweep signal from an output 5012. Each of the 16 four-bit codes causes the generation of a different frequency between and including the first and second frequency levels. Using the circuit of FIG. 50, the RF carrier frequency will change at a 400-500 KHz rate over sixteen frequencies that are 2-4 MHz apart and repeat at a 50-63 KHz rate.

Figure 52:
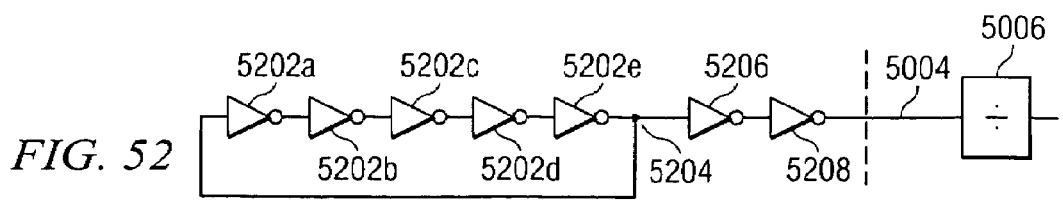
FIG. 52 illustrates a schematic diagram of the slow oscillator circuit of FIG. 50.

The circuit of FIG. 50 uses a free running slow (60-70 MHz) ring oscillator 5002 to charge the RF carrier. This uses a very low current of approximately 50μ Amps. The slow ring oscillator 5002 is illustrated in FIG. 52. The ring oscillator 5002 consists of a plurality of inverters 5202 that are in series connection with each other. A series of five inverters 5202 are interconnected with each other and has a feedback loop connected from node 5204 to the input of inverter 5202a. Inverter 5206 has its input connected to node 5204 and its output connected to inverter 5208. The output of inverter 5208 comprises the output of the ring oscillator 5002 which is provided to the divider circuit 5006. The Vdd for the slow oscillator 5002 is derived from the reference voltage which has a large PTAT component. This keeps the oscillation frequency fairly stable over the process and temperatures.

Referring now to FIG. 51, there is more fully illustrated the RF oscillator circuit 5010. The inputs of the RF oscillator circuit 5010 are connected to receive the four bit codes from the divide circuit 5006 of FIG. 50. The four bit codes are provided to the gates of a first group of transistors 5102 and a second group of transistors 5103 to turn the transistors on and off. Each of the four transistors in group 5102 has its source/drain path connected between a capacitor 5104 and ground. At the other end, each of the capacitors 5104 are connected to a node 5106. Each of the transistors 5103 has its source/drain path connected between a capacitor 5108 and ground. The other side of each of the capacitors 5108 is connected to node 5110. An additional capacitor 5112 is connected between node 5106 and ground. A capacitor 5114 is also connected between node 5110 and ground.

Connected between nodes 5106 and 5110 is an inductor 5116. A transistor 5118 is connected to the inductor 5116 at node 5110 and has its source/drain path connected between node 5110 and ground. The gate of transistor 5118 is connected to the opposite end of the inductor 5116 at node 5106. Another transistor 5120 is connected to the inductor 5116 at node 5106. The transistor 5120 has its source/drain path connected between node 5106 and ground. The gate of transistor 5120 is connected to the opposite end of inductor 5116 at node 5110. Another transistor 5122 has its source/drain path connected between Vdd and node 5106. The gate of transistor 5122 is connected to node 5120. A final transistor 5124 has its source/drain path connected between Vdd and node 5110. The gate of transistor 5124 is connected to node 5106. An inverter 5126 is connected between node 5106 and the output node 5012 of the RF oscillator 5010. Responsive to the control codes applied to the first and second groups of transistors 5102 and 5103, the RF oscillator 5010 will generate a stepped RF carrier signal at its output 5012 between the first and second selected frequencies based upon values of the inductors and capacitors used within the circuit.

Figure 53:
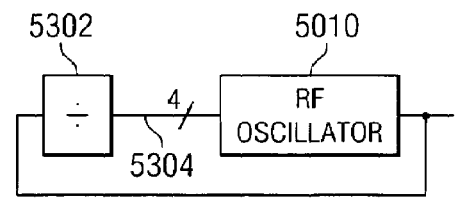
FIG. 53 illustrates a block diagram of a second embodiment of a circuit for generating a stepped RF carrier signal.

Referring now to FIG. 53, there is illustrated an alternative embodiment for the RF carrier generation circuitry wherein the RF oscillator 5010 has its output connected to the input of a divider circuit 5302. The divider circuit 5302 generates a four bit code which is provided back to the RF oscillator via a four bit bus 5304. The circuit described in FIG. 53 has the advantage that it is synchronous. The rate of RF frequency change is locked to the RF carrier. However, the circuit includes a 2 GHz divider circuit that requires approximately 1 milliamp of Vdd current.

The schematic diagram for this circuit is illustrated in FIG. 54. The schematic diagram of FIG. 54 is similar to that described with respect to FIG. 51 and like components are numbered in a similar fashion. The four bit codes are provided to the gates of a first group of transistors 5102 and a second group of transistors 5103 to turn the transistors on and off. Each of the four transistors in group 5102 has its source/drain path connected between a capacitor 5104 and ground. At the other end, each of the capacitors 5104 are connected to a node 5106. Each of the transistors 5103 has its source/drain path connected between a capacitor 5108 and ground. The other side of each of the capacitors 5108 is connected to node 5110. An additional capacitor 5112 is connected between node 5106 and ground. A capacitor 5114 is also connected between node 5110 and ground.

Connected between nodes 5106 and 5110 is an inductor 5116. A transistor 5118 is connected to the inductor 5116 at node 5110 and has its source/drain path connected between node 5110 and ground. The gate of transistor 5118 is connected to the opposite end of the inductor 5116 at node 5106. Another transistor 5120 is connected to the inductor 5116 at node 5106. The transistor 5120 has its source/drain path connected between node 5106 and ground. The gate of transistor 5120 is connected to the opposite end of inductor 5116 at node 5110. Another transistor 5122 has its source/drain path connected between Vdd and node 5106. The gate of transistor 5122 is connected to node 5120. A final transistor 5124 has its source/drain path connected between Vdd and node 5110. The gate of transistor 5124 is connected to node 5106. An inverter 5126 is connected between node 5106 and the output node 5012 of the RF oscillator 5010. Responsive to the control codes applied to the first and second groups of transistors 5102 and 5103, the RF oscillator 5010 will generate a stepped RF carrier signal at its output 5012 between the first and second selected frequencies based upon values of the inductors and capacitors used within the circuit. This circuit additionally includes an inverter 5402 having its input connected to node 5110. The output of the inverter 5402 is connected to a divider circuit 5302 which provides the four bit output to each of the transistor groupings 5102 and 5103.

Figure 55:
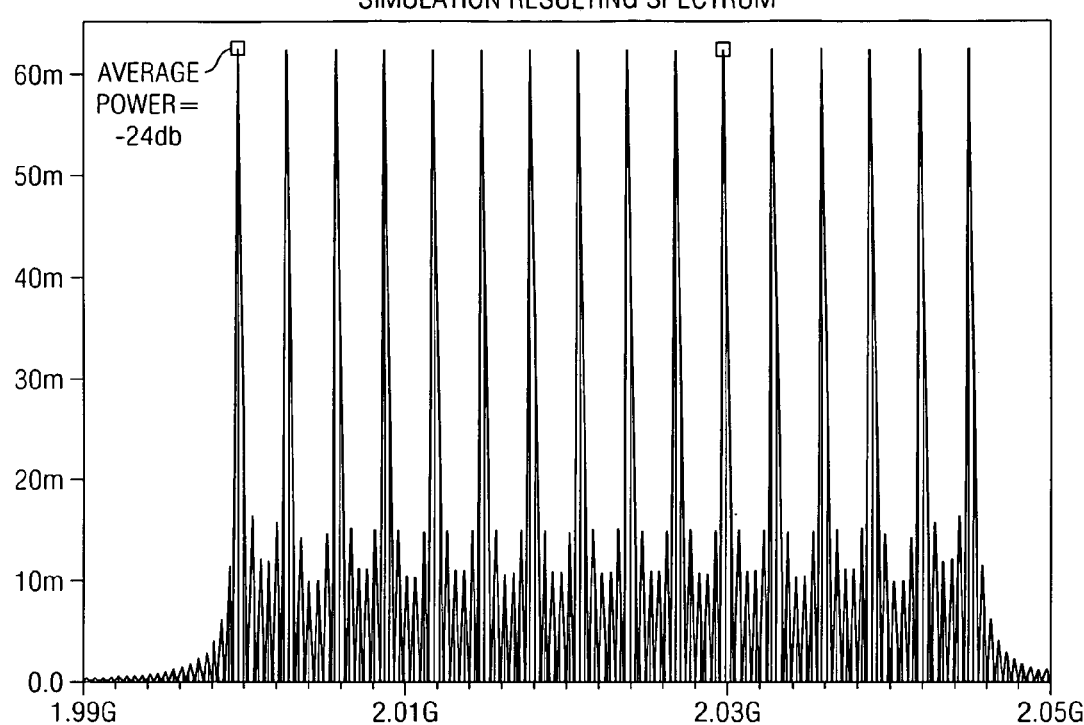
FIG. 55 illustrates the modeled results for the circuit of FIG. 50.

Referring now to FIG. 55, there is illustrated a simulation of the resulting spectrum for an RF isolation link using a stepped frequency for the RF carrier signal as described herein above. As can be seen, there are generated sixteen separate peaks within the spectrum with an average power of approximately −24 dB for each peak. This illustrates the manner in which the emissions may be spread over sixteen separate frequencies rather than being concentrated on a single frequency when a single RF carrier signal is utilized.

Figure 56:
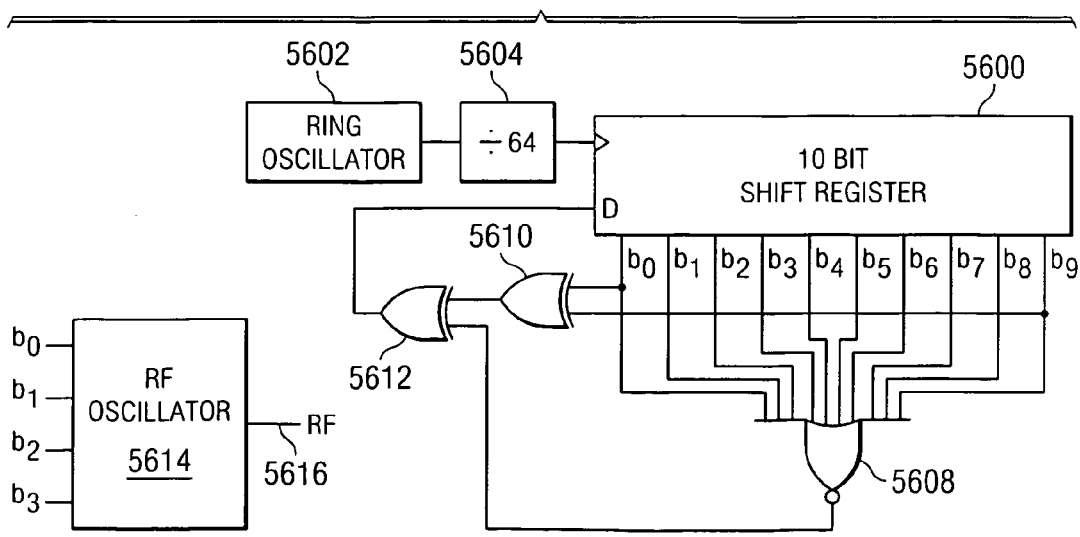
FIG. 56 illustrates an alternative embodiment for creating a random code which is used for generating the stepped RF carrier signal.

The circuits described in FIGS. 50 and 53 for generating the frequency variation of the RF oscillator have the side effect of causing a tone within the emission spectrum if the isolator is used in an analog control loop such as switch controls in a switching power supply. Referring now to FIG. 56, there is illustrated an embodiment for using a random number generator to control generation of the code for providing the RF frequency. A 50-60 MHz ring oscillator 5602 provides an oscillation signal to a divide by 64 circuit 5604. The output of the divider circuit 5604 is provided as the clock input to a 10-bit linear shift register 5606. The linear shift register circuit 5606 may comprise the well known Debruijn counter circuit that prevents the register from becoming stuck in an all zero condition. The outputs of the 10-bit shift register 5606 are provided as input to a NOR gate 5608. The $b_0$ bit and the $b_9$ bit output from the 10-bit shift register 5606 are provided as input to an exclusive OR gate 5610. The output of the exclusive OR gate 5610 and the output of the NOR gate 5608 are provided as inputs to an exclusive OR gate 5612. The output of the exclusive OR gate 5612 is provided as the data input to the 10-bit shift register 5606. The RF oscillator circuit described with respect to FIG. 51, has its inputs connected to the $b_0$, $b_1$, $b_2$ and $b_3$ outputs of the 10-bit shift register 5606. The RF oscillator circuit generates the stepped RF carrier signal in response to this 4-bit code input and generates an output RF carrier signal at output 5616.

Although the preferred embodiment has been described in detail, it should be understood that various changes, substitutions and alterations can be made therein without departing from the scope of the invention as defined by the appended claims.

What is claimed is:

1. A circuit package, comprising:
a first die containing functional circuitry;
a second die containing functional circuitry; and
at least one RF isolation link interconnecting the first die and the second die, the RF isolation link providing voltage isolation between the first die and the second die, wherein the RF isolation link further provides digital data between the first die and the second die using an RF carrier signal which is transmitted therebetween when the digital data is at a first logic level and not transmitted when the digital data is at other than the first logic level, the RF carrier signal when the digital data is at the first logic level oscillating at a first frequency responsive to an input control signal at a first generated value and oscillating a second frequency responsive to the input control signal at a second generated value.

2. The system of claim 1, wherein the RF isolation link further comprises:
a first transformer on the first die;
a second transformer on the second die;
a transmitter associated with the first transformer for transmitting the RF carrier onto the RF isolation link;
a receiver associated with the second transformer for receiving the RF carrier on the RF isolation link; and
circuitry for generating the RF carrier signal oscillating at either the first or second frequencies.

3. The system of claim 2, wherein the circuitry for generating the RF carrier signal further comprises:
a slow ring oscillator;
a divider circuit connected to the slow ring oscillator for generating a control code that represents the input control signal and at least the first or second generated values; and
an LC oscillator circuit responsive to the control code from the divider circuit for generating the RF carrier signal, wherein the control code causes the generation of one of a plurality of frequencies, at least two of which comprise the first and second frequencies.

4. The system of claim 2, wherein the circuitry for generating the RF carrier signal further comprises:
an LC oscillator circuit for generating the RF carrier signal responsive to a control code that represents the input control signal and at least the first or second generated values, wherein the control code causes the generation of one of a plurality of frequencies, at least two of which comprise the first and second frequencies; and
a divider circuit connected in a feedback loop with the LC oscillator for generating the control code.

5. The system of claim 2, wherein the circuitry for generating the RF carrier signal further comprises:
a slow ring oscillator;
a circuit for randomly generating a control code responsive to an input from the slow ring oscillator that represents the input control signal and at least the first or second generated values; and
an LC oscillator circuit responsive to the randomly generated control code for generating the RF carrier signal, wherein the randomly generated control code causes the generation of one of a plurality of frequencies, at least two of which comprise the first and second frequencies.

6. The system of claim 5, wherein the circuit further comprises:
a divider circuit for providing a clock signal;
a shift register for providing a plurality of output bits responsive to the clock signal and a data signal;
logic circuitry for generating the data signal responsive to a first portion of the plurality of output bits; and
wherein the randomly generated control code comprises a second portion of the plurality of output bits.

7. The system of claim 6, wherein the shift register farther comprises a de Bruijn counter.

8. The system of claim 1, wherein the dies are located on separate chips.

9. A circuit package, comprising:
a first die containing first functional circuitry;
a second die containing second functional circuitry;
a first transformer on the first die connected to the first functional circuitry;
a second transformer on the second die connected to the second functional circuitry;
a transmitter associated with the first transformer for transmitting a stepped RF carrier signal onto an RF isolation link between the first die and the second die;
a receiver associated with the second transformer for receiving the stepped RF carrier signal over the RF isolation link; and
circuitry associated with the first unit for generating the stepped RF carrier signal for transmission responsive to an input data signal at a first logical level wherein the stepped RF carrier signal sweeps between a first frequency and a second frequency and the generated RF carrier signal not transmitted responsive to the input data signal at a second logical level.

10. The system of claim 9, wherein the circuitry for generating the stepped RF carrier signal farther comprises:
a slow ring oscillator;
a divider circuit connected to the slow ring oscillator for generating a control code; and
an LC oscillator circuit responsive to the control code from the divider circuit for generating the stepped RF carrier signal, wherein the control code causes the generation of one of a plurality of frequencies from the first frequency to the second frequency.

11. The system of claim 9, wherein the circuitry for generating the stepped RF carrier signal further comprises:
a slow ring oscillator;
a circuit for randomly generating a control code responsive to an input from the slow ring oscillator; and
an LC oscillator circuit responsive to the randomly generated control code for generating the stepped RF carrier signal, wherein the randomly generated control code causes the generation of one of a plurality of frequencies from the first frequency to the second frequency.

12. The system of claim 11, wherein the circuit further comprises:
a divider circuit for providing a clock signal;
a shift register for providing a plurality of output bits responsive to the clock signal and a data signal;
logic circuitry for generating the data signal responsive to a first portion of the plurality of output bits; and
wherein the randomly generated control code comprises a second portion of the plurality of output bits.

13. The system of claim 12, wherein the shift register further comprises a de Bruijn counter.

14. The system of claim 9, wherein the dies are located on separate chips.

15. A circuit package, comprising:
- a first unit containing functional circuitry;
- a second unit containing functional circuitry;
- a first transformer on the first unit;
- a second transformer on the second unit;
- a transmitter associated with the first transformer for transmitting a stepped RF carrier onto an isolation link between the first unit and the second unit;
- a receiver associated with the second transformer for receiving the stepped RF carrier over the isolation link;
- a slow ring oscillator;
- a divider circuit for providing a clock signal;
- a shift register for providing a plurality of output bits responsive to the clock signal and a data signal a first portion of the plurality comprising a randomly generated control code;
- logic circuitry for generating the data signal responsive to a second portion of the plurality of output bits; and
- an RC oscillator circuit responsive to the randomly generated control code for generating the stepped RF carrier signal, wherein the stepped RF carrier signal sweeps between a first frequency and a second frequency and the randomly generated control code causes the generation of one of a plurality of frequencies from the first frequency to the second frequency.

16. The system of claim 15, wherein the control code comprises a four-bit control code.

17. The system of claim 15, wherein the unit comprises a chip.

18. The system of claim 15 wherein the unit comprises a die on a chip.

* * * * *